(12) United States Patent  
Hiraoka et al.

(10) Patent No.: US 8,591,101 B2
(45) Date of Patent: Nov. 26, 2013

(54) ESCAPEMENT GOVERNOR, MECHANICAL WATCH, PALLET FORK (INCOMPLETE) MANUFACTURING METHOD, AND ROLLER MANUFACTURING METHOD

(75) Inventors: Masashi Hiraoka, Chiba (JP); Takashi Niwa, Chiba (JP)

(73) Assignee: Seiko Instruments, Chiba (JP)

( * ) Notice: Subject to any disclaimer, the term of this patent is extended or adjusted under 35 U.S.C. 154(b) by 955 days.

(21) Appl. No.: 12/706,246

(22) Filed: Feb. 16, 2010

(65) Prior Publication Data

US 2010/0208555 A1 Aug. 19, 2010

(30) Foreign Application Priority Data

Feb. 17, 2009 (JP) ................................. 2009-034325
Jan. 20, 2010 (JP) ................................. 2010-010351

(51) Int. Cl.
*G04B 15/14* (2006.01)

(52) U.S. Cl.
CPC ..................................... *G04B 15/14* (2013.01)
USPC ........................................................ 368/132

(58) Field of Classification Search
USPC .................................. 368/127, 129, 132–133
See application file for complete search history.

(56) References Cited

U.S. PATENT DOCUMENTS 1,345,318 A * 6/1920 Colomb ........................ 368/132
2,663,139 A * 12/1953 Fink .............................. 368/132
2,864,232 A * 12/1958 Tuetey .......................... 368/132
3,059,413 A * 10/1962 Detwiler ...................... 368/128
3,628,327 A * 12/1971 Abe .............................. 368/124
3,834,155 A * 9/1974 Wuthrich ..................... 368/132

FOREIGN PATENT DOCUMENTS

JP 2004-309480 A 11/2004

OTHER PUBLICATIONS

Unknown author, "The Theory of Horology", Swiss Federation of Technical Colleges, Figs. 6-8 through 6-18, 102-103, 2005.

* cited by examiner

*Primary Examiner* — Vit W Miska
(74) *Attorney, Agent, or Firm* — Brinks Gilson & Lione

(57) ABSTRACT

Disclosed are an integrally molded type pallet fork (incomplete) with a safety pin and a roller table that are formed with high precision by a simple process, a thin escapement governor including the pallet fork (complete) and the roller table, and a method of manufacturing the pallet fork (complete) and the roller table. The pallet fork (complete) of the escapement governor includes a pair of entry horn and exit horn extending from the rotation axis of the pallet fork (complete) toward the rotation axis of a balance with hairspring and adapted to transmit the power of an escape wheel to an impulse pin; and a safety pin which is provided in a side surface of the pallet fork (complete) between the pair of entry horn and exit horn, which extends from the rotation axis of the pallet fork (complete) toward the rotation axis of the balance with hairspring, which is situated at a position nearer to the rotation axis of the pallet fork (complete) than the pair of entry horn and exit horn, which enters a passing hollow to thereby cause the pallet fork (complete) to make normal rotation or reverse rotation with respect to the rotation axis of the pallet fork (complete), and which abuts a portion of a roller other than the passing hollow to thereby prevent erroneous rotation of the pallet fork (complete); and the roller is formed in a single layer.

17 Claims, 41 Drawing Sheets

SECTION A-A'

SECTION B-B'

SECTION C-C'

SECTION D-D'

SECTION E-E'

SECTION F-F'

SECTION G-G'

SECTION H-H'

SECTION J-J'

SECTION K-K'

SECTION M-M'

SECTION N-N'

SECTION P-P'

SECTION R-R'

SECTION S-S'

SECTION T-T'

SECTION U-U'

SECTION V-V'

SECTION W-W'

SECTION X-X'

SECTION Y-Y'

SECTION Z-Z'

SECTION AA-AA'

SECTION AB-AB'

SECTION AC-AC'

SECTION AD-AD'

SECTION AE-AE'

SECTION AF-AF'

ESCAPEMENT GOVERNOR, MECHANICAL WATCH, PALLET FORK (INCOMPLETE) MANUFACTURING METHOD, AND ROLLER MANUFACTURING METHOD

RELATED APPLICATIONS

This application claims priority under 35 U.S.C. §119 to Japanese Patent Application Nos. 2009-034325 filed on Feb. 17, 2009 and 2010-010351 filed on Jan. 20, 2010, the entire contents of which are hereby incorporated by reference.

BACKGROUND OF THE INVENTION

1. Field of the Invention

The present invention relates to an escapement governor equipped with an escape wheel, a balance with hairspring, and a pallet fork transmitting the power of the escape wheel to the balance with hair spring (roller), and to a mechanical watch; further, the present invention relates to a method of manufacturing a pallet fork (incomplete) constituting the frame of a pallet fork (complete), and a method of manufacturing a roller used with a pallet fork (incomplete).

2. Description of the Related Art

There exists a club tooth lever type escapement governor for a mechanical watch. In a known construction of such an escapement governor, in assembling a pallet fork (incomplete) and a safety pin, there is provided a round hole extending through the pallet fork (incomplete), and a shaft portion of the safety pin is forced into this round hole. The pallet fork (incomplete) and the safety pin are used together with a roller. More specifically, the safety pin enters a passing hollow provided in the roller, and allows rotation of the pallet fork (incomplete). Further, the safety pin abuts a portion of the roller other than the passing hollow, thereby preventing erroneous rotation of the pallet fork (incomplete). This safety pin is provided at an end portion of the pallet fork (incomplete), and is formed so as to protrude perpendicularly with respect to the pallet fork (incomplete). Near the safety pin, the pallet fork (incomplete) is provided with a pair of entry horn and exit horn. The pair of entry horn and exit horn collide with an impulse pin provided on the roller with a predetermined timing, whereby the pallet fork (incomplete) is caused to make normal or reverse rotation.

In connection with the roller, there is known a roller table called a single roller. The single roller consists of a single circular plate which is provided with a passing hollow. The single roller is provided with an impulse pin as mentioned above (See "The Theory of Horology"; Swiss Federation of Technical Colleges, (2005), pages 102 to 103 (FIGS. 6 through 13, and FIGS. 6 through 15), [ISBN: 2-940025-12-6].

Further, there has also been disclosed an integrally molded type pallet fork (complete) including a pair of entry horn and exit horn and a safety pin (See JP-A-2004-309480).

In the pallet fork (complete) as disclosed in JP-A-2004-309480, the safety pin is in the same layer as the pallet fork (incomplete), so that the thickness of the pallet fork (complete) as a whole including the pallet fork (incomplete) is advantageously small; however, since it employs a double roller, in which the impulse pin and the passing hollow are arranged in different layers, there is a limit to a reduction in the thickness of the escapement governor including the pallet fork (complete) and the double roller.

On the other hand, in the technique as disclosed in "The Theory of Horology" mentioned above, there is used a single roller, and a reduction in the thickness of the peripheral structure thereof is achieved; however, since the safety pin is formed so as to protrude perpendicularly with respect to the pallet fork (incomplete), a reduction in the thickness of the pallet fork (complete) cannot be achieved, so that, also in this technique, there is a limit to a reduction in the thickness of the escapement governor.

In this connection, as described above, in JP-A-2004-309480, the safety pin is formed so as to extend longitudinally toward the roller of the pallet fork (incomplete), which helps to achieve a reduction in the thickness of the pallet fork (complete) as a whole; thus, by applying this pallet fork (complete) to the single roller as disclosed in "The Theory of Horology," it might be possible to contribute to a reduction in the thickness of the escapement governor.

However, the arrangement of the safety pin and the pair of entry horn and exit horn provided on the pallet fork (incomplete) as disclosed in JP-A-2004-309480 and of the passing hollow and the impulse pin of the single roller of "The Theory of Horology" mentioned above respectively corresponding thereto, is rather inappropriate, so that the pallet fork (incomplete) does not rotate appropriately, thus failing to exert its function as the pallet fork (complete).

More specifically, the safety pin as disclosed in JP-A-2004-309480 extends longitudinally toward the roller of the pallet fork (incomplete), and is formed to be longer than the pair of entry horn and exit horn. On the other hand, the single roller as disclosed in "The Theory of Horology" is constructed such that the impulse pin and the passing hollow are situated in that order away from the rotation center of the roller. As a result, the passing hollow is provided nearer to the safety pin than the impulse pin. Thus, despite the fact that the safety pin extends longitudinally toward the roller of the pallet fork (incomplete), the passing hollow used in correspondence thereto is provided at a position near the safety pin, so that the safety pin abuts the passing hollow, and the safety pin is caught by the passing hollow, making it impossible for the pallet fork (incomplete) to rotate properly.

Further, in the pallet fork (complete) of JP-A-2004-309480, the safety pin is longer than the pair of entry horn and exit horn, and the center of gravity thereof is far from the rotation center of the pallet fork (complete), so that the moment of inertia of the pallet fork (complete) increases, resulting in an increase in energy consumption in the escapement governor.

SUMMARY OF THE INVENTION

The present invention has been made in view of the above problems; it is an object of the present invention to provide an escapement governor allowing a reduction in the thickness of the pallet fork (complete) and of the roller and making it possible to reduce the moment of inertia acting on the pallet fork (complete), and a mechanical watch equipped with the same.

Another object of the present invention is to provide a pallet fork (incomplete) manufacturing method and a roller manufacturing method.

According to an aspect of the present invention, there is provided an escapement governor for a watch, comprising: an escape wheel; a balance with hairspring including a roller having a passing hollow, and an impulse pin provided on the roller; and a pallet fork (complete) transmitting the power of the escape wheel to the impulse pin to thereby cause the roller to make normal rotation or reverse rotation, wherein the pallet fork (complete) comprises: a pair of entry horn and exit horn extending from a rotation axis of the pallet fork toward a rotation axis of the balance with hairspring and adapted to transmit the power of the escape wheel to the impulse pin; and a safety pin which is provided in a side surface of the pallet fork (complete) between the pair of entry horn and exit horn, which extends from the rotation axis of the pallet fork (complete) toward the rotation axis of the balance with hairspring, which is formed to be shorter than the pair of entry horn and exit horn, which enters the passing hollow to thereby cause the pallet fork (complete) to make normal rotation or reverse rotation with respect to the rotation axis of the pallet fork (complete), and which abuts a portion of the roller other than the passing hollow to thereby prevent erroneous rotation of the pallet fork (complete); and the roller is formed in a single layer.

According to this aspect of the invention, due to the configuration of the pallet fork (complete) and of the roller, the pair of entry horn and exit horn and the safety pin extend from the rotation axis of the pallet fork (complete) toward the rotation axis of the balance with hairspring, and a roller table corresponding to these structures is formed in a single layer, whereby it is possible to achieve a reduction in the thickness of the pallet fork (complete) and of the roller. Further, since the safety pin is shorter than the pair of entry horn and exit horn, it is possible to reduce the moment of inertia of the pallet fork (complete). Further, since the moment of inertia of the pallet fork (complete) of the present invention is small, it is possible to reduce the energy loss in the pallet fork (complete), making it possible to increase the oscillation angle of the balance with hair spring.

That is, it is possible to achieve a reduction in the thickness of the pallet fork (complete) and the roller table, thereby reducing the moment of inertia acting on the pallet fork (complete).

According to another aspect of the present invention, there is provided an escapement governor, wherein an upper surface and a lower surface of the safety pin are situated so as to be flush with an upper surface and a lower surface of the pallet fork (complete).

According to still another aspect of the present invention, there is provided an escapement governor, wherein the pallet fork (complete) comprises: a pallet fork (incomplete) having the safety pin and the pair of entry horn and exit horn; and at least one through-hole extending through the pallet fork (incomplete).

According to a further aspect of the present invention, there is provided an escapement governor, wherein the through-hole of the pallet fork (complete) is provided by the side of the rotation axis of the pallet fork (complete).

According to a further aspect of the present invention, there is provided an escapement governor, wherein the pallet fork (incomplete) is equipped with a lever connected to the safety pin and the pair of entry and exit horn and extending from the rotation axis of the pallet fork (complete) toward the rotation axis of the balance with hairspring; and the through-hole is provided at an end portion of the lever.

According to a further aspect of the present invention, there is provided an escapement governor, wherein the pallet fork (complete) is equipped with a pallet fork (incomplete) having the safety pin and the pair of entry horn and exit horn; the pallet fork (incomplete) is equipped with a lever connected to the safety pin and the pair of entry horn and exit horn and extending from the rotation axis of the pallet fork (complete) toward the rotation axis of the balance with hairspring; and, of both end portions of the lever, the width of an end portion nearer to the safety pin and the pair of entry horn and exit horn has a length not less than 1 time and not more than 2.5 times the width of a central portion between the two end portions.

According to a further aspect of the present invention, there is provided an escapement governor, wherein the pallet fork (complete) is equipped with a pallet fork (incomplete) having the safety pin and the pair of entry horn and exit horn; and the pallet fork (incomplete) has a portion other than the safety pin which is formed to be thinner than the safety pin.

Further, according to the present invention, there is provided a mechanical watch equipped with an escapement governor formed as described above. According to the present invention, it is possible to conduct an efficient mass production of a mechanical watch of satisfactory time measurement accuracy which is equipped with a club tooth lever type escapement governor including a pallet fork (complete) formed with high precision and a roller table formed with high precision.

According to a further aspect of the present invention, there is provided a method of manufacturing a pallet fork (incomplete) for use in an escapement governor, comprising the steps of: forming a first metal thin film on a substrate; forming a first negative photoresist on the first metal thin film; exposing the first negative photoresist by using a horn formation mask used to form a pair of entry horn and exit horn with which the pallet fork (incomplete) is equipped to thereby form a cured portion corresponding to the horn formation mask on the first negative photoresist; forming a second metal thin film on the cured portion of the first negative photoresist; forming a second negative photoresist on the first negative photoresist on which the second metal thin film has been formed; exposing the first negative photoresist and the second negative photoresist, with a part of a pallet fork (incomplete) formation mask being opposed to the second metal thin film, by using the pallet fork (incomplete) formation mask used to form the pallet fork (incomplete) having a safety pin provided between the pair of entry horn and exit horn and shorter than the pair of entry horn and exit horn to thereby form a non-cured portion corresponding to the pallet fork (incomplete) formation mask on the first negative photoresist and the second negative photoresist; removing the non-cured portion formed on the first negative photoresist and the second negative photoresist; forming an electroformed metal in a mold portion obtained by removing the non-cured portion by using the first metal thin film and the second metal thin film; and extracting the electroformed metal from the mold portion as the pallet fork (incomplete).

According to this method, it is possible to form a pallet fork (incomplete) through electroforming, so that there is no need to form the pallet fork (incomplete) through cutting, thus making it possible to manufacture the pallet fork (incomplete) with high precision.

According to a further aspect of the present invention, there is provided a method of manufacturing a roller for use in an escapement governor, comprising the steps of: forming a metal thin film on a substrate; forming a negative photoresist on the metal thin film; exposing the negative photoresist by using a roller formation mask used to form the roller to thereby form a non-cured portion corresponding to the roller formation mask on the negative photoresist; removing the non-cured portion formed on the negative photoresist; forming an electroformed metal in a mold portion obtained by removing the non-cured portion by using the metal thin film; and extracting the electroformed metal from the mold portion as the roller.

According to this method, it is possible to form a roller through electroforming, so that there is no need to form the roller through cutting, thus making it possible to manufacture the roller with high precision.

According to the present invention, it is possible to achieve a reduction in the thickness of the pallet fork and the roller and to reduce the moment of inertia acting on the pallet fork (complete).

DETAILED DESCRIPTION OF THE PREFERRED EMBODIMENTS

Embodiment 1

Construction of the Escapement Governor

Figure 1A:
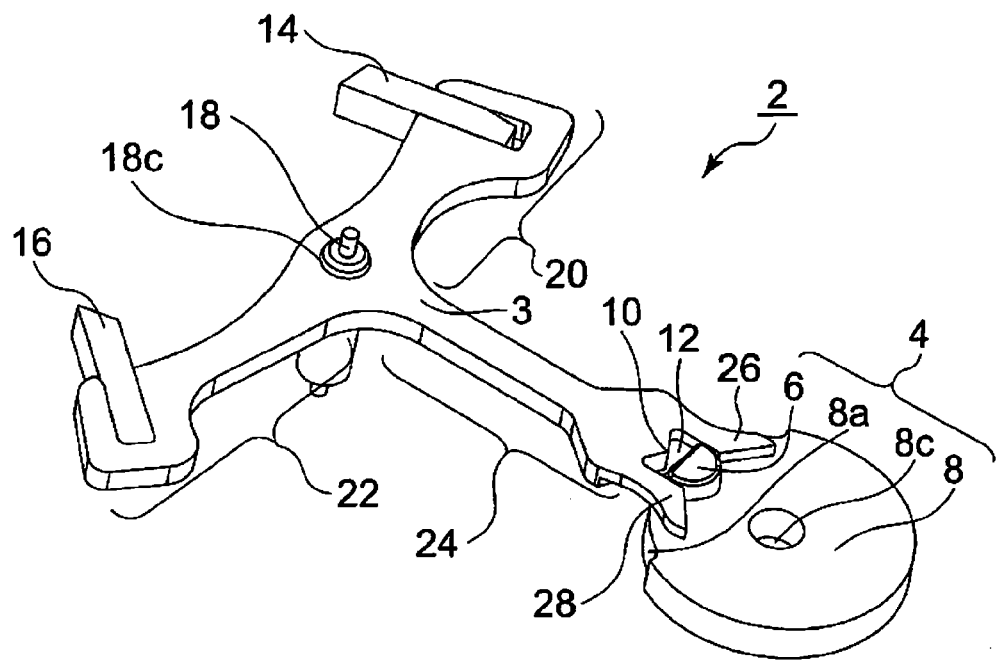
FIGS. 1A through 1C are diagrams showing the configuration of a pallet fork (complete) and a roller according to Embodiment 1 of the present invention.
Figure 1B:
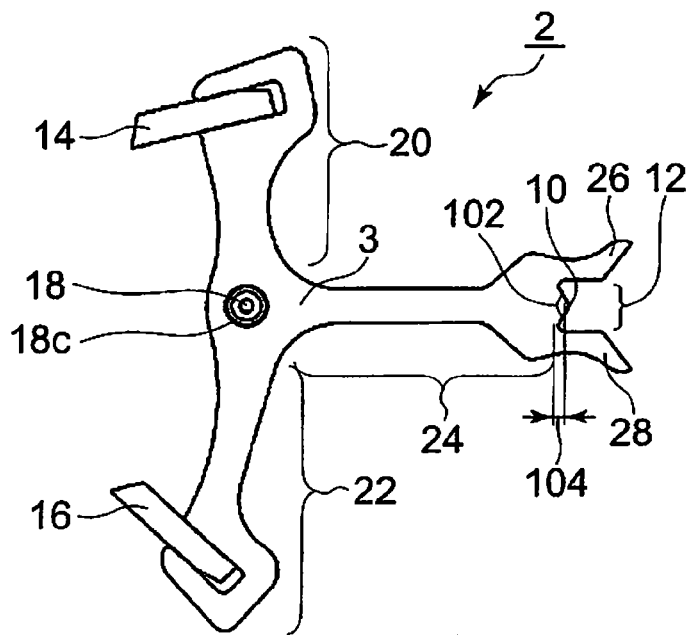

FIGS. 1A and 1B are diagrams illustrating an escapement governor equipped with a pallet fork (complete) 2 and a roller 4 according to Embodiment 1 of the present invention. FIG. 1A is a perspective view of the pallet fork (complete) 2 and the roller 4; FIG. 1B is a plan view of the pallet fork (complete) 2; and FIG. 1C is a plan view of the roller 4.

Figure 2A:
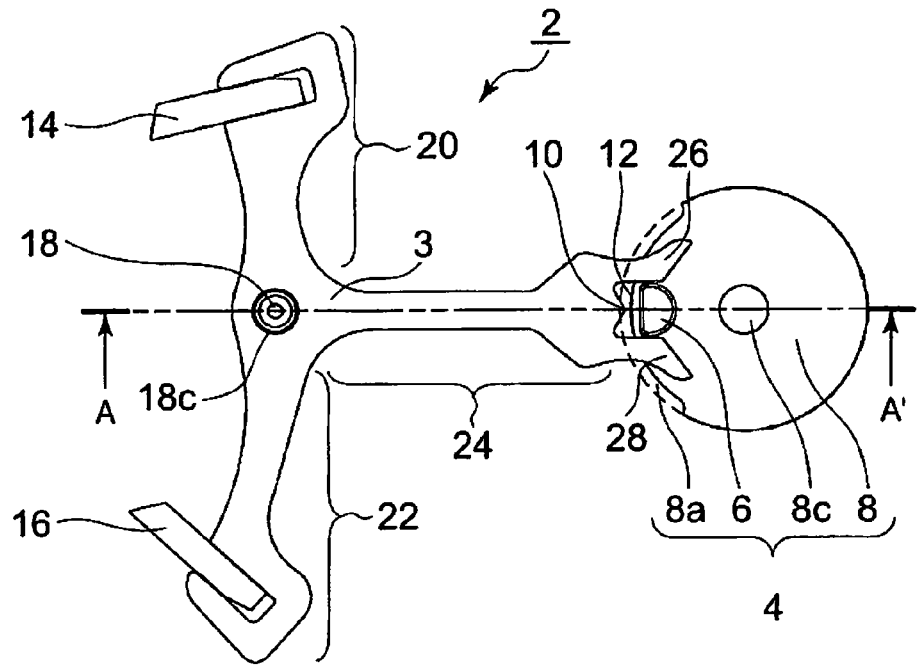
FIGS. 2A through 2C are diagrams showing the configuration of the pallet fork (complete) and the roller of Embodiment 1 of the present invention.
Figure 2B:
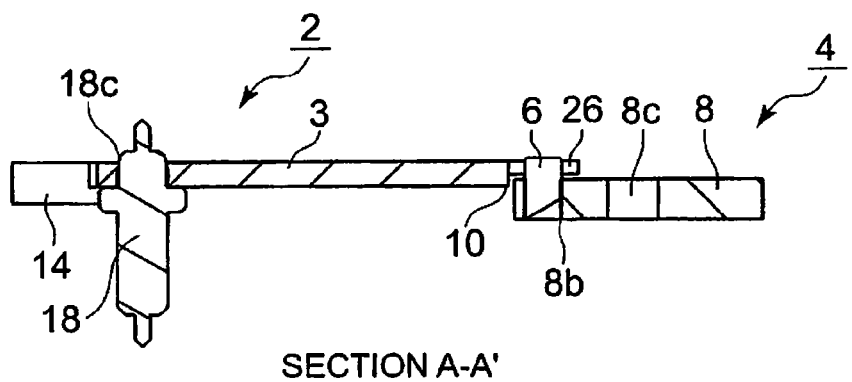
Figure 2C:
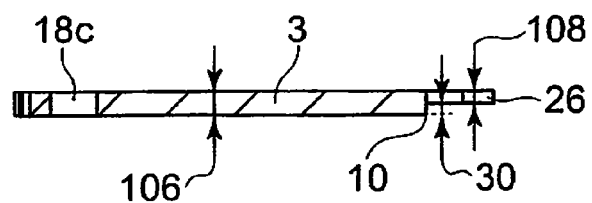

FIGS. 2A and 2B are diagrams illustrating the pallet fork (complete) 2 and the roller 4 of Embodiment 1 of the present invention. FIG. 2A is a plan view of the pallet fork (complete) 2 and the roller 4; FIG. 2B is a sectional view of the pallet fork (complete) 2 and the roller 4 taken along the segment AA' of FIG. 2A; and FIG. 2C is a sectional view of a pallet fork (incomplete) 3 taken along the segment AA' of FIG. 2A.

Figure 1C:
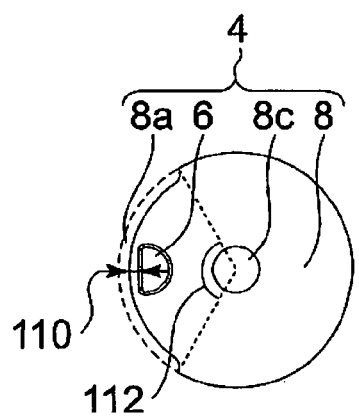

In FIGS. 1C and 2A, the broken line indicates the outer circumference of a roller table 8 as extended along a passing hollow 8a formed in the roller table 8.

In FIG. 1A, the rotation axis of the pallet fork (complete) 2 and the rotation axis of the roller 4 are arranged parallel to each other; in the pallet fork (complete) 2 and the roller 4, a safety pin 10 and the passing hollow 8a, and a space between entry horn and exit horn 12 and an impulse pin 6 are arranged at corresponding position. The pallet fork (complete) 2 is formed by assembling a pallet fork (incomplete) 3, an entry pallet jewel 14, an exit pallet jewel 16, and a pallet staff 18. The pallet fork (incomplete) 3 is formed by two arms of an entry arm 20 and an exit arm 22, a lever 24, and a pallet staff pivot hole 18c. The entry arm 20 retains the entry pallet jewel 14; they are glued to each other by using an adhesive, thereby fixing the entry pallet jewel 14 to the pallet fork (incomplete) 3. The exit arm 22 retains the exit pallet jewel 16; they are glued to each other by using an adhesive, thereby fixing the exit pallet jewel 16 to the pallet fork (incomplete) 3.

At the end farther from the rotation axis of the pallet fork (complete), the lever 24 forms a pair of entry horn and exit horn 26, 28, the safety pin 10, and the space between entry horn and exit horn 12. The pair of entry horn and exit horn 26, 28 extend from an end surface of the lever 24, and from the rotation axis of the pallet fork (complete) 2, toward the rotation axis of the roller 4. The safety pin 10 is situated between the pair of entry horn and exit horn 26, 28, and extends from an end surface of the lever 24, and from the rotation axis of the pallet fork (complete) 2, toward the rotation axis of the roller 4; it is nearer to the rotation center of the pallet fork (complete) 2 than the pair of entry horn and exit horn 26, 28, and is formed to be shorter than the pair of entry horn and exit horn 26, 28. In order that the pallet fork (complete) 2 may not interfere with the roller 4, the pair of entry horn and exit horn 26, 28 are thinner than the safety pin 10 by an amount corresponding to a step 30, and the pallet staff 18 is forced into the pallet staff pivot hole 18c. The pallet fork (complete) 2 rotates around the pallet staff 18.

The size of the pallet fork (incomplete) 3 as a whole is substantially the same as the conventional one. However, the size of the safety pin 10 differs from that of the conventional one, so a description will be given regarding the size of the safety pin 10.

The safety pin 10 of the present invention is situated between the pair of entry horn and exit horn 26, 28, and extends from the end of the lever 24 at which the pair of entry horn and exit horn 26, 28 are provided, and from the rotation axis of the pallet fork (complete) 2, toward the rotation axis of the roller 4; it is situated nearer to the rotation center of the pallet fork (complete) 2 than the pair of entry horn and exit horn 26, 28 and is formed to be shorter than the pair of entry horn and exit horn 26, 28. It is only necessary for the safety pin 10 to be of a protruding configuration as described above.

At the shortest, the length 104 of the safety pin 10 must be large enough to cause the safety pin 10 to abut the roller table 4 to prevent erroneous rotation of the pallet fork (complete) 2; and, as the longest, it must be small enough to allow the safety pin to enter the passing hollow 8a at the time of normal rotation of the pallet fork (complete) 2. For example, it is desirable for the length 104 of the safety pin 10 to range from 50 μm to 100 μm. Further, as long as the length 104 of the safety pin 10 is large enough to cause the safety pin 10 abut the roller table 4 to prevent erroneous rotation of the pallet fork (complete) 2, and small enough to allow the safety pin 10 to enter the passing hollow 8a at the time of normal rotation of the pallet fork (complete) 2, it is desirable for the length 104 of the safety pin 10 to be as small as possible so that the moment of inertia may be reduced.

As for the configuration of the safety pin 10, the distal end of the safety pin 10 is set so as to satisfy the conditions regarding the length 104 of the safety pin 10, and two straight lines at an angle 102 from the distal end thereof are connected to the end of the lever 24 such that the center line of the safety pin 10 overlaps the center line of the lever 24.

At the minimum, the angle 102 of the distal end of the safety pin 10 must be large enough to avoid breakage of the safety pin 10 when the safety pin 10 abuts the roller table 4, and, at the maximum, it must be small enough to allow the safety pin 10 to abut the roller table 4 to prevent erroneous rotation of the pallet fork (complete) 2. For example, the angle 102 of the distal end of the safety pin 10 is determined as appropriate within a range of 30° to 150°, taking into account the strength of the safety pin 10 and the moment of inertia of the pallet fork (incomplete) 3. As long as the angle 102 of the distal end of the safety pin 10 is large enough to prevent breakage of the safety pin 10 when the safety pin 10 abuts the roller table 4, and is small enough to allow the safety pin 10 to abut the roller table 4 to prevent erroneous rotation of the pallet fork (complete) 2, it is desirable for the angle 102 of the distal end of the safety pin 10 to be as small as possible so that the moment of inertia may be reduced.

It is desirable for the thickness 106 of the pallet fork (complete) 2 to range from 120 μm to 300 μm, and the thickness 108 of the pair of entry horn and exit horn 26, 28 to range, for example, from 40 μm to 100 μm.

The material of the pallet fork (incomplete) 3 is one allowing electroforming, such as nickel, nickel-tungsten alloy, or nickel-phosphorus alloy. The material of the entry pallet jewel 14 and of the exit pallet jewel 16 is ruby, and the material of the pallet staff 18 is hardened steel.

As shown in FIGS. 1A, 1B, and 2A, 2B, 2C, the roller 4 of the present invention is composed of the roller table 8 and the impulse pin 6, which are formed as separate components; it is formed by assembling them together. More specifically, the assembly is effected by gluing the impulse pin 6 to the roller table 8. The roller table 8 is composed of a passing hollow 8a corresponding to the movement of the safety pin 10, an impulse pin hole 8b for retaining the impulse pin 6 corresponding to the movement of the space between entry horn and exit horn 12, and the pivot hole 8c for retaining the balance staff (not shown) rotating together with a balance with hairspring (not shown). The roller 4 rotates around the balance staff.

As shown in FIG. 1C, the size of the roller 4 of the present invention is substantially the same as that of the conventional impulse roller. The position of the impulse pin 6 is also substantially the same as that of the conventional impulse roller. However, the passing hollow 8a makes the roller of the present invention different from the conventional impulse roller, so the size of the passing hollow 8a will be described. Here, the direction from the outer periphery of the roller table 8 toward the rotation center of the roller table 8 will be referred to as the depth, and the length as measured from the wall surface of the passing hollow 8a to the flat portion of the impulse pin 6 will be referred to as the length 110. At the minimum, the depth of the passing hollow 8a provided in the roller table 8 must be large enough to allow entrance of the safety pin 10, and, at the maximum, small enough to provide the length 110 allowing the roller table 8 to retain the impulse pin 6. For example, it is desirable for the depth of the passing hollow 8a to be approximately ½ of the length 110 from the wall surface of the passing hollow 8a to the flat portion of the impulse pin 6. The angle 112 made by one end of the passing hollow 8a extending along the outer periphery of the roller table 8, the rotation center of the roller table 8, and the other end of the passing hollow 8a extending along the outer periphery of the roller table is an angle which is, at the minimum, large enough to allowing the safety pin 10 to enter the passing hollow 8a at the time of rotation of the pallet fork (complete) 2 and the roller 4, and, at the maximum, small enough to allow the outer wall portion of the roller table 8 to be in correspondence with the safety pin 10 during free oscillation of the roller 4 to prevent the erroneous rotation of the pallet fork (complete). It is desirable for the angle 112 to be, for example, approximately 120°. It is desirable for the thickness of the roller table 8 to range, for example, from 100 μm to 200 μm.

In the roller 4 of the present invention, the material of the roller table 8 is a material allowing electroforming, such as nickel, nickel-tungsten alloy, or nickel-phosphorus alloy. The material of the impulse pin 6 is ruby.

(Method of Manufacturing the Pallet Fork (Incomplete))

FIGS. 3A through 13B are diagrams illustrating a method of manufacturing the pallet fork (incomplete) 3. To facilitate the understanding of the method of manufacturing the pallet fork (incomplete) 3, in FIGS. 3A through 13B, the thickness and size thereof are shown in ratios different from the actual dimensions. For the actual dimensions, there are used values or ratios given in the description.

Figure 3A:
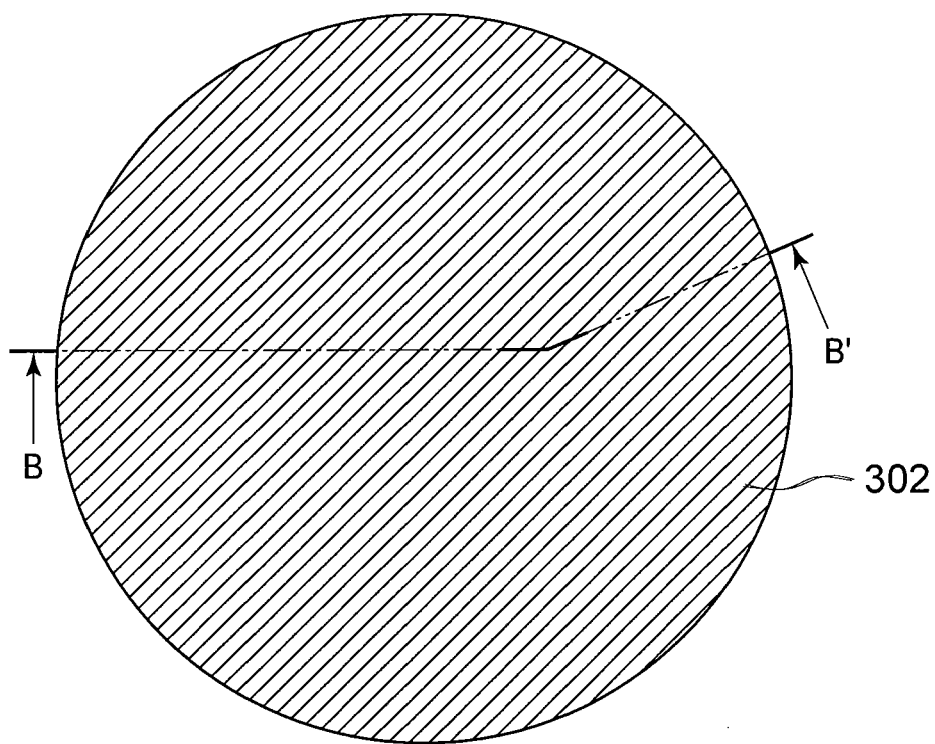
FIGS. 3A and 3B are principle diagrams for illustrating a process for manufacturing a pallet fork (incomplete) according to Embodiment 1 of the present invention.
Figure 3B:
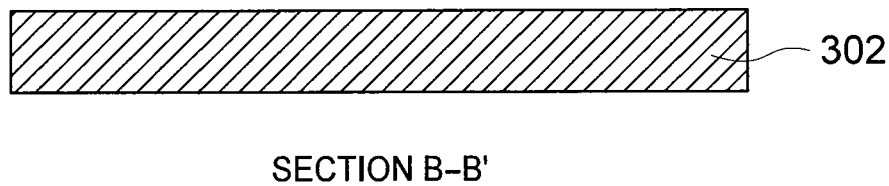

FIGS. 3A and 3B are a diagram illustrating a silicon substrate 302 for preparing an electroforming mold for the pallet fork (incomplete). FIG. 3A is a plan view of the silicon substrate 302 for preparing the electroforming mold for the pallet fork (incomplete), and FIG. 3B is a sectional view taken along the segment BB' of FIG. 3A. It is desirable for the size of the silicon substrate 302 to range, for example, from 10 mm to 160 mm, and it is desirable for the thickness of the silicon substrate 302 to be, for example, approximately several hundred μm.

Figure 4A:
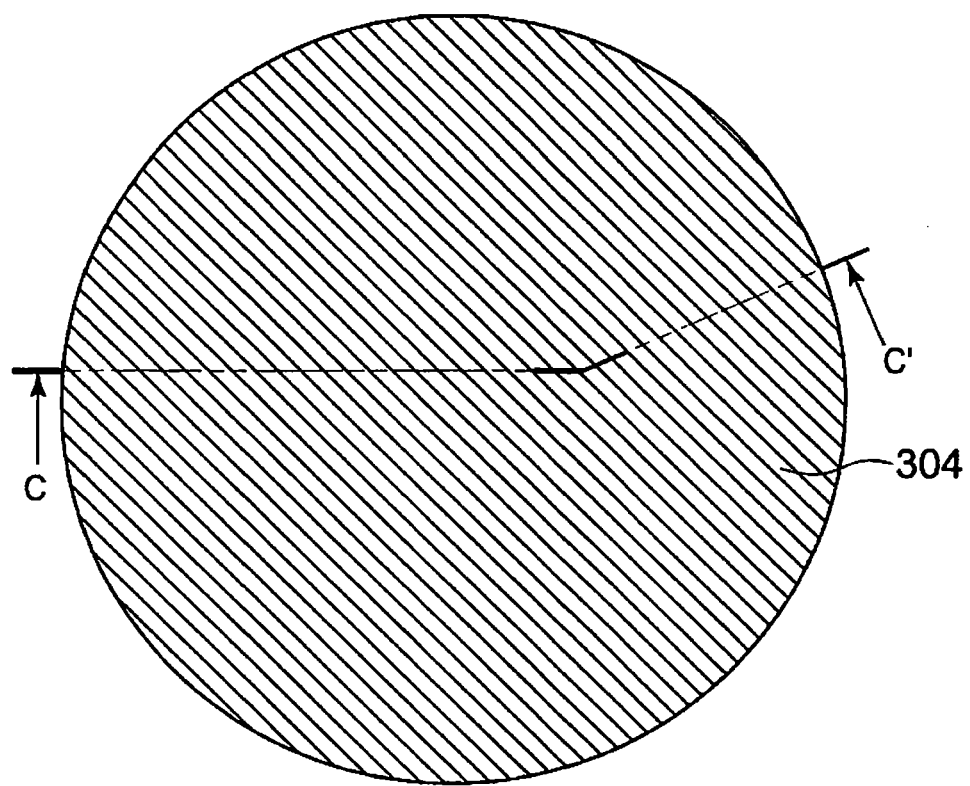
FIGS. 4A and 4B are principle diagrams for illustrating a process for manufacturing the pallet fork (incomplete) of Embodiment 1 of the present invention.
Figure 4B:
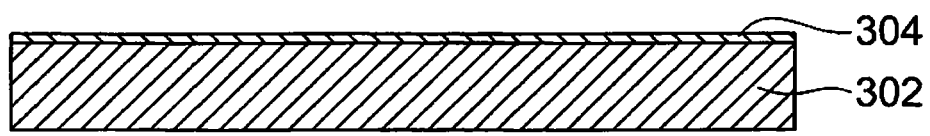

FIGS. 4A and 4B are diagrams illustrating a process for forming a metal thin film 304 on the surface of the silicon substrate 302 shown in FIGS. 3A and 3B to turn the surface into a conductor for electroforming. FIG. 4A is a plan view of the silicon substrate 302 with the metal thin film 304 formed on the surface thereof, and FIG. 4B is a sectional view taken along the segment CC' of FIG. 4A. As shown in FIGS. 4A and 4B, the metal thin film 304 is formed on the surface of the silicon substrate 302 to turn the surface into a conductor for electroforming. The metal thin film 304 may be formed, for example, of Au (gold), Cu (copper) or the like, with Cr (chromium) (not shown) being used as an anchor metal. The formation of the metal thin film 304 can be effected by sputtering, evaporation, electroless plating or the like. It is desirable for the thickness of the metal thin film 304 to range from several nm (discontinuous film) to several μm; in the case of Cr (chromium) and Au (gold), the respective film thicknesses are approximately 50 nm and approximately 200 nm.

Figure 5A:
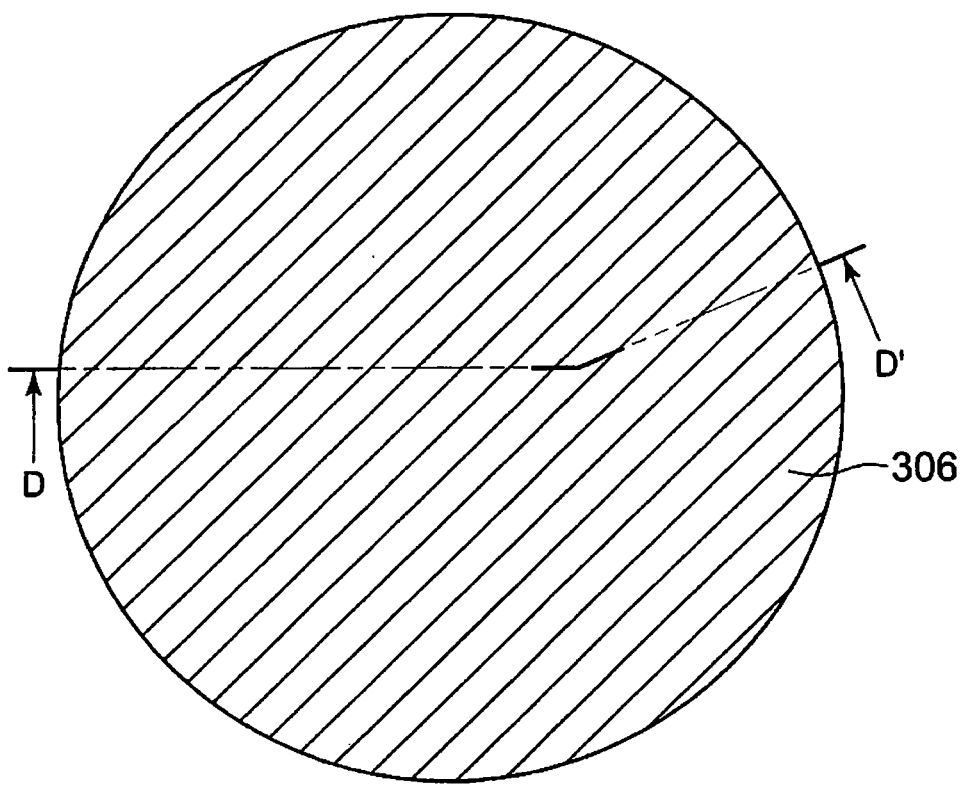
FIGS. 5A and 5B are principle diagrams for illustrating a process for manufacturing the pallet fork (incomplete) of Embodiment 1 of the present invention.
Figure 5B:
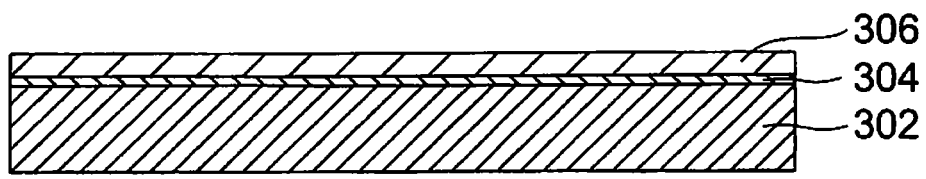

FIGS. 5A and 5B are diagrams illustrating a process for applying a negative photoresist 306 to the metal thin film 304 formed on the silicon substrate 302 shown in FIGS. 4A and 4B. FIG. 5A is a plan view of the silicon substrate 302 to the surface of which the negative photoresist 306 has been applied, and FIG. 5B is a sectional view taken along the segment DD' of FIG. 5A. As shown in FIGS. 5A and 5B, the negative photoresist 306 is applied to the surface of the silicon substrate 302 with the metal thin film 304 formed thereon. The thickness of the negative photoresist 306 is equal to the thickness of the step 30; it preferably ranges from 80 μm to 200 μm.

Figure 6A:
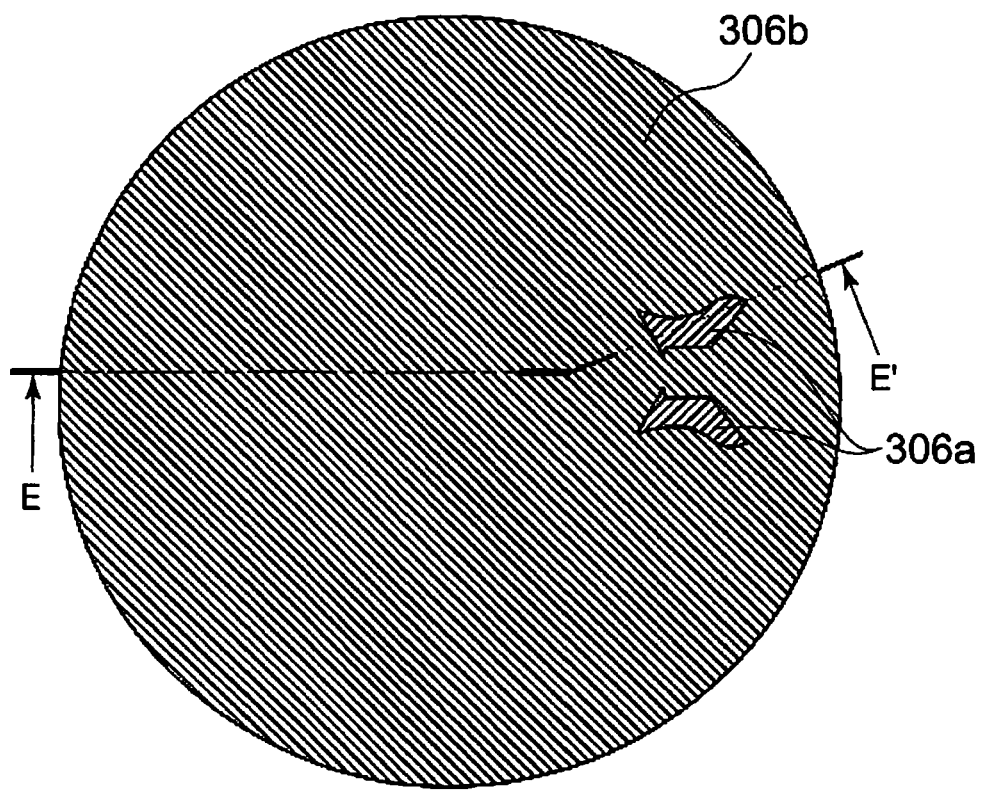
FIGS. 6A and 6B are principle diagrams for illustrating a process for manufacturing the pallet fork (incomplete) of Embodiment 1 of the present invention.
Figure 6B:
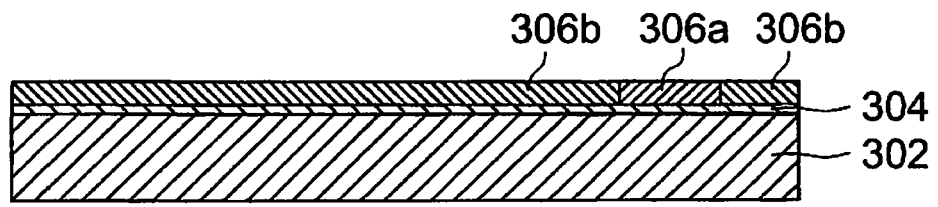

FIGS. 6A and 6B are diagrams illustrating a process for effecting exposure with UV rays on the negative photoresist 306 applied to the silicon substrate 302 shown in FIGS. 5A and 5B, using a mask equipped with a pattern 307 for forming the step 30. FIG. 6A is a plan view of the silicon substrate 302 on which the exposure process has been completed, and FIG. 6B is a sectional view taken along the line EE' of FIG. 6A. The pattern 307 for forming the step 30 of the pair of entry horn and exit horn 26, 28 is larger than the pair of entry horn and exit horn 26, 28, and must interfere with the safety pin 10. Thus, as shown in FIG. 6C, the size of the pattern 307 is larger than the configuration pattern of the pair of entry horn and exit horn 26, 28. When the exposure process has been completed, the negative photoresist 306 is cured in the shape of the step 30 of the pair of entry horn and exit horn 26, 28 corresponding to the pattern 307 with which the mask 307 is provided, and is divided into a cured portion 306a having the thickness of the step 30, and a non-cured portion 306b.

It is naturally also possible for the pattern 307 to be of the same size and configuration as the pair of entry horn and exit horn 26, 28.

Figure 7A:
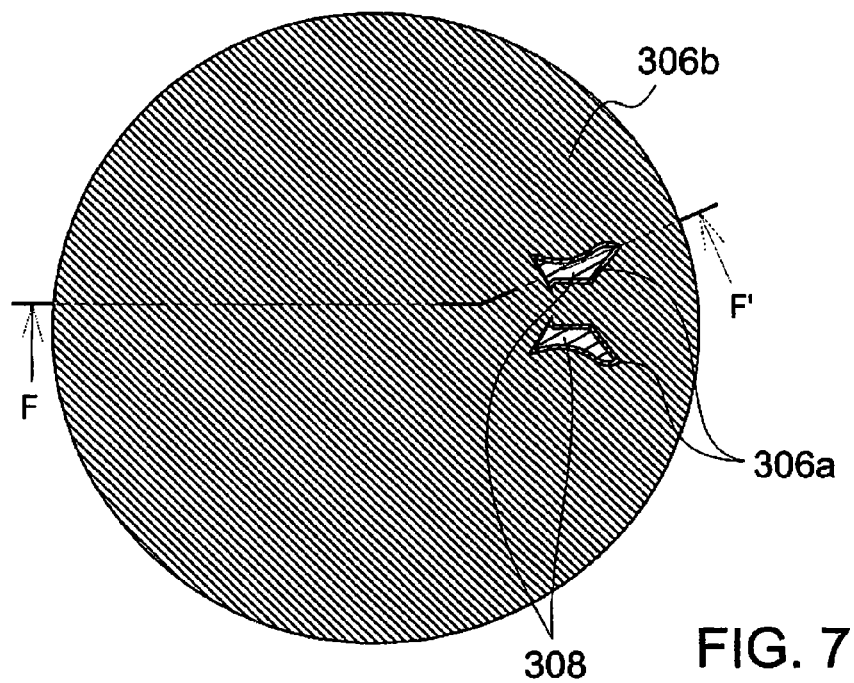
FIGS. 7A through 7C are principle diagrams for illustrating a process for manufacturing the pallet fork (incomplete) of Embodiment 1 of the present invention.
Figure 7B:
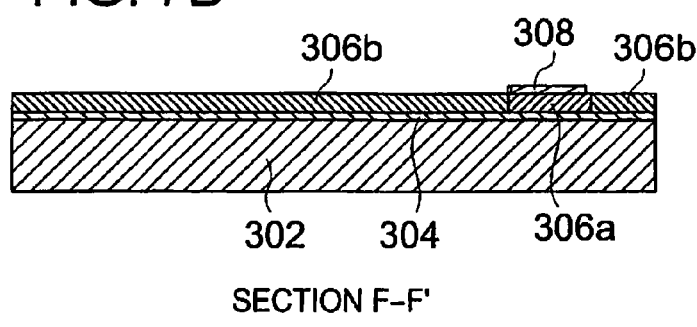
Figure 7C:
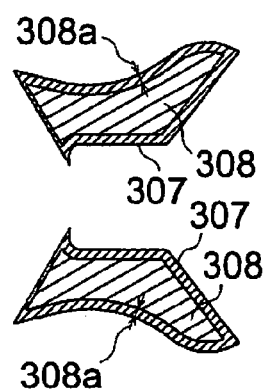

FIGS. 7A through 7C are diagrams illustrating a process for forming a metal thin film 308 on the surface of the cured portion 306a and turning the surface into a conductor for electroforming with respect to the silicon substrate 302 that has been subjected to the exposure process shown in FIG. 6C. FIG. 7A is a plan view of the silicon substrate 302 on which the formation of the metal thin film 308 has been completed, and FIG. 7B is a sectional view taken along the segment FF' of FIG. 7A. FIG. 7C is an explanatory view for comparison in size between the pattern 307 forming the step 30 of the pair of entry horn and exit horn 26, 28 and the metal thin film 308. As shown in FIGS. 7A through 7C, the metal thin film 308 is formed on the surface of the cured portion 306a, and the surface is turned into a conductor for electroforming. The metal thin film 308 is formed so as to be smaller than the configuration pattern 305 of the safety pin 10, and, a shown in FIG. 7C, smaller than the pattern 307 for forming the step 30 by a width 308a. It is desirable for the width 308a to range, for example, from 10 to 20 μm.

Figure 8A:
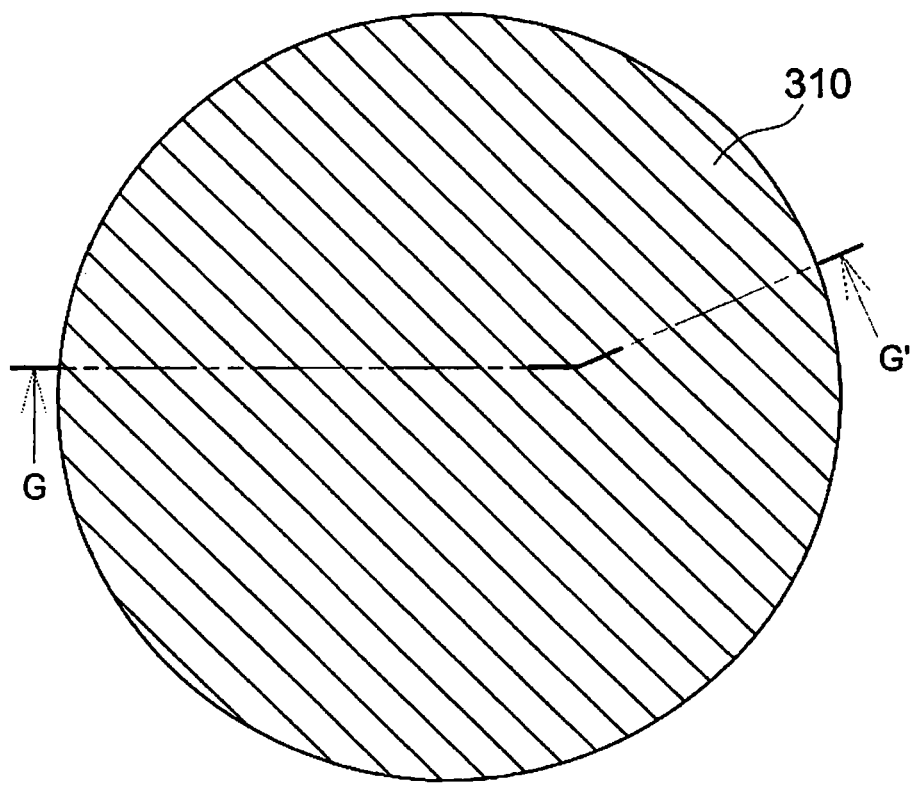
FIGS. 8A and 8B are principle diagrams for illustrating a process for manufacturing the pallet fork (incomplete) of Embodiment 1 of the present invention.
Figure 8B:
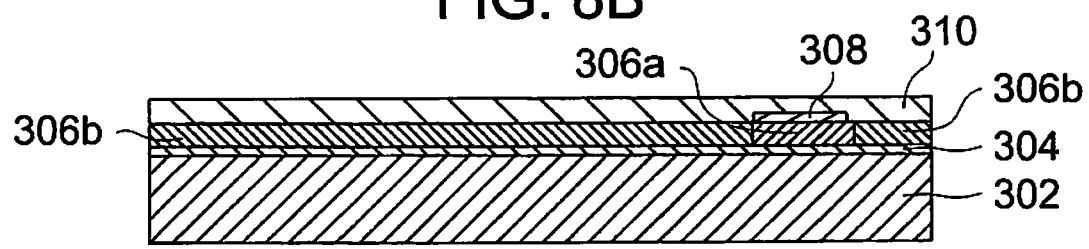

FIGS. 8A and 8B are diagrams illustrating a process for applying a negative photoresist 310 to the surface of the silicon substrate 302 with the metal thin film 308 formed thereon as shown in FIGS. 7A through 7C. FIG. 8A is a plan view of the silicon substrate 302 on which the application of the negative photoresist 310 has been completed, and FIG. 8B is a sectional view taken along the line GG' of FIG. 8A. As shown in FIGS. 8A and 8B, the negative photoresist 310 is applied to the surface of the silicon substrate 302 with the metal thin film 308 formed thereon. The thickness of the negative photoresist 310 applied is equal to the thickness 108 of the pair of entry horn and exit horn 26, 28; it preferably ranges, for example, from 40 μm to 100 μm.

Figure 9A:
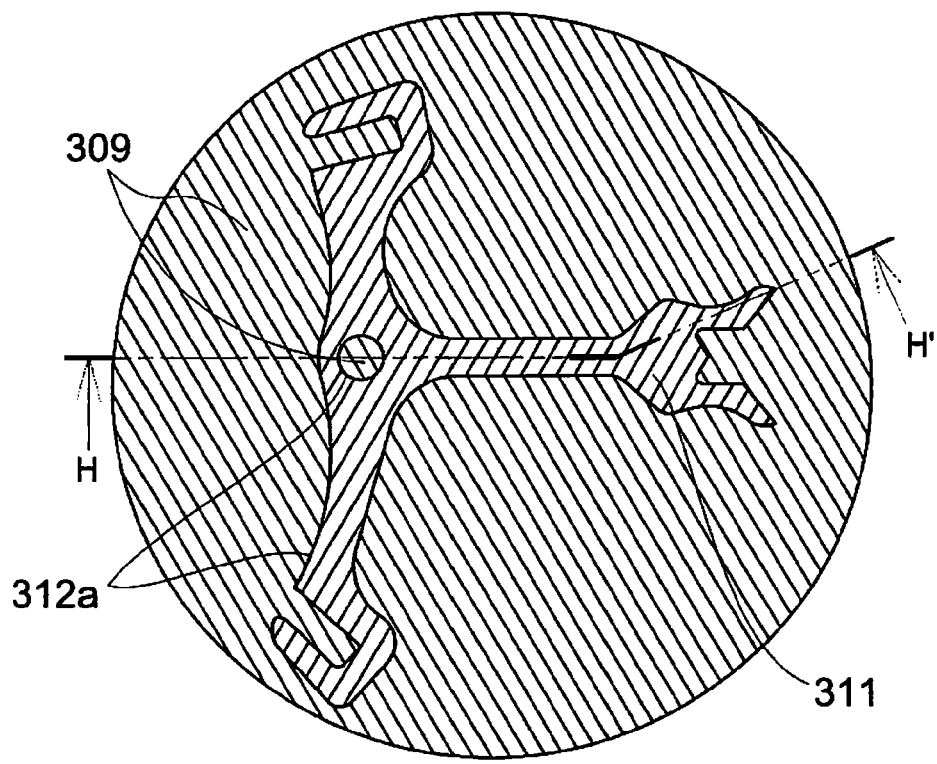
FIGS. 9A and 9B are principle diagrams for illustrating a process for manufacturing the pallet fork (incomplete) of Embodiment 1 of the present invention.
Figure 9B:
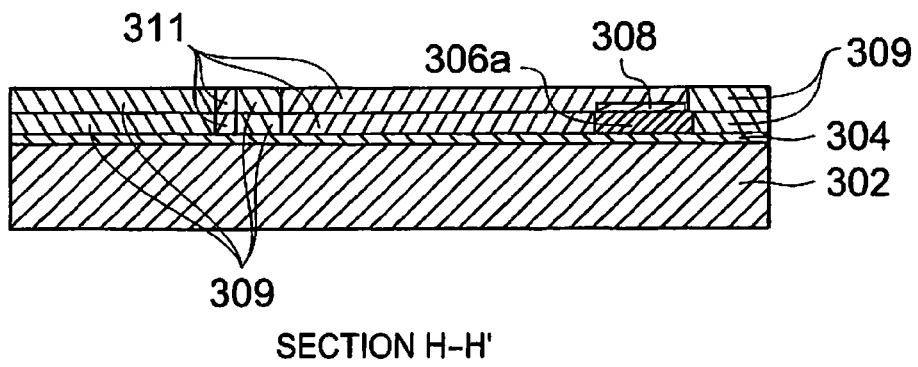

FIGS. 9A and 9B are diagrams illustrating a process for effecting exposure on the negative photoresist 310 applied to the silicon substrate 302 shown in FIGS. 8A and 8B with UV rays, using a mask with a configuration pattern 312a serving as a mold for a pallet fork (incomplete). FIG. 9A is a plan view of the silicon substrate 302 on which the exposure process has been completed, and FIG. 9B is a sectional view taken along the segment HH' of FIG. 9A. As shown in FIGS. 9A and 9B, the portion of the negative photoresist 306, 310 constituting the configuration pattern 312a serving as the mold of the pallet fork (incomplete) is cured, and the negative photoresist 306, 310 is divided into a cured portion 309 and a non-cured portion 311.

Figure 10A:
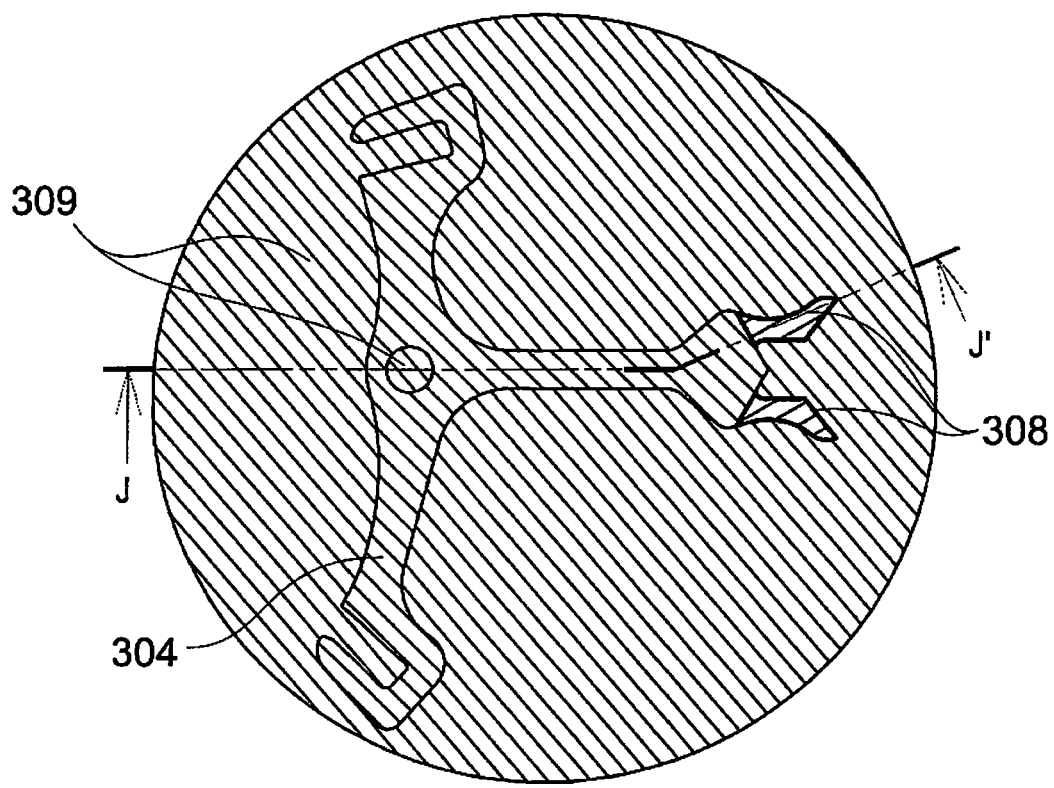
FIGS. 10A and 10B are principle diagrams for illustrating a process for manufacturing the pallet fork (incomplete) of Embodiment 1 of the present invention.
Figure 10B:
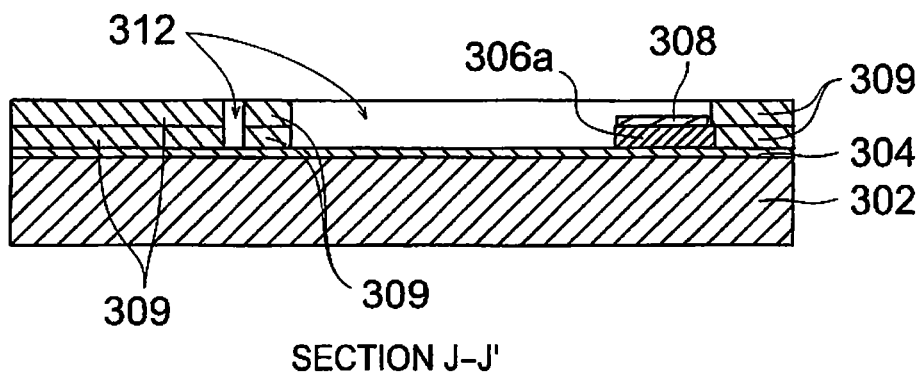

FIGS. 10A and 10B are diagrams illustrating a process for removing the non-cured portion 311 of the negative photoresist 306, 310 of the silicon substrate 302 shown in FIGS. 9A and 9B. FIG. 10A is a plan view of the silicon substrate 302 on which the removal of the non-cured portion 311 of the negative photoresist 306, 310 has been completed, and FIG. 10B is a sectional view taken along the segment JJ' of FIG. 10A. As shown in FIGS. 10A and 10B, in the silicon substrate 302 shown in FIGS. 9A and 9B, the non-cured portion 311 is removed by a developer. Thus, a cavity 312 is formed on the silicon substrate 302. By removing the non-cured portion 311, the electroforming mold for the pallet fork (incomplete) is completed.

Figure 11A:
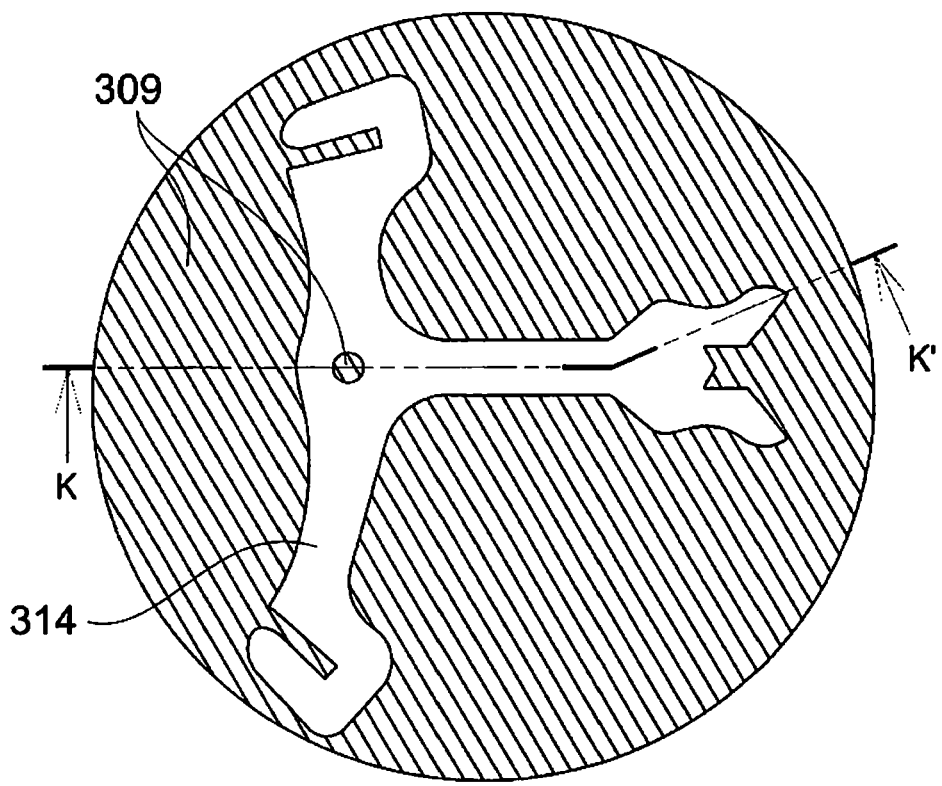
FIGS. 11A and 11B are principle diagrams for illustrating a process for manufacturing the pallet fork (incomplete) of Embodiment 1 of the present invention.
Figure 11B:
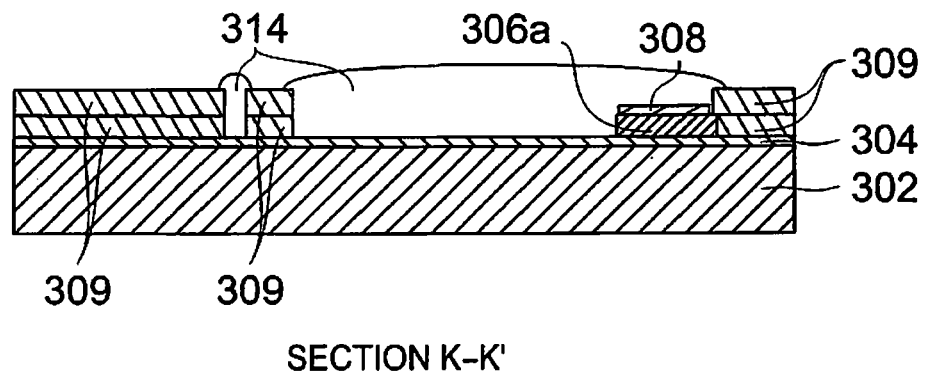

FIGS. 11A and 11B are diagrams illustrating a process for performing electroforming on the electroforming mold for the pallet fork (incomplete) completed in FIGS. 10A and 10B. FIG. 11A is a plan view of the mold for the pallet fork (incomplete) on which electroforming has been completed, and FIG. 11B is a sectional view taken along the segment NN' of FIG. 11A. As shown in FIGS. 11A and 11B, electroforming is performed on the electroforming mold for the pallet fork (incomplete) completed in FIGS. 10A and 10B. An electroformed metal 314 is produced in the cavity 312. As the electroformed metal 314 forming the pallet fork (incomplete) 3, there is used a material allowing electroforming, such as Ni (nickel), Ni—W (nickel-tungsten alloy), or Ni—P (nickel-phosphorus alloy).

Figure 12A:
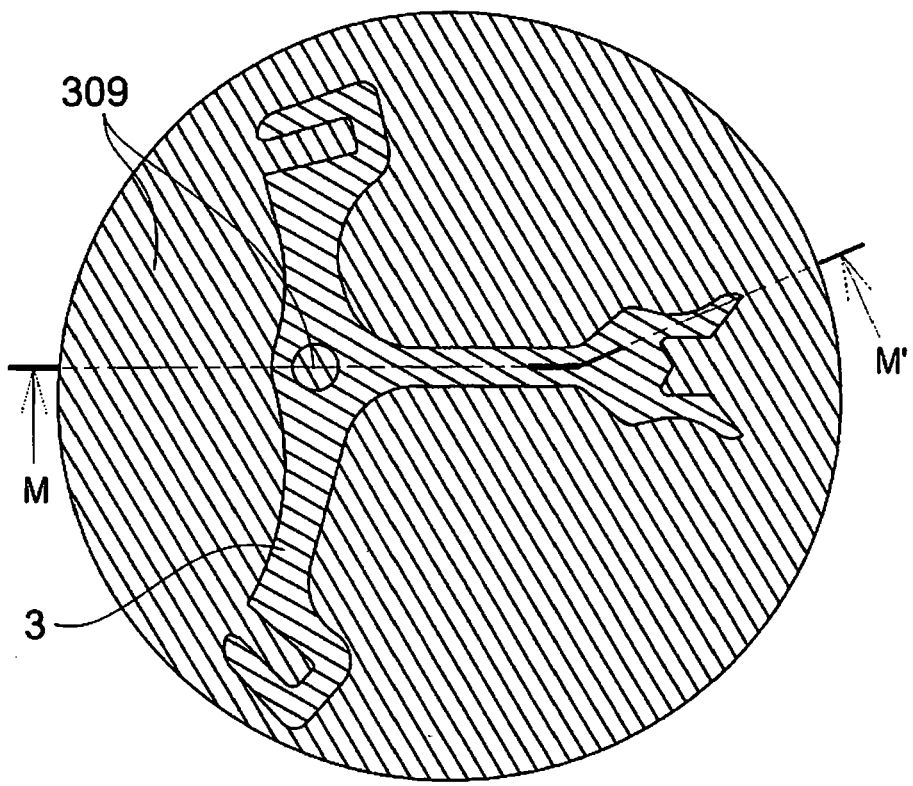
FIGS. 12A and 12B are principle diagrams for illustrating a process for manufacturing the pallet fork (incomplete) of Embodiment 1 of the present invention.
Figure 12B:
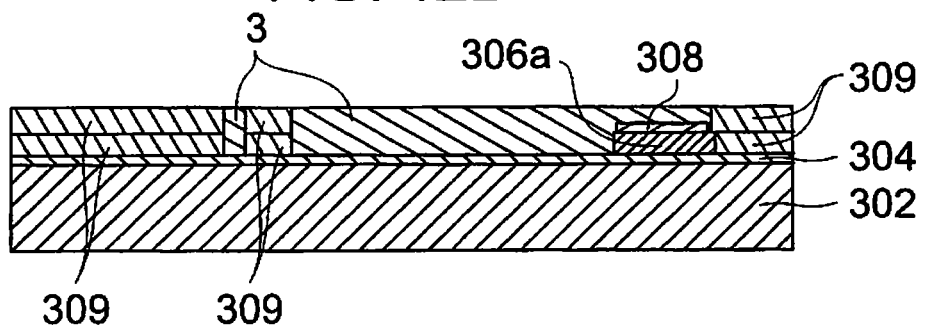

FIGS. 12A and 12B are diagrams illustrating a process for removing the portion of the electroformed metal in excess of the thickness of the cured portion 309 of the negative photoresist 306, 310 in FIGS. 11A and 11B. FIG. 12A is a plan view showing the state in which the removal of the portion of the electroformed metal 314 in excess of the thickness of the cure portion 309 of the negative photoresist 306, 310, and FIG. 12B is a sectional view taken along the segment MM' of FIG. 12A. As shown in FIGS. 12A and 12B, the portion of the electroformed metal 314 in excess of the thickness of the cured portion 309 of the negative photoresist 306, 310 is removed by grinding and polishing. The thickness of the electroformed metal 314 after the grinding and polishing is the thickness of the pallet fork (incomplete); for example, it can be formed in a thickness ranging from 120 μm to 300 μm.

Figure 13A:
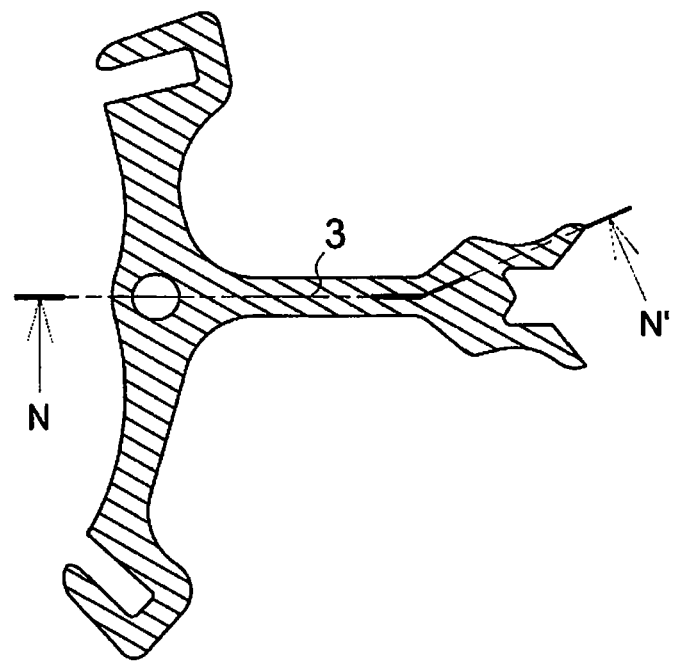
FIGS. 13A and 13B are principle diagrams for illustrating a process for manufacturing the pallet fork (incomplete) of Embodiment 1 of the present invention.
Figure 13B:

FIGS. 13A and 13B are diagrams illustrating a process for extracting the pallet fork (incomplete) 3 formed by the electroformed metal 314 that has undergone removal in FIGS. 12A and 12B from the electroforming mold for the pallet fork (incomplete) to thereby complete the pallet fork (incomplete) 3. FIG. 13A is a plan view of the pallet fork (incomplete) 3 as completed, and FIG. 13B is a sectional view taken along the segment NN' of FIG. 13A. As shown in FIGS. 13A and 13B, the pallet fork (incomplete) 3 formed in the electroforming mold for the pallet fork (incomplete) in FIGS. 12A and 12B is extracted. For this purpose, the silicon substrate 302 is first dissolved in an alkali aqueous solution, and the Cr (chromium) and Au (gold) constituting the metal thin film 304 for turning the surface into a conductor are dissolved by etching. The cured portion 306a of the negative photoresist 306, 310 is removed by burning, dissolving in organic solvent, or performing oxygen plasma ashing thereon. In this way, the pallet fork (incomplete) 3 is completed.

While, for the sake of simplicity, one pallet fork (incomplete) 3 is formed by using one substrate in the above description, it is also possible to form a plurality of pallet forks (incomplete) 3 on a single substrate.

In the above method of manufacturing the pallet fork (incomplete) 3, it is possible to form the contour of the pallet fork (incomplete) 3 by one and the same mask pattern in the process described with reference to FIGS. 9A and 9B, so that the pallet fork (incomplete) 3 can be easily manufactured with high precision in configuration for the safety pin 10, the pair of entry horn and exit horn 26, 28, the arms 20, 22, and the pivot hole 18c.

As shown in FIGS. 1A, 1B, and 2A, 2B, 2C, it is possible to glue an entry pallet jewel 14 and an exit pallet jewel 16 to the pallet fork (incomplete) 3. Further, it is possible to fix a lever pivot 18 to the pallet fork (incomplete) 3. The lever pivot 18 is fitted into the pivot hole 18c of the pallet fork (incomplete) 3. In the method of the present invention, the order in which the safety pin 10, the entry pallet jewel 14, the exit pallet jewel 16, and the lever pivot 18 are fixed to the pallet fork (incomplete) 3 is not fixed. For example, it is possible to fix the safety pin 10 to the pallet fork (incomplete) 3 first, and then fix the lever pivot 18 to the pallet fork (incomplete) 3, and then fix the entry pallet jewel 14 and the exit pallet jewel 16 to the pallet fork (incomplete) 3. Alternatively, it is also possible to fix the lever pivot 18 to the pallet fork (incomplete) 3 first, and then fix the safety pin 10 to the pallet fork (incomplete) 3, and then fix the entry pallet jewel 14 and the exit pallet jewel 16 to the pallet fork (incomplete) 3. Alternatively, it is also possible to fix the safety pin 10, the entry pallet jewel 14, the exit pallet jewel 16, and the lever pivot 18 to the pallet fork (incomplete) 3 in some other order.

(Roller Table Manufacturing Method)

FIGS. 14A through 21B are diagrams illustrating a method of manufacturing the roller table 8. To facilitate the understanding of the method, in FIGS. 14A through 21B, the dimensional ratios of the configuration, thickness, and size shown are different from those of the actual process. As the actual dimensions, the values given in the description are adopted.

Figure 14A:
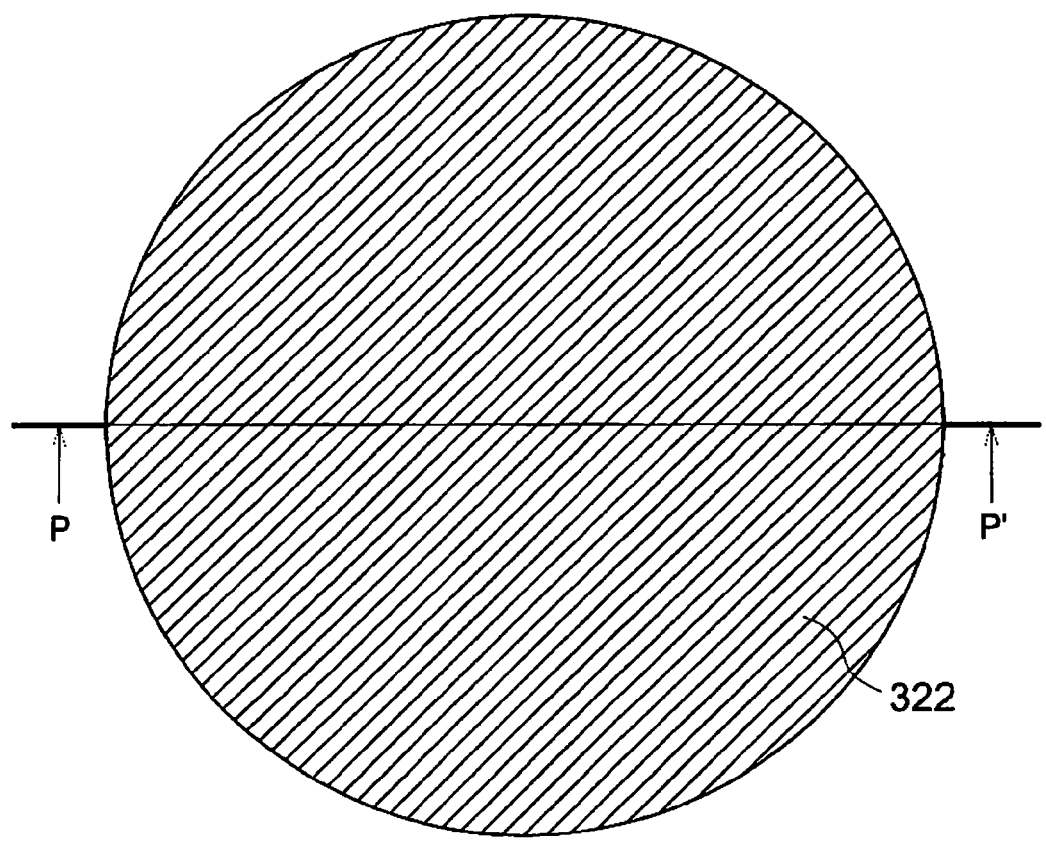
FIGS. 14A and 14B are principle diagrams illustrating a process for manufacturing a roller table according to Embodiment 1 of the present invention.
Figure 14B:
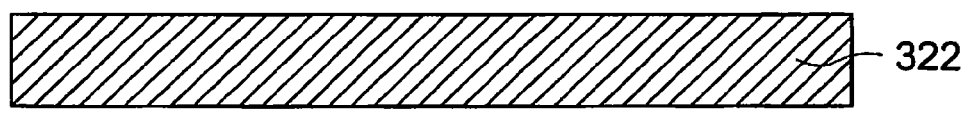

FIGS. 14A and 14B are diagrams illustrating a silicon substrate 322 for preparing a roller table electroforming mold used to form the roller table 8 by electroforming FIG. 14A is a plan view of the silicon substrate 322 for preparing the roller table electroforming mold, and FIG. 14B is a sectional view taken along the segment PP' of FIG. 14A. The size of the silicon substrate 322 preferably ranges, for example, from 1 mm to 160 mm, and the thickness of the silicon substrate 322 is preferably, for example, approximately several hundred μm.

Figure 15A:
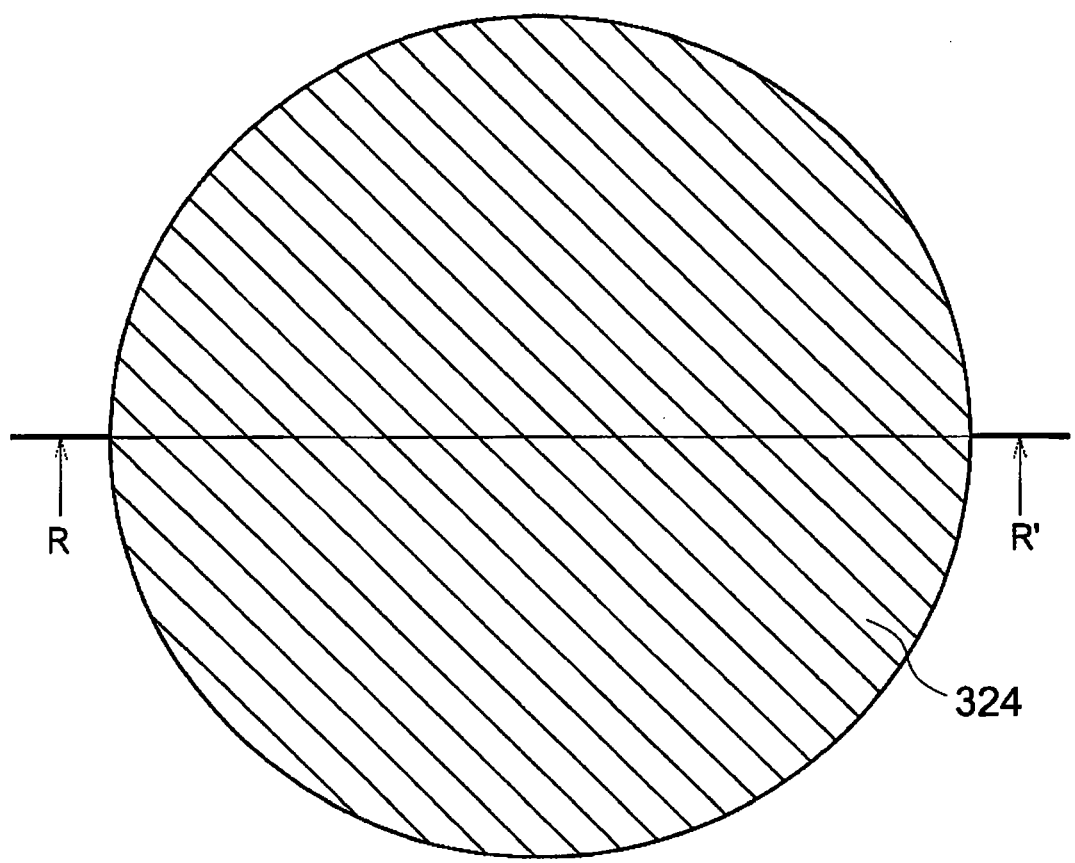
FIGS. 15A and 15B are principle diagrams illustrating a process for manufacturing a roller table according to Embodiment 1 of the present invention.
Figure 15B:
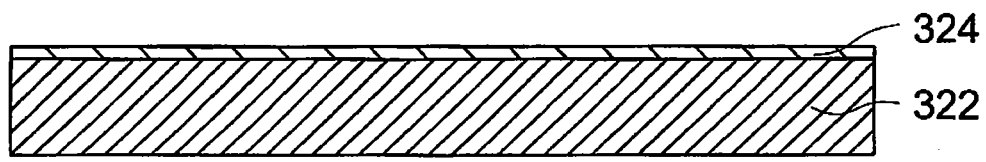

FIGS. 15A and 15B are diagrams illustrating a process for forming a metal thin film 324 on the surface of the silicon substrate 322 shown in FIGS. 14A and 14B to turn the surface into a conductor for electroforming. FIG. 15A is a plan view of the silicon substrate 322 with the metal thin film 324 formed on the surface thereof, and FIG. 15B is a sectional view of the silicon substrate 322 taken along the segment RR' of FIG. 15A. As shown in FIGS. 15A and 15B, the metal thin film 324 is formed on the surface of the silicon substrate 322 to turn the surface into a conductor for electroforming. The metal thin film 324 may, for example, be formed of Au (gold), Cu (copper) or the like, with Cr (chromium) (not shown) being used as an anchor metal. The formation of the metal thin film 324 can be effected by sputtering, evaporation, electroless plating, etc. It is desirable for the thickness of the metal thin film 324 to range from several nm (discontinuous film) to several µm; in the case of Cr (chromium) ad Au (gold), their respective thicknesses are preferably approximately 50 nm and approximately 200 nm.

Figure 16A:
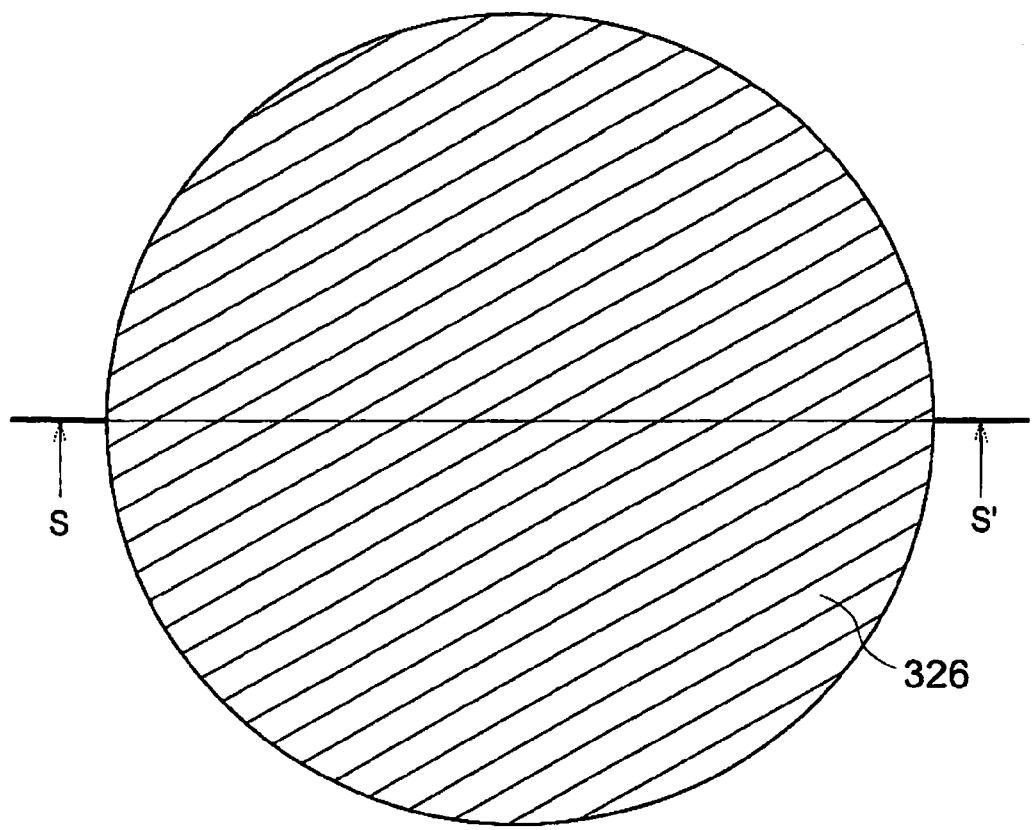
FIGS. 16A and 16B are principle diagrams illustrating a process for manufacturing a roller table according to Embodiment 1 of the present invention.
Figure 16B:
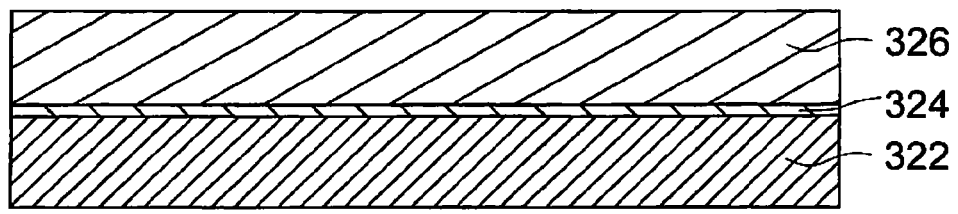

FIGS. 16A and 16B are diagrams illustrating a process for applying a negative photoresist 326 to the metal thin film 324 formed on the silicon substrate 322 shown in FIGS. 15A and 15B. FIG. 16A is a plan view of the silicon substrate 322 with the negative photoresist 326 applied to the surface thereof, and FIG. 16B is a sectional view of the silicon substrate 322 taken along the segment SS' of FIG. 16A. As shown in FIGS. 16A and 16B, the negative photoresist 326 is applied to the surface of the silicon substrate 322 with the metal thin film 324 formed thereon. The thickness of the negative photoresist 326 is equal to the thickness of the roller table 8, and preferably ranges from 100 µm to 200 µm.

Figure 17A:
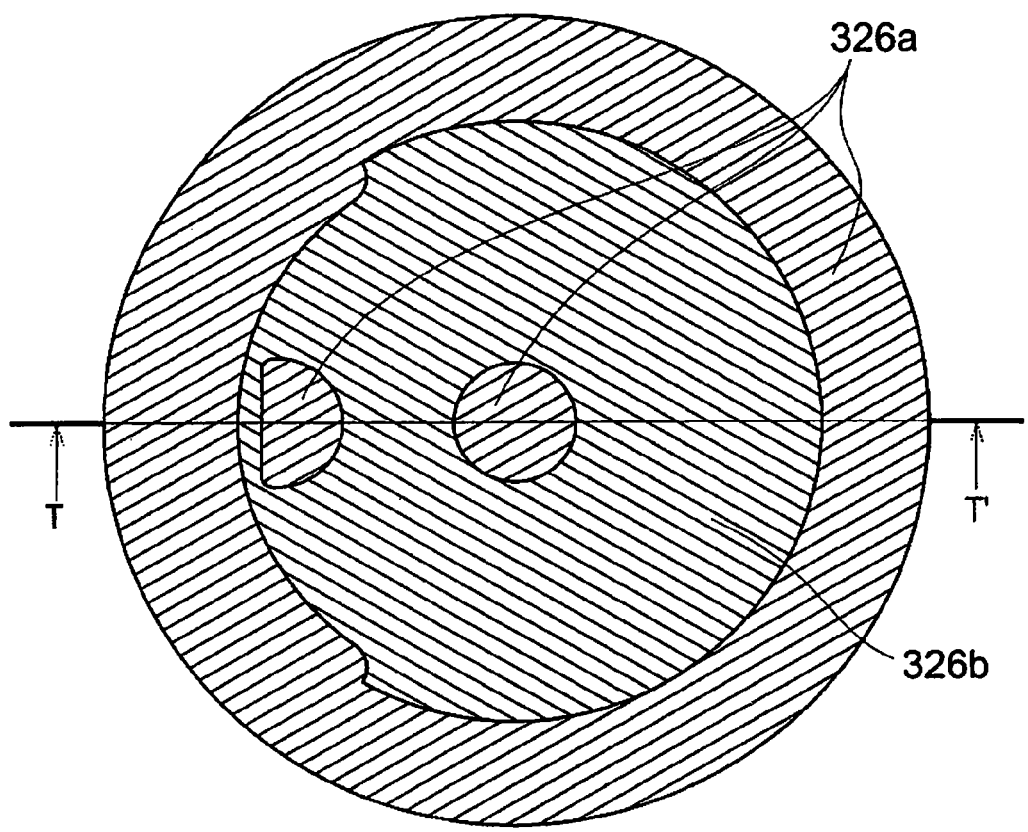
FIGS. 17A and 17B are principle diagrams illustrating a process for manufacturing a roller table according to Embodiment 1 of the present invention.
Figure 17B:
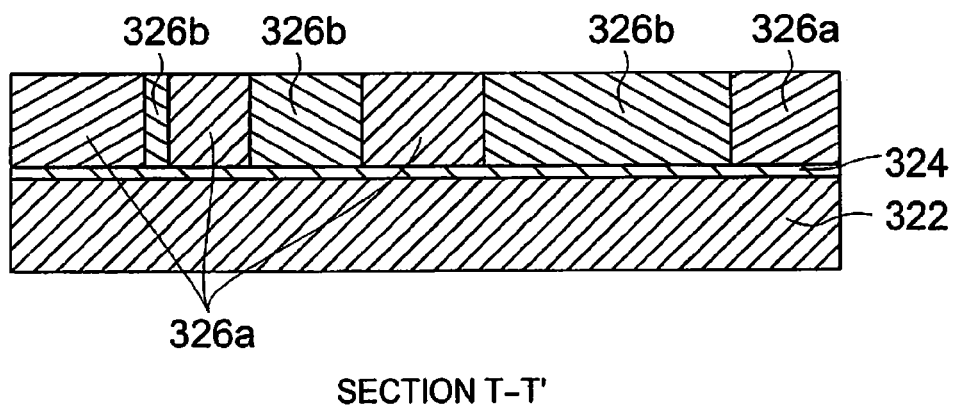

FIGS. 17A and 17B are diagrams illustrating a process for effecting exposure with UV rays on the negative photoresist 326 applied to the silicon substrate 322 shown in FIGS. 16A and 16B, using a mask equipped with a configuration pattern of the roller table 8. FIG. 17A is a plan view of the silicon substrate 322 on which the exposure process has been completed, and FIG. 17B is a sectional view of the silicon substrate 322 taken along the segment TT' of FIG. 17A. As shown in FIGS. 17A and 17B, exposure is effected with UV rays on the negative photoresist 326 applied to the silicon substrate 322, using a mask equipped with the configuration pattern of the roller table 8. When the exposure process has been completed, the negative photoresist 326 is divided into a cured portion 326a cured in the configuration of the roller table 8 corresponding to the pattern with which the mask is equipped, and a non-cured portion 326b.

Figure 18A:
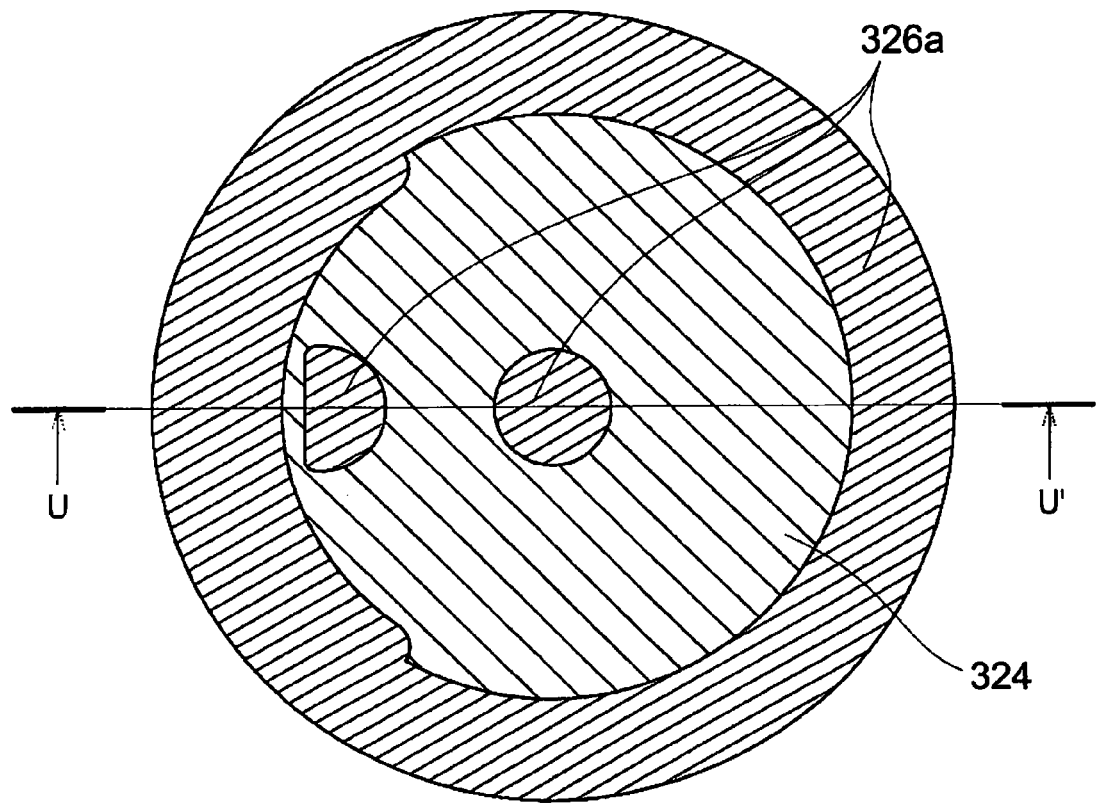
FIGS. 18A and 18B are principle diagrams illustrating a process for manufacturing a roller table according to Embodiment 1 of the present invention.
Figure 18B:
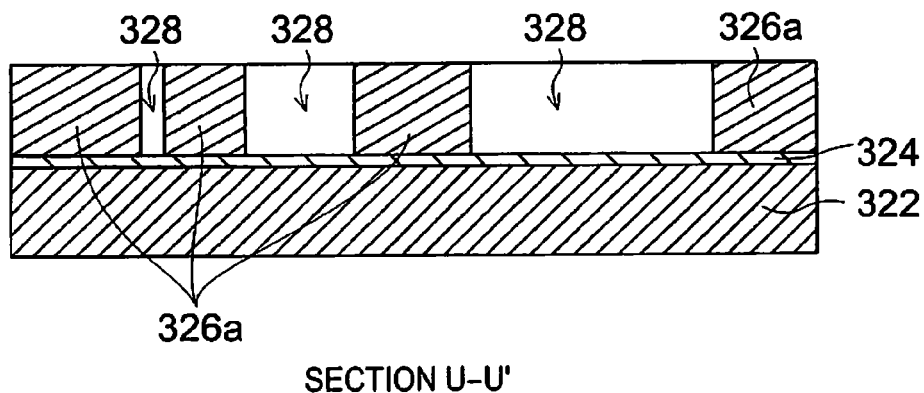

FIGS. 18A and 18B are diagrams illustrating a process for removing the non-cured portion 326b of the negative photoresist 326 of the silicon substrate 322 shown in FIGS. 17A and 17B. FIG. 18A is a plan view of the silicon substrate 322 from which the non-cured portion 326b of the negative photoresist 326 has been completely removed, and FIG. 18B is a sectional view of the silicon substrate 322 taken along the segment UU' of the silicon substrate 322 of FIG. 18A. As shown in FIGS. 18A and 18B, the non-cured portion 326b is removed from the silicon substrate 322 shown in FIGS. 17A and 17B by using a developer. Thus, a cavity 328 is formed on the silicon substrate 322. Through the formation of the cavity 328, the roller table electroforming mold is completed.

Figure 19A:
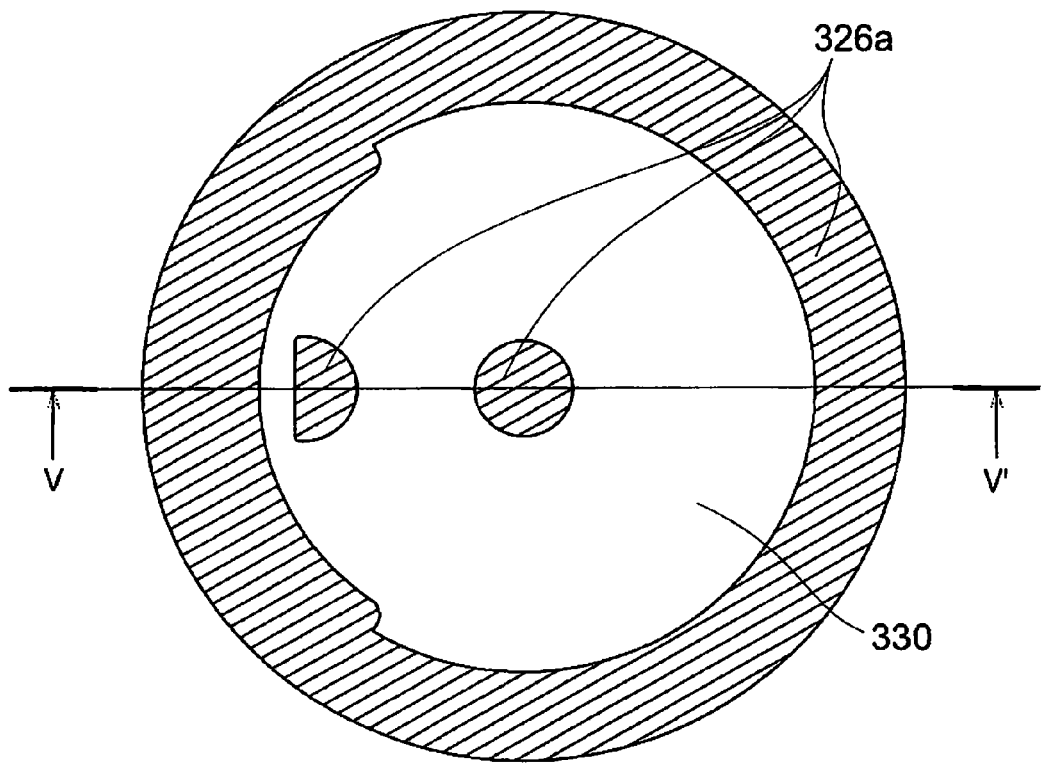
FIGS. 19A and 19B are principle diagrams illustrating a process for manufacturing a roller table according to Embodiment 1 of the present invention.
Figure 19B:
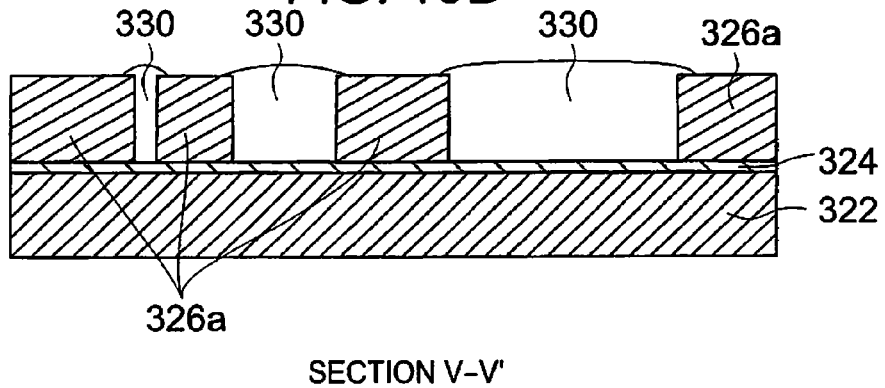

FIGS. 19A and 19B are diagrams illustrating a process for performing electroforming with the roller table electroforming mold completed as shown in FIGS. 18A and 18B. FIG. 19A is a plan view of the roller table electroforming mold with which electroforming has been completed, and FIG. 19B is a sectional view of the silicon substrate 302 taken along the segment VV' of FIG. 19A. As shown in FIGS. 19A and 19B, electroforming is performed with the roller table electroforming mold completed as shown in FIGS. 18A and 18B. An electroformed metal 330 is produced in the cavity 328, and turned into a metal component endowed with the configuration of the roller table 8. As the material of the electroformed metal 330 forming the roller table 8, there is adopted a material allowing electroforming, such as Ni (nickel), Ni—W (nickel-tungsten alloy), or Ni—P (nickel-phosphorus alloy).

Figure 20A:
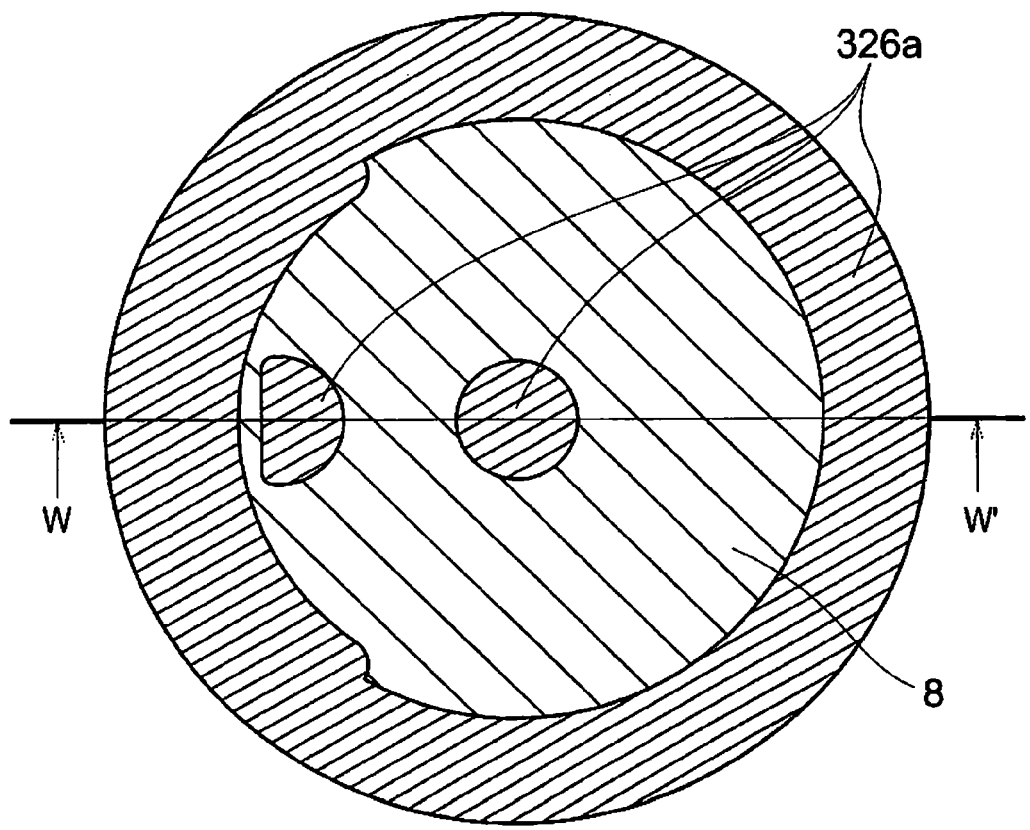
FIGS. 20A and 20B are principle diagrams illustrating a process for manufacturing a roller table according to Embodiment 1 of the present invention.
Figure 20B:
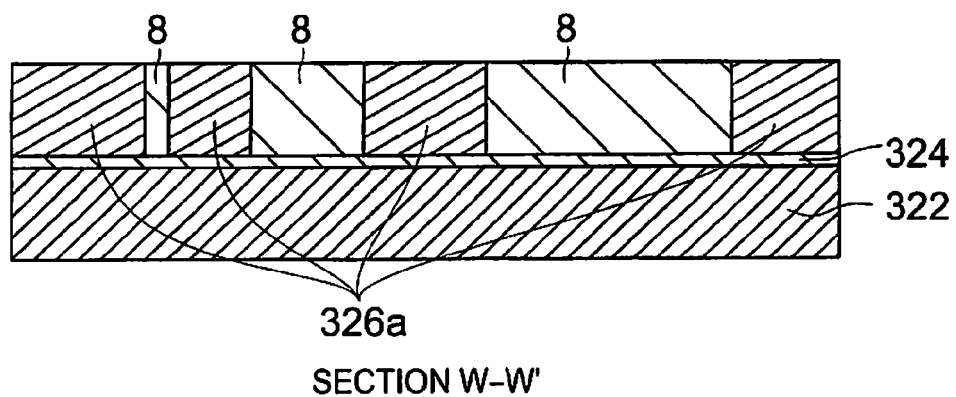

FIGS. 20A and 20B are diagrams illustrating a process for removing the portion of the electroformed metal 330 in excess of the thickness of the cured portion 326a of the negative photoresist 326 shown in FIGS. 19A and 19B. FIG. 20A is a plan view showing the state in which the removal of the portion of the electroformed metal 330 in excess of the thickness of the cured portion 326a of the negative photoresist 326 has been completed, and FIG. 20B is a sectional view of the silicon substrate 322 taken along the segment WW' of FIG. 20A. As shown in FIGS. 20A and 20B, the portion of the electroformed metal 330 in excess of the thickness of the negative photoresist 326 is removed by grinding and polishing. The electroformed metal 330 can be formed in a thickness, for example, of 100 µm to 200 µm.

Figure 21A:
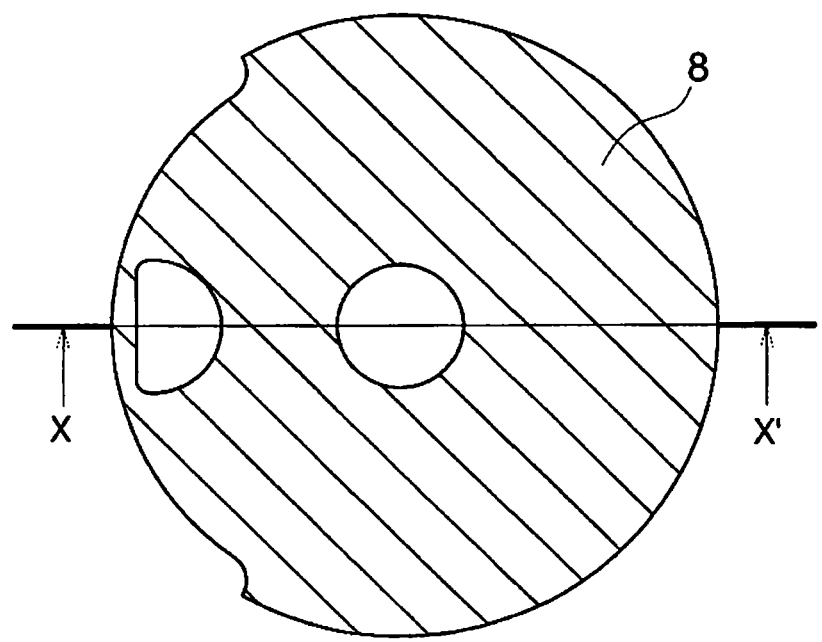
FIGS. 21A and 21B are principle diagrams illustrating a process for manufacturing a roller table according to Embodiment 1 of the present invention.
Figure 21B:
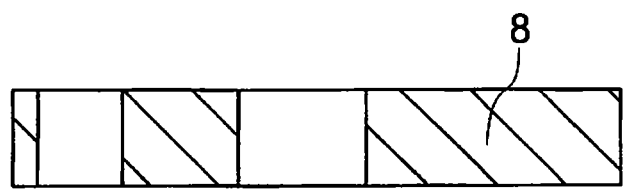

FIGS. 21A and 21B are diagrams illustrating a process for extracting the electroformed metal 330 that has undergone the removal processing as shown in FIGS. 20A and 20B from the roller table electroforming mold to thereby complete the roller table 8. FIG. 21A is a plan view of the roller table 8 as completed, and FIG. 21B is a sectional view of the roller table 8 taken along the segment XX' of FIG. 21A. As shown in FIGS. 21A and 21B, the roller table 8 formed in the roller table electroforming mold as shown in FIGS. 20A and 20B is extracted. First, the silicon substrate 322 is dissolved in an alkali aqueous solution, and the Cr (chromium) and Au (gold) forming the metal thin film 324 for turning the surface into a conductor are respectively dissolved by etching. The cured portion 326a of the negative photoresist 326 is removed by burning, dissolving in an organic solvent, or performing oxygen plasma ashing. In this way, the roller table 8 is completed.

While in the above-described example one roller table 8 is formed on one substrate for the sake of simplicity, it is also possible to form a plurality of roller tables 8 on a single substrate.

In the above method of manufacturing the roller table 8, it is possible to form the contour of the roller table 8 with one and the same mask pattern in the process described in FIG. 17, so that it is possible to easily produce a roller table 8 superior in the configuration accuracy of the passing hollow 8a, the impulse pin hole 8b, and the pivot hole 8c.

As shown in FIG. 1C, the roller 4 is manufactured by inserting the impulse pin 6 into the roller table 8 and gluing it thereto.

(Construction of a Mechanical Watch)

Figure 22:
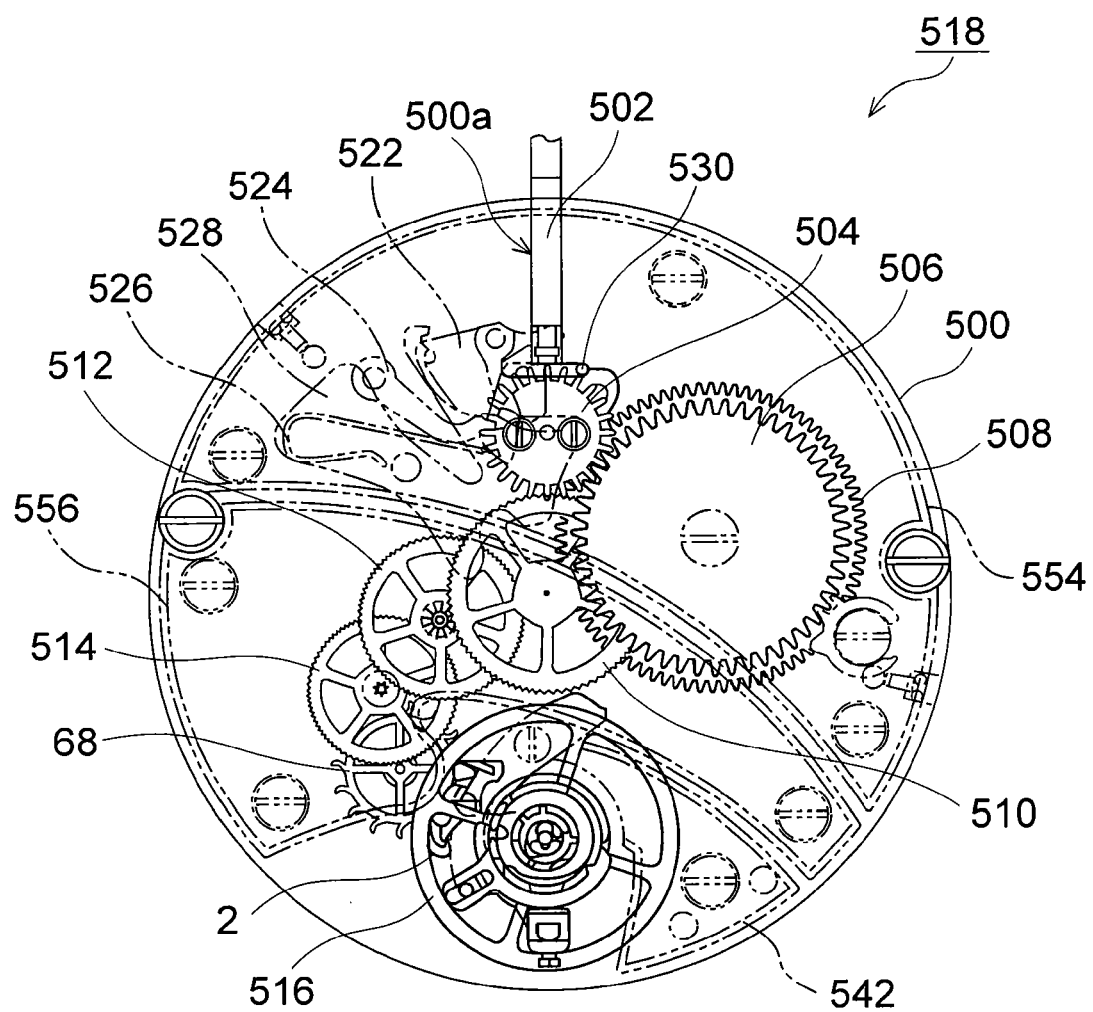
FIG. 22 is a diagram showing a front train wheel of a mechanical watch according to Embodiment 1 of the present invention.
Figure 23:
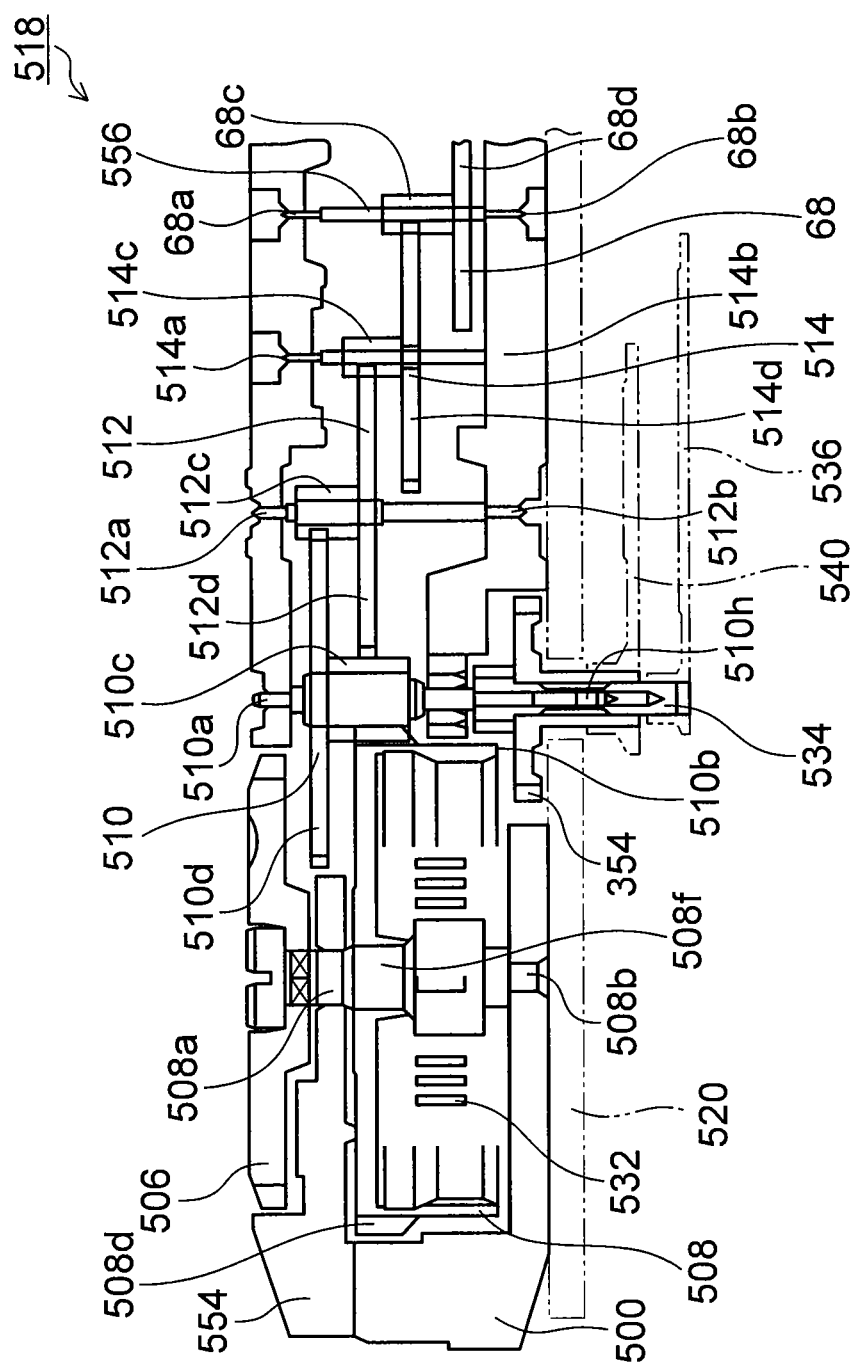
FIG. 23 is a sectional view showing a movement barrel to an escape wheel of the train wheel of the mechanical watch of Embodiment 1 of the present invention.
Figure 24:
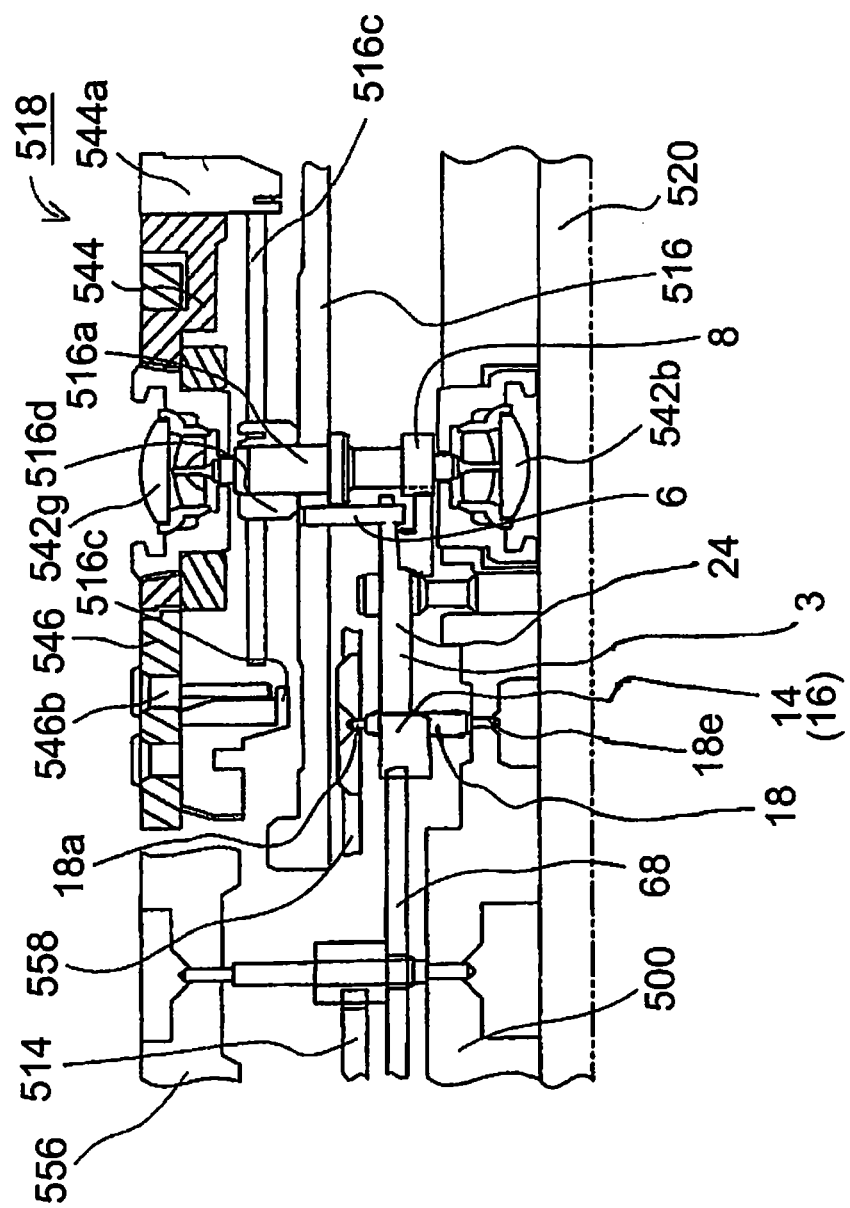
FIG. 24 is a sectional view showing the escape wheel to a balance with hair spring of the train wheel of the mechanical watch of Embodiment 1 of the present invention.

FIG. 22 is a diagram showing a front train wheel of a mechanical watch, FIG. 23 is a sectional view of a movement barrel 508 to an escape wheel 68 of the train wheel of the mechanical watch, and FIG. 24 is a sectional view of the escape wheel 68 to a balance with hairspring 516 of the train wheel of the mechanical watch.

In the mechanical watch, a movement (mechanical structure inclusive of a driving portion) 518 has a main plate 500 constituting the base plate of the movement. A stem 502 is rotatably incorporated into a stem guide hole 500a. A dial 520 is mounted to the movement 518. Generally speaking, of both sides of the main plate, the side where the dial is situated is referred to as the "back side" of the movement, and the side opposite to the side where the dial is situated is referred to as the "front side" of the movement. The train wheel assembled to the "front side" of the movement is referred to as the "front train wheel," and the train wheel assembled to the "back side" of the movement is referred to as the "back train wheel." The position in the axial direction of the stem 502 is determined by a switching device including a setting lever 522, a yoke 524, a yoke spring 526, and a setting lever jumper 528. A winding pinion 530 is rotatably provided on a guide shaft portion of the stem 502. When the stem 502 is rotated, with the stem 502 situated at a first stem position (0th step) nearest to the inner side of the movement along the rotation axis direction, the winding pinion 530 is rotated through rotation of a clutch wheel. A crown wheel 504 is rotated through the rotation of the winding pinion 530. A ratchet wheel 506 is rotated through the rotation of the crown wheel 504. Through the rotation of the ratchet wheel 506, a mainspring 532 accommodated in the movement barrel 508 is wound up. A center wheel 510 is rotated through the rotation of the movement barrel 508. The escape wheel 68 is rotated through rotation of a fourth wheel 514, a third wheel 512, and the center wheel 510. The movement barrel 508, the center wheel 510, the third wheel 512, and the fourth wheel 514 constitute the front train wheel.

An escapement/governor device for controlling the rotation of the front train wheel includes the balance with hairspring 516, the escape wheel 68, and the pallet fork (complete) 2. The balance with hairspring 516 includes a balance staff 516a, a balance wheel 516b, and a hairspring 516c. On the basis of the rotation of the center wheel 510, a cannon pinion 534 is rotated simultaneously. A minute hand 536 mounted to the cannon pinion 534 indicates "minute." The cannon pinion 534 is provided with a slip mechanism for the center wheel 510. Based on the rotation of the cannon pinion 534, an hour wheel 538 is rotated through rotation of a minute wheel. An hour hand 540 mounted to the hour wheel 538 indicates "hour." The hairspring 516c is a thin plate spring in the form of a spiral with a plurality of turns. The inner end portion of the hairspring 516c is fixed to a collet 516d fixed to the balance staff 516a, and the outer end portion of the hairspring 516c is fixed in position by a screw via a stud 544a mounted to a stud support 544 fixed to a balance bridge 542. A regulator 546 is rotatably mounted to the balance bridge 542. A regulator key 548 and a regulator pin 550 are mounted to the regulator 546. A portion of the hairspring 516c near the outer end portion thereof is situated between the regulator key 548 and the regulator pin 550. The balance with hairspring 516 is supported so as to be rotatable with respect to the main plate 500 and the balance bridge 542.

The movement barrel 508 is equipped with a barrel wheel 508d, a barrel arbor 508f, and a mainspring 552. The barrel arbor 508f includes an upper shaft portion 508a and a lower shaft portion 508b. The barrel arbor 508f is formed of a metal such as carbon steel. The barrel wheel 508d is formed of a metal such as brass. The center wheel 510 includes an upper shaft portion 510a, a lower shaft portion 510b, a pinion portion 510c, a wheel portion 510d, and a bead portion 510h. The pinion portion 510c of the center wheel 510 is in mesh with the barrel wheel 508d. The upper shaft portion 510a, the lower shaft portion 510b, and the beard portion 510h are formed of a metal such as carbon steel. The wheel portion 510d is formed of a metal such as brass. The third wheel 512 includes an upper shaft portion 512a, a lower shaft portion 512b, a pinion portion 512c, and a wheel portion 512d. The pinion portion 512c of the third wheel 512 is in mesh with the wheel portion 510d. The fourth wheel 514 includes an upper shaft portion 514a, a lower shaft portion 514b, a pinion portion 514c, and a wheel portion 514d. The pinion portion 514c of the fourth wheel 514 is in mesh with the wheel portion 512d. The upper shaft portion 514a and the lower shaft portion 514b are formed of a metal such as carbon steel. The wheel portion 514d is formed of a metal such as brass.

The escape wheel 68 includes an upper shaft portion 68a, a lower shaft portion 68b, a pinion portion 68c, and a wheel portion 68d. The pinion portion 68c of the escape wheel 68 is in mesh with the wheel portion 514d. The pallet fork (complete) 2 is equipped with the pallet fork (incomplete) 3 and the lever pivot 18. The lever pivot 18 includes an upper shaft portion 18a and a lower shaft portion 18b.

The movement barrel 508 is supported so as to be rotatable with respect to the main plate 500 and a barrel bridge 554. That is, the upper shaft portion 508a of the barrel arbor 508f is supported so as to be rotatable with respect to the barrel bridge 554. The lower shaft portion 508b of the barrel arbor 508f is supported so as to be rotatable with respect to the main plate 500. The center wheel 510, the third wheel 512, the fourth wheel 514, and the escape wheel 68 are supported so as to be rotatable with respect to the main plate 500 and a train wheel bridge 556. That is, the upper shaft portion 510b of the center wheel 510, the upper shaft portion 512a of the third wheel 512, the upper shaft portion 514a of the fourth wheel 514, and the upper shaft portion 68a of the escape wheel 68 are supported so as to be rotatable with respect to the train wheel bridge 556. The lower shaft portion 510b of the center wheel 510, the lower shaft portion 512b of the third wheel 512, the lower shaft portion 514b of the fourth wheel 514, and the lower shaft portion 68b of the escape wheel 68 are supported so as to be rotatable with respect to the main plate 500. The pallet fork (complete) 2 is supported so as to be rotatable with respect to the main plate 500 and a pallet bridge 558. That is, the upper shaft portion 18a of the pallet fork (complete) 2 is supported so as to be rotatable with respect to the pallet bridge 558. The lower shaft portion 18b of the pallet fork (complete) 2 is supported so as to be rotatable with respect to the main plate 500.

A lubricant is supplied to a bearing portion of the barrel bridge 554 rotatably supporting the upper shaft portion 508a of the barrel arbor 508f, to a bearing portion of the train wheel bridge 556 rotatably supporting the upper shaft portion 510a of the center wheel 510, to a bearing portion of the barrel bridge 556 rotatably supporting the upper shaft portion 512a of the third wheel 512, to a bearing portion of the train wheel bridge 556 rotatably supporting the upper shaft portion 514a of the fourth wheel 514, to a bearing portion of the train wheel bridge 556 rotatably supporting the upper shaft portion 68a of the escape wheel 68, and to a bearing portion of the pallet bridge 558 rotatably supporting the upper shaft portion 18a of the pallet fork (complete) 2. A lubricant is supplied to a bearing portion of the main plate 500 rotatably supporting a lower shaft portion 560b of a second rotor 560, to a bearing portion of the main plate 500 rotatably supporting the lower shaft portion 508b of the barrel arbor 508f, to a bearing portion of the main plate 500 rotatably supporting the lower shaft portion 510b of the center wheel 510, to a bearing portion of the main plate 500 rotatably supporting the lower shaft portion 512b of the third wheel 512, to a bearing portion of the main plate 500 rotatably supporting the lower shaft portion 514b of the fourth wheel 514, to a bearing portion of the main plate 500 rotatably supporting the lower shaft portion 508b of the escape wheel 68, and to a bearing portion of the main plate 500 rotatably supporting the lower shaft portion 18b of the pallet fork (complete) 2. It is desirable for the lubricant to be a precision instrument oil and, in particular, a so-called chronometer oil. To enhance the retention performance of the lubricant, it is desirable for the bearing portions of the main plate 500, the bearing portion of the barrel bridge 554, and the bearing portion of the train wheel bridge 556 to be provided with an oil reservoir portion of a conical, cylindrical, or truncated-cone-shaped configuration. When the oil reservoir portion is provided, it is possible to effectively prevent diffusion of the oil due to the surface tension of the lubricant. The main plate 500, the barrel bridge 554, the train wheel bridge 556, and the pallet bridge 558 may be formed of a metal such as brass, or an engineering plastic such as polycarbonate.

As described above, in the mechanical watch equipped with the escapement governor of Embodiment 1 of the present invention, it is possible to achieve a reduction in the thickness of the components of the pallet fork (complete) 2 and the roller 4, whereby it is possible to achieve an overall reduction in thickness. Further, due to the small moment of inertia of the pallet fork (complete) 2, and to the satisfactory configuration precision of the pallet fork (incomplete) 3 and the roller table 8, it is possible to achieve an improvement in terms of the time measurement accuracy of the mechanical watch equipped with the escapement governor of Embodiment 1 of the present invention. Further, in the pallet fork (complete) 2 of the present invention, it is possible to omit the step of driving in the safety pin 10, so that it is possible to reduce the assembly time of the pallet fork (complete) 2, whereby the mechanical watch equipped with the escapement governor of Embodiment 1 of the present invention can be manufactured easily in a reduced production time and at a restrained production cost.

(Operation of the Escapement Governor)

FIG. 25A through 31B show the respective operation paths of the pallet fork (complete) 2, the roller 4, and the escape wheel 68. In the club tooth lever type escapement governor, the normal rotation and the reverse rotation of the pallet fork (complete) 2 and the roller 4 are symmetrical with respect to each other, so that only one of the normal rotation and the reverse rotation will be described, the same description being applicable to the other rotation. The roller 4 is one of the components of the balance with hairspring, and the rotation of the roller 4 is realized by the mechanism of the balance with hairspring. The components of the balance with hairspring are the roller 4, the balance staff, the collet, the hairspring, the regulator equipped with the regulator key and the regulator pin, the stud, the stud support, the balance wheel, and the balance bridge. In FIGS. 25A through 31B, to facilitate the understanding the illustration of the operation of the pallet fork (complete) 2 and the roller 4, the balance with hairspring, the hairspring, the balance staff, the collet, the regulator key, the regulator pin, the regulator, the stud, the stud support, the balance wheel, and the balance bridge are not shown. The roller 4, the collet, and the balance wheel are forced into the balance staff, with the collet retaining one end of the hairspring. The other end of the hairspring is retained by the stud retained by the stud support. Thus, due to the elasticity of the hairspring, the balance with hairspring makes a rotational movement in which the normal rotation and the reverse rotation are symmetrical with respect to each other.

Figure 25A:
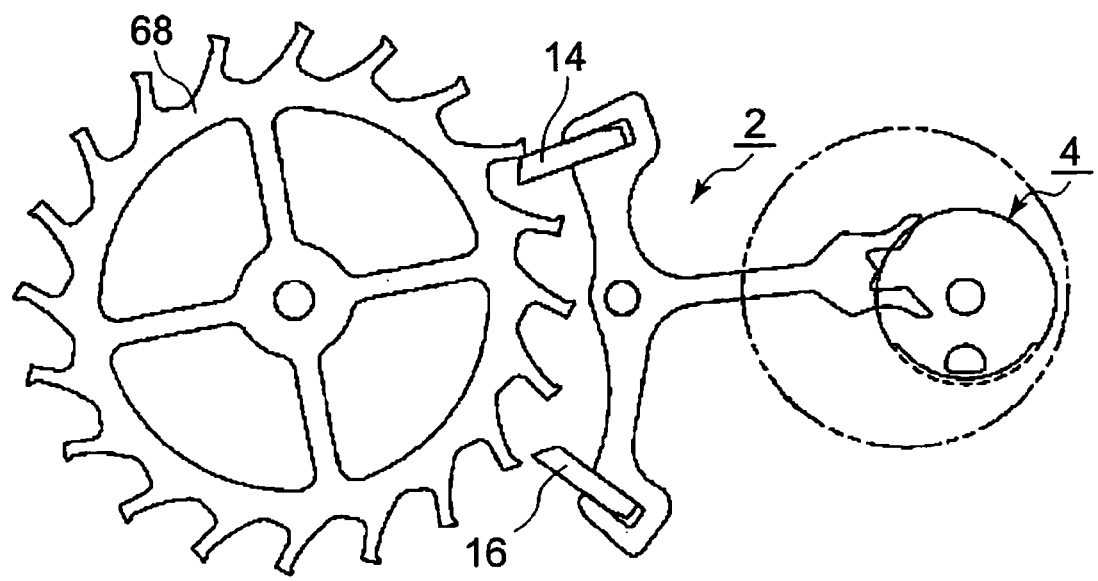
FIGS. 25A and 25B are principle diagrams illustrating the respective rotating motions of a roller, a pallet fork (complete), and an escape wheel according to Embodiment 1 of the present invention.
Figure 25B:
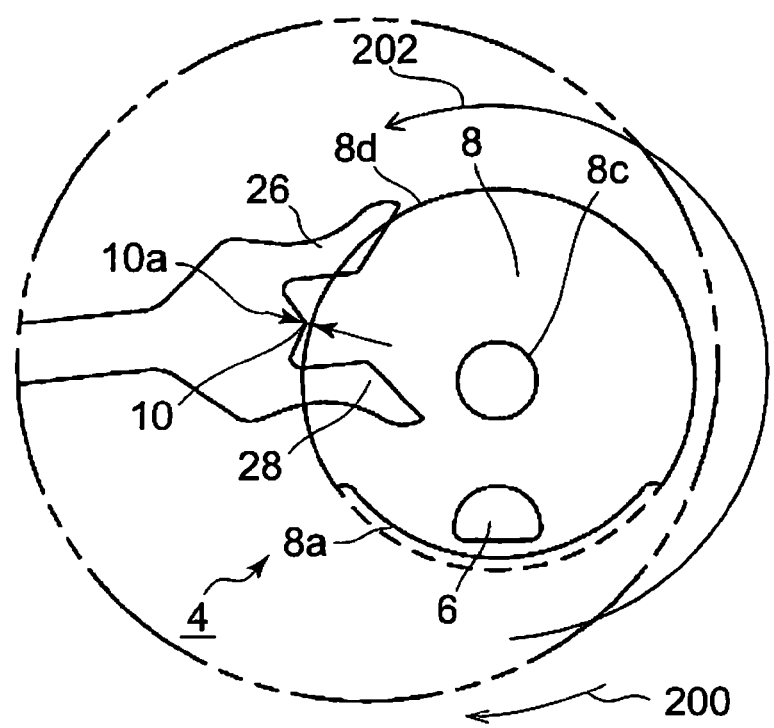

FIGS. 25A and 25B are diagrams illustrating the operation of the pallet fork (complete) 2 and the roller 4 when the roller 4 has swung out in a roller rotating direction 200 through free oscillation, and the rotation of the roller 4 is changed to a roller rotating direction 202 due to the elasticity of the hairspring retained by the collet and the stud mentioned above. FIG. 25A is a diagram showing the positions of the pallet fork (complete) 2, the roller 4, and the escape wheel 68, and FIG. 25B is an enlarged view of the positions of the pallet fork (complete) 2 and the roller 4 as shown in FIG. 25A. When the roller 4 has swung out in the roller rotating direction 200 through free oscillation, and the rotation of the roller 4 is changed to the roller rotating direction 202 due to the elasticity of the hairspring retained by the collet and the stud mentioned above, there exists a safety pin space 10*a* between the safety pin 10 provided on the pallet fork (complete) 2 and a roller table side surface 8*d*, so that the safety pin 10 does not hinder the free oscillation of the roller 4. When the pallet fork (complete) 2 threatens to make an erroneous rotation due to disturbance, the safety pin 10 collides with the roller table side surface 8*d*, whereby the pallet fork (complete) 2 is prevented from making an erroneous rotation. Thus, it is possible to confirm that the safety pin 10 and the roller table 8 function properly, allowing the pallet fork (complete) 2 and the roller 4 of the present invention to operate in the normal fashion.

Figure 26A:
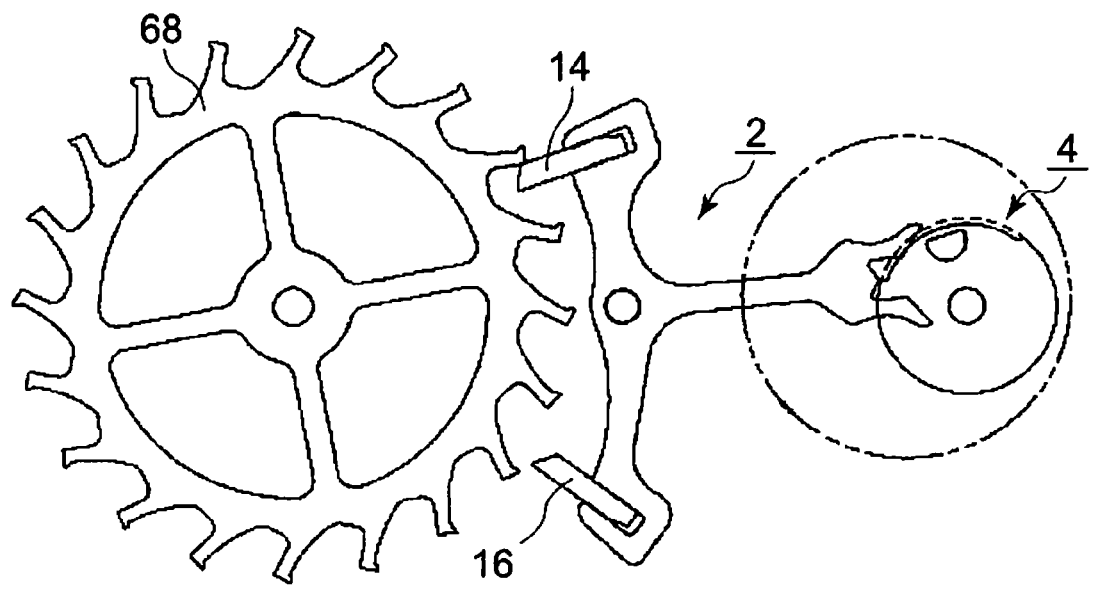
FIGS. 26A and 26B are principle diagrams illustrating the respective rotating motions of the roller, the pallet fork (complete), and the escape wheel of Embodiment 1 of the present invention.
Figure 26B:
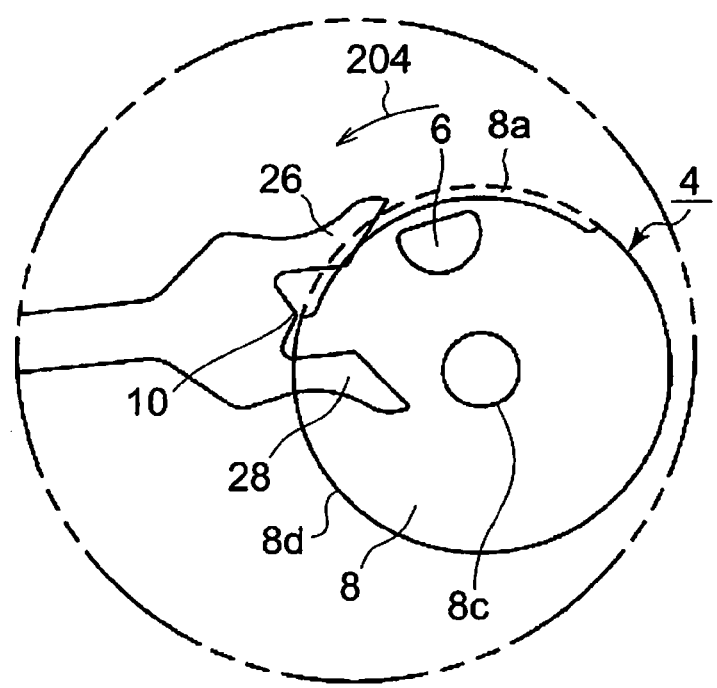

FIGS. 26A and 26B are diagrams illustrating the operation of the pallet fork (complete) 2 and the roller 4 subsequent to that shown in FIGS. 25A and 25B, showing the positions and rotating directions of the pallet fork (complete) 2 and the roller 4. FIG. 26A is a diagram showing the positions of the pallet fork (complete) 2, the roller 4, and the escape wheel 68, and FIG. 26B is an enlarged view of the positions of the pallet fork (complete) 2 and the roller 4 as shown in FIG. 26A. The roller 4 rotates in a roller rotating direction 204, and the position of the roller table 8 opposed to the safety pin 10 moves from the roller table side surface 8*d* to the passing hollow 8*a*; at the same time, the impulse pin 6 moves to a position where it is opposed to the entry horn 26. At this time, the safety pin 10 provided on the pallet fork (complete) 2 enters the passing hollow 8*a* provided in the roller table 8, so that the rotation of the pallet fork (complete) 2 is permitted. Further, the mechanism for preventing erroneous rotation of the pallet fork (complete) 2 due to disturbance is changed to the safety pin 10 and the roller table side surface 8*d* to the entry horn 26 and the impulse pin 6. When the pallet fork (complete) 2 threatens to make an erroneous rotation due to disturbance, the safety pin 10 can enter the passing hollow 8*a*, so that the rotation of the pallet fork (complete) 2 is permitted; however, the side surface of the entry horn 26 collides with the impulse pin 6, whereby an erroneous rotation of the pallet fork (complete) 2 is prevented. Thus, it is possible to confirm that the pallet fork (complete) 2 and the roller 4 of the present invention operate in the normal fashion.

Figure 27A:
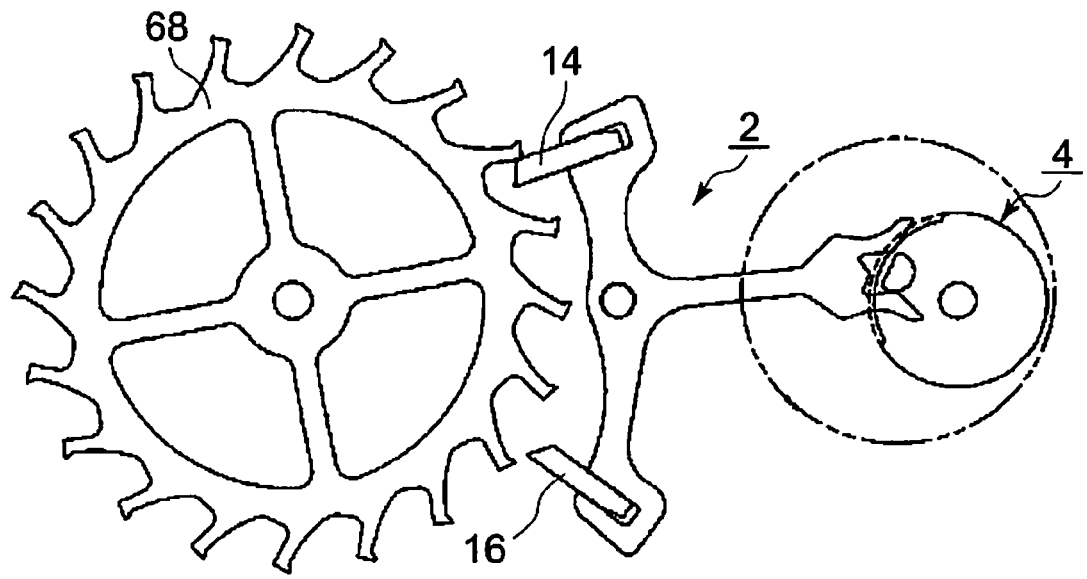
FIGS. 27A and 27B are principle diagrams illustrating the respective rotating motions of the roller, the pallet fork (complete), and the escape wheel of Embodiment 1 of the present invention.
Figure 27B:
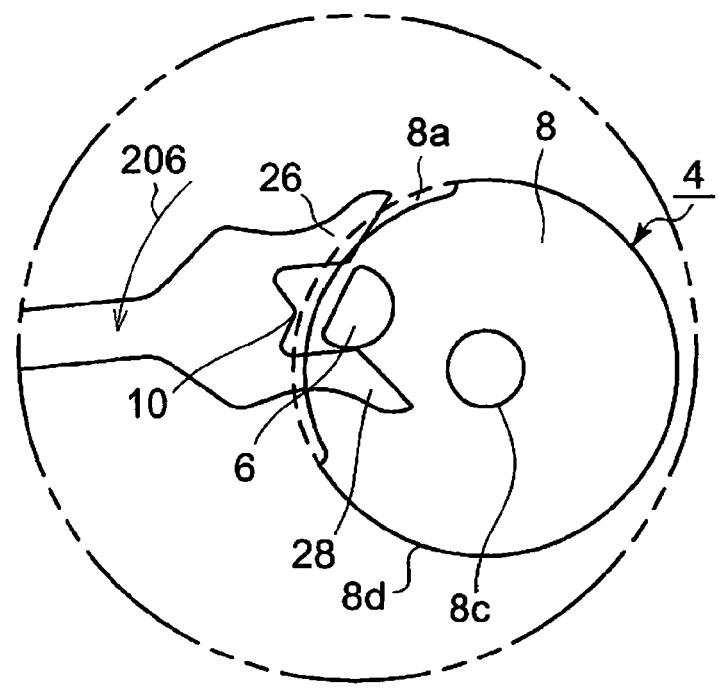

FIGS. 27A and 27B are diagrams illustrating the operation of the pallet fork (complete) 2 and the roller 4 subsequent to that shown in FIGS. 26A and 26B, showing the positions and rotating directions of the pallet fork (complete) 2 and the roller 4. FIG. 27A is a diagram showing the positions of the pallet fork (complete) 2, the roller 4, and the escape wheel 68, and FIG. 27B is an enlarged view of the positions of the pallet fork (complete) 2 and the roller 4 as shown in FIG. 27A. The roller 4 rotates in a roller rotating direction 206, and the impulse pin 6 collides with the side surface of the exit horn 28. Thus, the impulse pin 6 applies a force to the pallet fork (complete) 2 to cause it to rotate, so that the entry pallet jewel 14, which has been keeping the escape wheel 68 from rotating, is detached from the escape wheel 68, and the pallet fork (complete) 2 is about to start rotation. Since the safety pin 10 can enter the passing hollow 8*a* provided in the roller table 8, the safety pin 10 does not collide with the roller table 8, and the rotation of the pallet fork (complete) 2 is permitted.

Figure 28A:
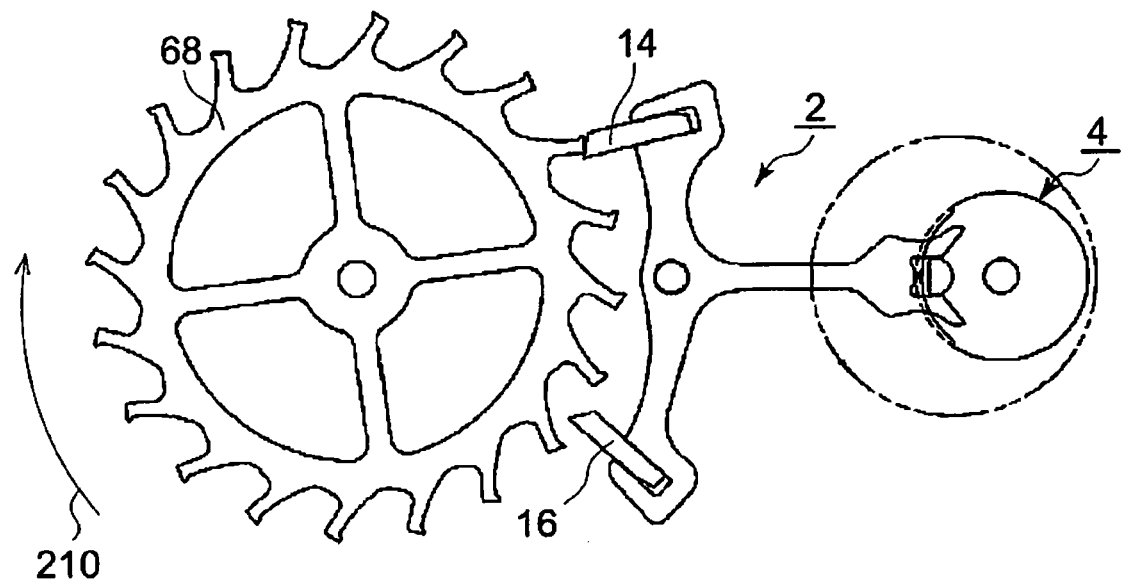
FIGS. 28A and 28B are principle diagrams illustrating the respective rotating motions of the roller, the pallet fork (complete), and the escape wheel of Embodiment 1 of the present invention.
Figure 28B:
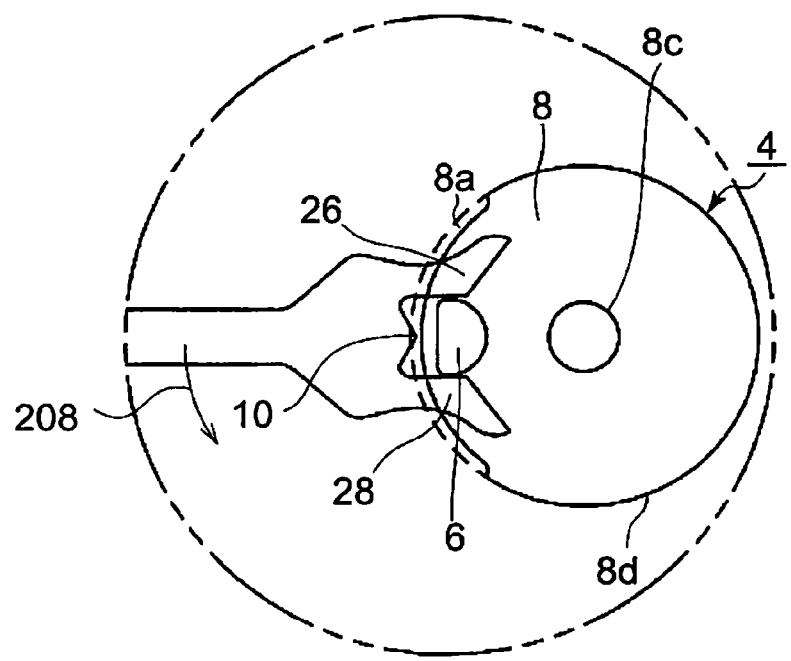

FIGS. 28A and 28B are diagrams illustrating the operation of the pallet fork (complete) 2 and the roller 4 subsequent to that shown in FIGS. 27A and 27B, showing the positions and rotating directions of the pallet fork (complete) 2 and the roller 4. FIG. 28A is a diagram showing the positions of the pallet fork (complete) 2, the roller 4, and the escape wheel 68, and FIG. 28B is an enlarged view of the positions of the pallet fork (complete) 2 and the roller 4 as shown in FIG. 28A. The roller 4 rotates in a roller rotating direction 208. At this time, the escape wheel 68 rotates in an escape wheel rotating direction 210, and applies a force to the entry pallet jewel 14 to thereby rotate the pallet fork (complete) 2. Since the safety pin 10 enters the passing hollow 8a, the pallet fork (complete) 2 rotates without colliding with the roller table 8. While in FIGS. 27A and 27B the pallet fork (complete) 2 is rotated by a fork applied to the exit horn 28 from the impulse pin 6, in FIGS. 28A and 28B, the entry horn 26 transmits to the impulse pin 6 the force applied to the pallet fork (complete) 2 from the escape wheel 68 via the entry pallet jewel 14. Thus, the energy the entry horn 26 imparts to the impulse pin 6 is turned into the rotation energy for the balance with hairspring, thus enabling the balance with hairspring to continue its rotation.

Figure 29A:
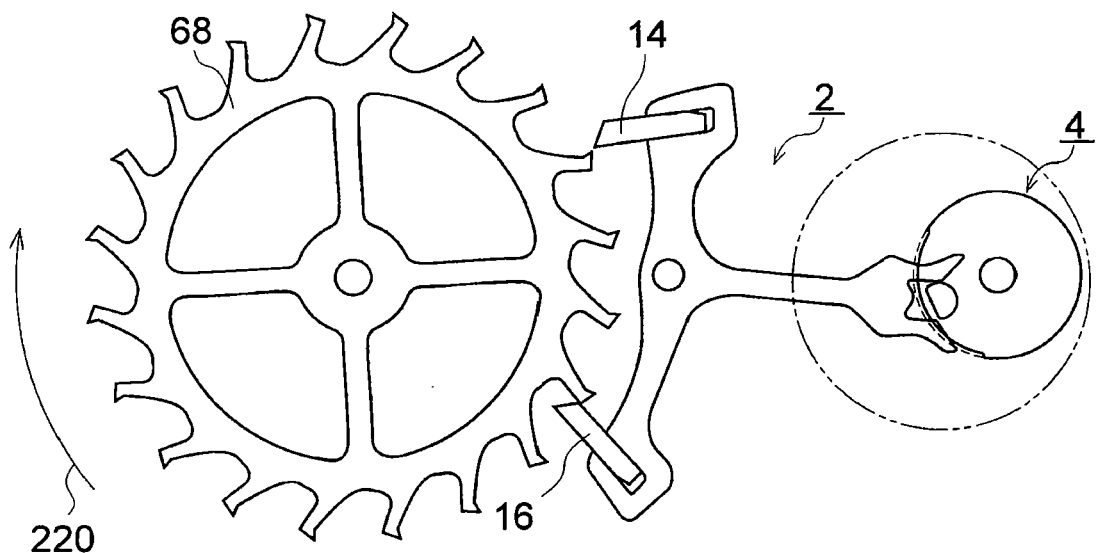
FIGS. 29A and 29B are principle diagrams illustrating the respective rotating motions of the roller, the pallet fork (complete), and the escape wheel of Embodiment 1 of the present invention.
Figure 29B:
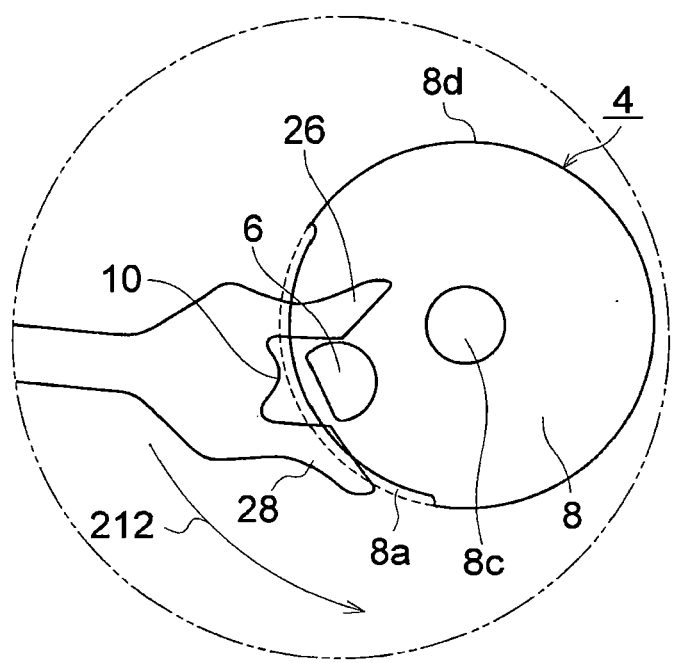

FIGS. 29A and 29B are diagrams illustrating the operation of the pallet fork (complete) 2 and the roller 4 subsequent to that shown in FIGS. 28A and 28B, showing the positions and rotating directions of the pallet fork (complete) 2 and the roller 4. FIG. 29A is a diagram showing the positions of the pallet fork (complete) 2, the roller 4, and the escape wheel 68, and FIG. 29B is an enlarged view of the positions of the pallet fork (complete) 2 and the roller 4 as shown in FIG. 29A. The roller 4 rotates in a roller rotating direction 212, and is detached from the entry horn 26 to start free oscillation. The escape wheel 68 rotates in an escape wheel rotating direction 220, and is detached from the entry pallet jewel 14 to collide with the exit pallet jewel 16, whereby it temporarily stops its rotation. At this time, the pallet fork (complete) 2 also temporarily stops its rotation. When the pallet fork (complete) 2 threatens to make erroneous rotation due to disturbance, the exit horn 28 collides with the impulse pin 6, so that rotation of the pallet fork (complete) 2 is prevented.

Figure 30A:
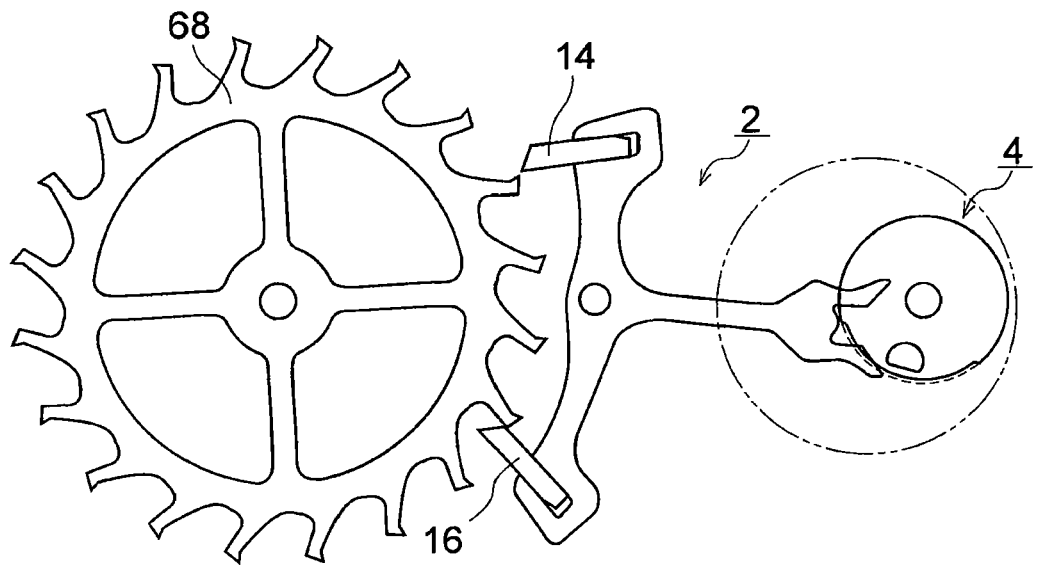
FIGS. 30A and 30B are principle diagrams illustrating the respective rotating motions of the roller, the pallet fork (complete), and the escape wheel of Embodiment 1 of the present invention.
Figure 30B:
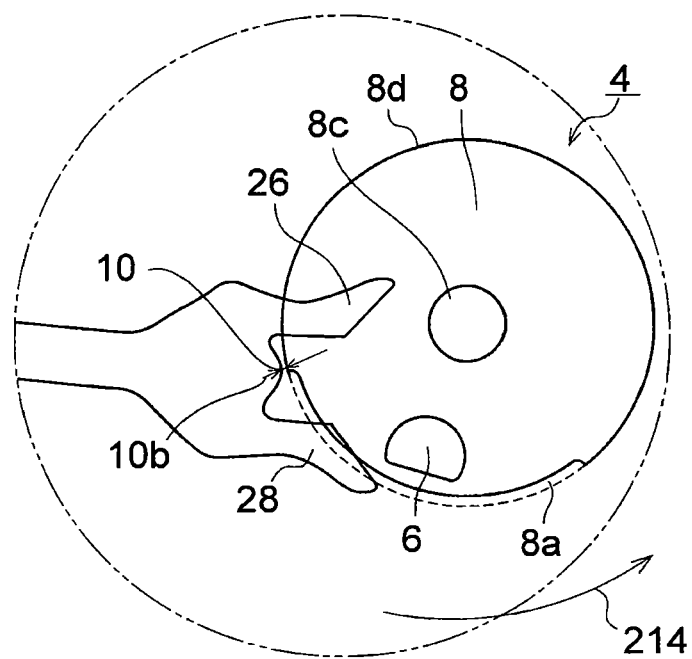

FIGS. 30A and 30B are diagrams illustrating the operation of the pallet fork (complete) 2 and the roller 4 subsequent to that shown in FIGS. 29A and 29B, showing the positions and rotating directions of the pallet fork (complete) 2 and the roller 4. FIG. 30A is a diagram showing the positions of the pallet fork (complete) 2, the roller 4, and the escape wheel 68, and FIG. 30B is an enlarged view of the positions of the pallet fork (complete) 2 and the roller 4 as shown in FIG. 30A. The roller 4 rotates in a roller rotating direction 214. When the impulse pin 6 is detached from the entry horn 26, the roller table side surface 8d is brought to a position where it is opposed to the safety pin 10. Since the safety pin space 10b exists between the safety pin 10 provided on the pallet fork (complete) 2 and the roller table side surface 8d, the safety pin 10 does not hinder the free oscillation of the roller 4. When the pallet fork (complete) 2 threatens to make an erroneous rotation due to disturbance, the safety pin 10 collides with the roller table side surface 8d, so that an erroneous rotation of the pallet fork (complete) 2 is prevented.

Figure 31A:
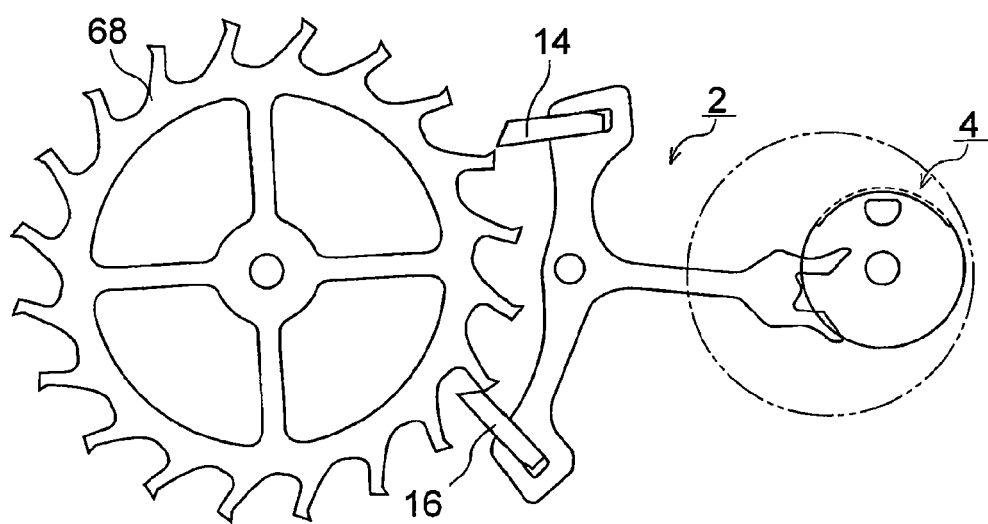
FIGS. 31A and 31B are principle diagrams illustrating the respective rotating motions of the roller, the pallet fork (complete), and the escape wheel of Embodiment 1 of the present invention.
Figure 31B:
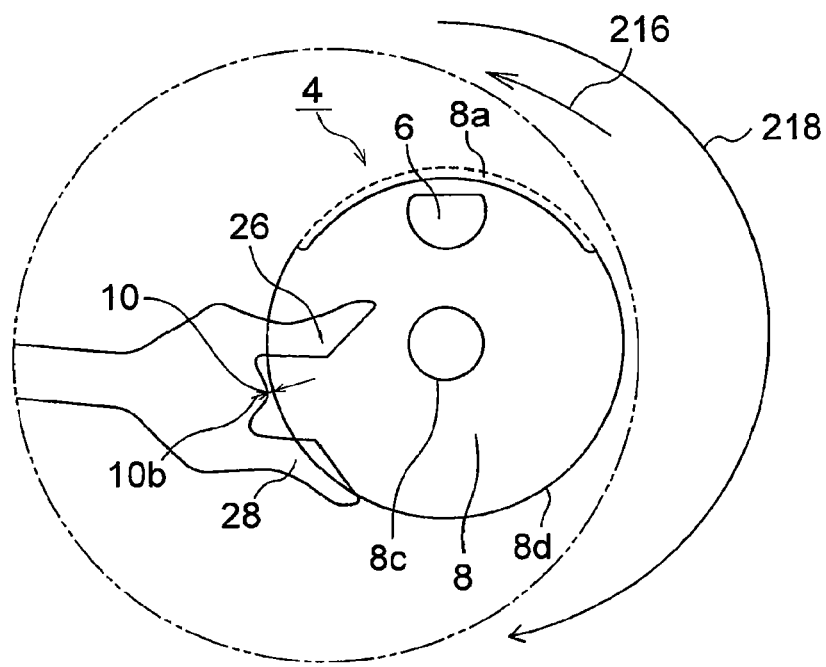

FIGS. 31A and 31B are diagrams illustrating the operation of the pallet fork (complete) 2 and the roller 4 subsequent to that shown in FIGS. 30A and 30B, showing the positions and rotating directions of the pallet fork (complete) 2 and the roller 4. FIG. 31A is a diagram showing the positions of the pallet fork (complete) 2, the roller 4, and the escape wheel 68, and FIG. 31B is an enlarged view of the positions of the pallet fork (complete) 2 and the roller 4 as shown in FIG. 31A. The roller 4 swings out in a roller rotating direction 216 through free oscillation, and, due to the elasticity of the hairspring attached to the balance with hairspring, changes its rotating direction to a roller rotating direction 218. At this time, due to the presence of the safety pin space 10b between the safety pin 10 provided on the pallet fork (complete) 2 and the roller table side surface 8d, the safety pin 10 does not hinder the rotation of the roller 4. When the pallet fork (complete) 2 threatens to rotate due to disturbance, the safety pin 10 collides with the roller table side surface 8d, and an erroneous rotation of the pallet fork (complete) 2 is prevented. Thus, it is possible to confirm that the safety pin 10 and the roller table 8 function properly, allowing the pallet fork (complete) 2 and the roller 4 of the present invention to operate in the normal fashion.

As described above, the mechanical watch provided with the pallet fork (complete) 2 and the roller 4 of the present invention functions in the normal fashion without being stopped owing to prevention of rotation of the roller 4 by the pallet fork (complete) 2.

Further, due to the configuration of the pallet fork (complete) 2 and the roller 4 described above, the pair of entry horn and exit horn 26, 28 and the safety pin 10 extend from the rotation axis of the pallet fork (complete) 2 toward the rotation axis of the balance with hairspring, and the roller table 8 opposed to these components are formed in a single layer, so that the thickness of the portion where the pallet fork (complete) 2 and the roller 4 are formed is reduced. Further, the safety pin 10 and the pallet fork (incomplete) 3 are in the same layer, and the safety pin 10 is shorter than the pair of entry horn and exit horn 26, 28, whereby it is possible to reduce the moment of inertia of the pallet fork (complete) 2. When the moment of inertia of the pallet fork (complete) 2 is reduced, the energy loss in the pallet fork (complete) 2 is reduced, resulting in an increase in the energy imparted to the balance with hairspring from the pallet fork (complete) 2, so that the oscillation angle of the balance with hairspring increases. Thus, by Airy's theorem, it is possible to improve the time measurement accuracy of the mechanical watch equipped with the pallet fork (complete) 2 and the roller 4 of the present invention. Further, the pallet fork (incomplete) 3 and the roller table 8 of the present invention are formed by electroforming and exhibit high accuracy in configuration, so that the safety pin space 10a, 10b easily allows adjustment or needs no adjustment at all. Thus, if no safety pin space adjustment is performed, it is possible to reduce the number of times that the safety pin 10 collides with the roller table 8 due to disturbance, making the balance with hairspring less subject to hindrance from free oscillation.

Further, in machining them, the roller table 8 and the pallet fork (incomplete) 3 of the present invention need no additional machining such as grinding, thus facilitating their machining and reducing the requisite time for machining, whereby it is possible to suppress an increase in cost. Further, there is no fear of a machining error or deformation due to such an additional machining. Further, since the pallet fork (incomplete) 3 and the safety pin 10 are formed integrally, there is no need to perform assembly operation as in the case in which they are formed separately, thus making it possible to reduce the requisite time for assembly and to suppress an increase in cost. Further, there is no fear of an assembly error.

Further, since the thickness of the portion where the pallet fork (complete) 2 and the roller 4 are formed can be reduced, it is possible to utilize the resultant surplus space as a space for some other mechanism, or to increase the thickness of the main plate to enhance the strength thereof.

Embodiment 2

Figure 32:
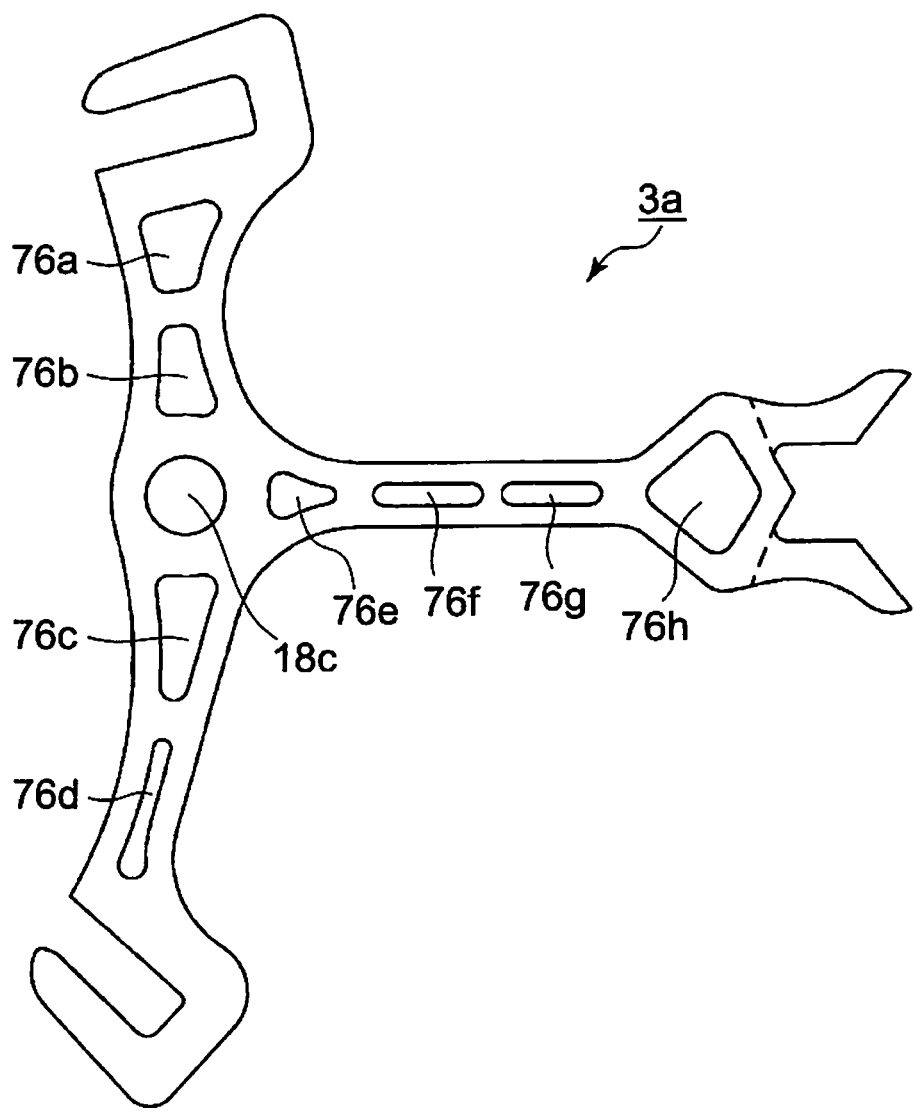
FIG. 32 is a diagram for illustrating the configuration of a pallet fork (incomplete) according to Embodiment 2 of the present invention.

FIG. 32 is a plan view illustrating a pallet fork (incomplete) 3a according to Embodiment 2 of the present invention. The portions of the pallet fork (incomplete) 3a that are the same as those of the pallet fork (incomplete) 3 of Embodiment 1 are to be indicated by the same reference numerals, so such reference numerals are omitted. The following description will center on the differences in configuration between the pallet fork (incomplete) 3a and the pallet fork (incomplete) 3 of Embodiment 1 of the present invention.

In the pallet fork (incomplete) 3a, the entry arm 20, the exit arm 22, and the lever 24 of the pallet fork (incomplete) 3 are provided with through-holes, such as holes 76a, 76b, 76c, 76d, 76e, 76f, 76g, and 76h. It does not necessarily mean that all of the entry arm 20, the exit arm 22, and the lever 24 of the pallet fork (incomplete) 3 are provided with a plurality of through-holes; the number and configuration of through-holes may be determined as appropriate. By adopting the configuration of the pallet fork (incomplete) 3a, it is possible to further reduce the moment of inertia of the pallet fork (incomplete) 3.

As described above, in the pallet fork (incomplete) 3a of Embodiment 2 of the present invention, one or more through-holes are provided therein, whereby, in addition to the effects as mentioned with reference to Embodiment 1, it is possible to further reduce the moment of inertia of the pallet fork (incomplete) 3a. When the moment of inertia of the pallet fork (incomplete) 3a is reduced, the energy consumption at the time of operation of the pallet fork (complete) 2 is reduced. Thus, in the mechanical watch equipped with the pallet fork (incomplete) 3a, the energy imparted to the balance with hairspring increases, and the oscillation angle of the balance with hairspring increases, so that the time measurement accuracy is improved by Airy's theorem.

Embodiment 3

Figure 33:
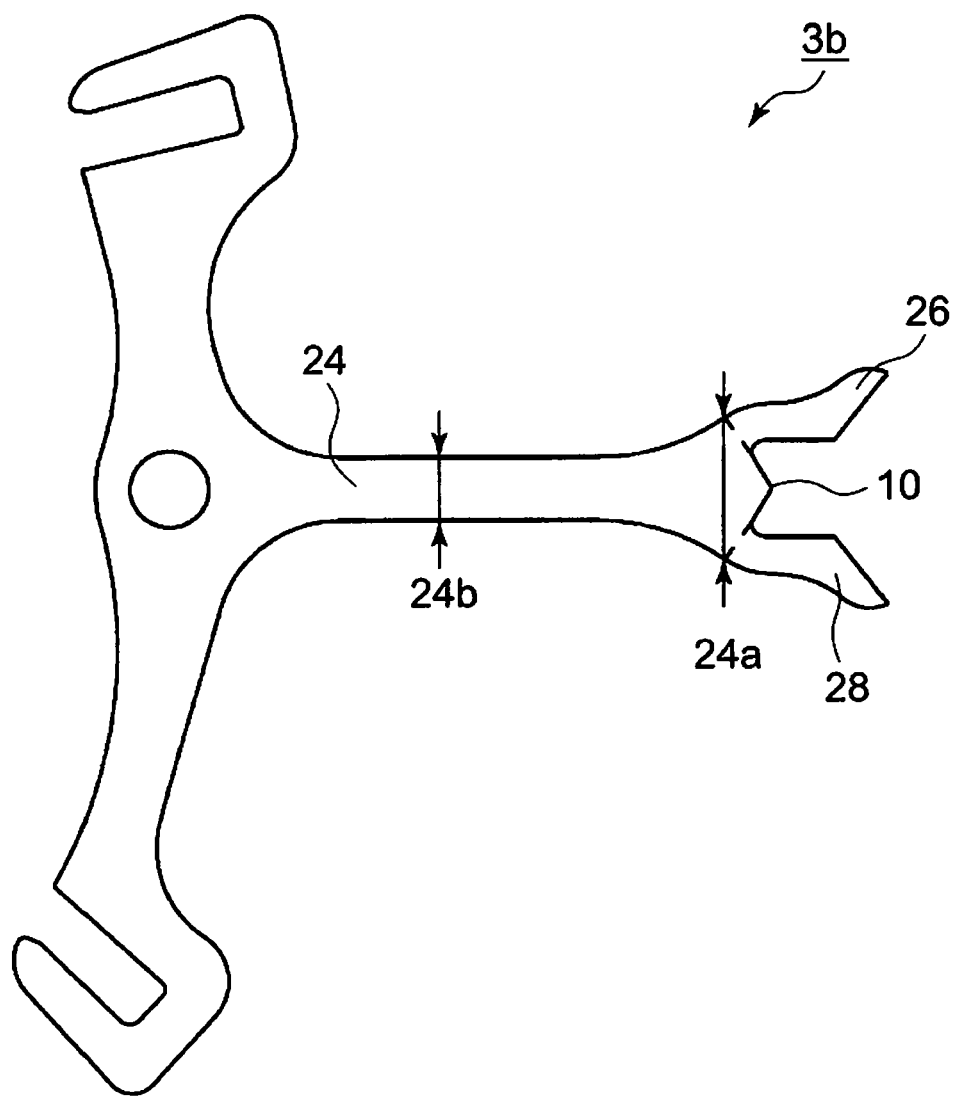
FIG. 33 is a diagram for illustrating the configuration of a pallet fork (incomplete) according to Embodiment 3 of the present invention.

FIG. 33 is a plan view illustrating a pallet fork (incomplete) 3b according to Embodiment 3 of the present invention. The portions of the pallet fork (incomplete) 3b that are the same as those of the pallet fork (incomplete) 3 of Embodiment 1 are to be indicated by the same reference numerals, so such reference numerals are omitted. The following description will center on the differences in configuration between the pallet fork (incomplete) 3b and the pallet fork (incomplete) 3 of Embodiment 1 of the present invention.

In the pallet fork (incomplete) 3b, of both end portions of the lever 24 of the pallet fork (incomplete) 3, the end portion near the safety pin 10 and the pair of entry horn and exit horn 26, 28 has a width 24a which is, for example, not less than 1 time and not more than 2.5 times the width 24b of an intermediate portion between both end portions of lever 24. Since the safety pin 10 is not forced into it, the pallet fork (incomplete) 3 does not need a hole into which the safety pin 10 is forced. Since there is no need for a hole into which the safety pin 10 is to be forced, the pallet fork (incomplete) 3b can be formed in a configuration in which the width 24a of the end portion of the lever 24 near the safety pin 10 and the pair of entry horn and exit horn 26, 28 is so much the smaller. Since the width 24a of the end portion of the lever 24 can be reduced, it is possible to further reduce the moment of inertia of the pallet fork (incomplete) 3.

As described above, in the pallet fork 3b of Embodiment 3 of the present invention, the width 24a of the end portion of the lever 24 is, for example, not less than 1 time and not more than 2.5 times the width 24b of the intermediate portion between both end portions of the lever 24, whereby, in addition to the above-mentioned effects of Embodiment 1, it is possible to further reduce the moment of inertia of the pallet fork (incomplete) 3b. When the moment of inertia of the pallet fork (incomplete) 3b is reduced, the energy consumption at the time of the operation of the pallet fork (complete) 2 is reduced. Thus, in the mechanical watch equipped with the pallet fork (incomplete) 3b, the energy imparted to the balance with hairspring increases, and the oscillation angle of the balance with hairspring increases, so that the time measurement accuracy is improved by Airy's theorem.

Embodiment 4

Figure 34A:
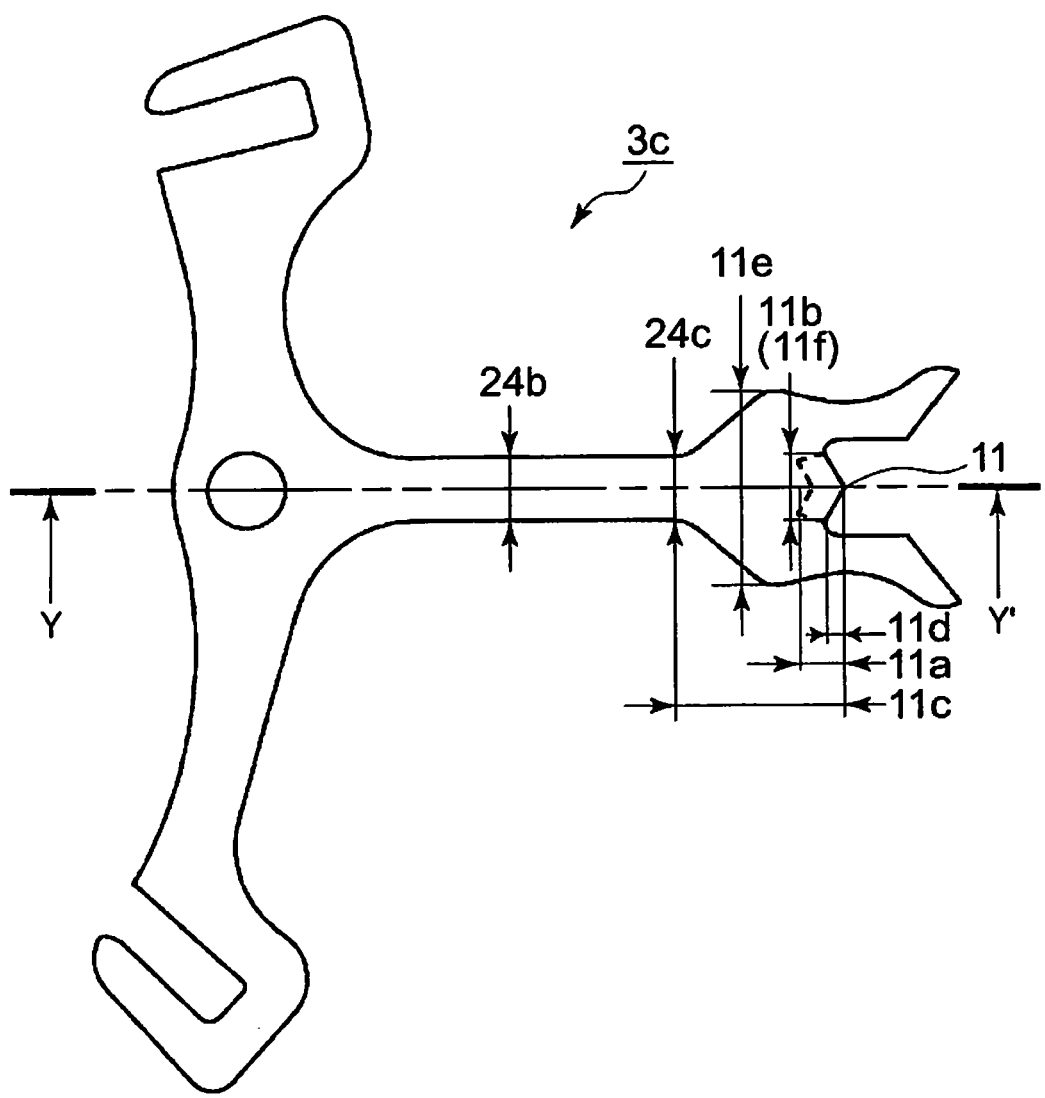
FIGS. 34A and 34B are diagrams for illustrating the configuration of a pallet fork (incomplete) according to Embodiment 4 of the present invention.
Figure 34B:
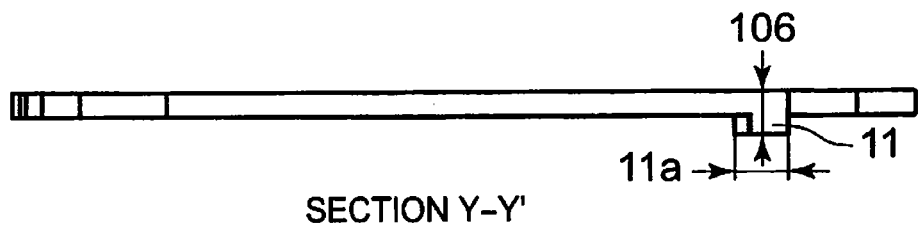

FIGS. 34A and 34B are diagrams illustrating a pallet fork (incomplete) 3c according to Embodiment 4 of the present invention. FIG. 34A is a plan view of the pallet fork (incomplete) 3c, and FIG. 34B is a sectional view of the pallet fork (incomplete) 3c. The portions of the pallet fork (incomplete) 3c that are the same as those of the pallet fork (incomplete) 3 of Embodiment 1 are to be indicated by the same reference numerals, so such reference numerals are omitted. The following description will center on the differences in configuration between the pallet fork (incomplete) 3c and the pallet fork (incomplete) 3 of Embodiment 1 of the present invention.

In the pallet fork (incomplete) 3c, the thickness of the safety pin 10 of the pallet fork (incomplete) 3 is maintained, and the thickness of the portion thereof other than the safety pin 10 is smaller than the thickness of the safety pin 10. Due to the configuration of the pallet fork (incomplete) 3c, it is possible to reduce the moment of inertia of the pallet fork (incomplete) 3c while maintaining the function of the safety pin 11. Due to the configuration of the pallet fork (incomplete) 3c, it is possible to further reduce the moment of inertia of the pallet fork (incomplete) 3.

More specifically, the configuration of the safety pin 11 is such that the safety pin 11 has a thickness 106 which is equal to the thickness 106 of the safety pin 10 of the pallet fork (incomplete) 3. At the maximum, the length 11a of the safety pin 11 is equal to or smaller than the length 11c as measured from the position of a width 24c where the width 24b of the lever 24 starts to increase toward the end of the lever where the safety pin 11 is provided to the distal end of the safety pin 11; and, at the minimum, it is equal to or smaller than the length 11d as measured from the proximal end position of the safety pin 11 at the end of the lever 24 to the distal end of the safety pin 11. Further, at the maximum, the width 11b of the safety pin 11 is equal to or smaller than the maximum width 11e of the end portion of the lever 24 where the safety pin 11 is provided; and, at the minimum, it is equal to or larger than the width 11f of the proximal end portion of the safety pin 11 at the end of the lever 24.

As described above, in the pallet fork 3c of Embodiment 4 of the present invention, the thickness of the safety pin 10 of the pallet fork (incomplete) 3 is maintained, and the thickness of the portion thereof other than the safety pin 10 is smaller than the thickness of the safety pin 10, whereby, in addition to the above-mentioned effects of Embodiment 1, it is possible to further reduce the moment of inertia of the pallet fork (incomplete) 3c. When the moment of inertia of the pallet fork (incomplete) 3c is reduced, the energy consumption at the time of the operation of the pallet fork (complete) 2 is reduced. Thus, in the mechanical watch equipped with the pallet fork 3c, the energy imparted to the balance with hairspring increases, and the oscillation angle of the balance with hairspring increases, so that the time measurement accuracy is improved by Airy's theorem.

Figure 35A:
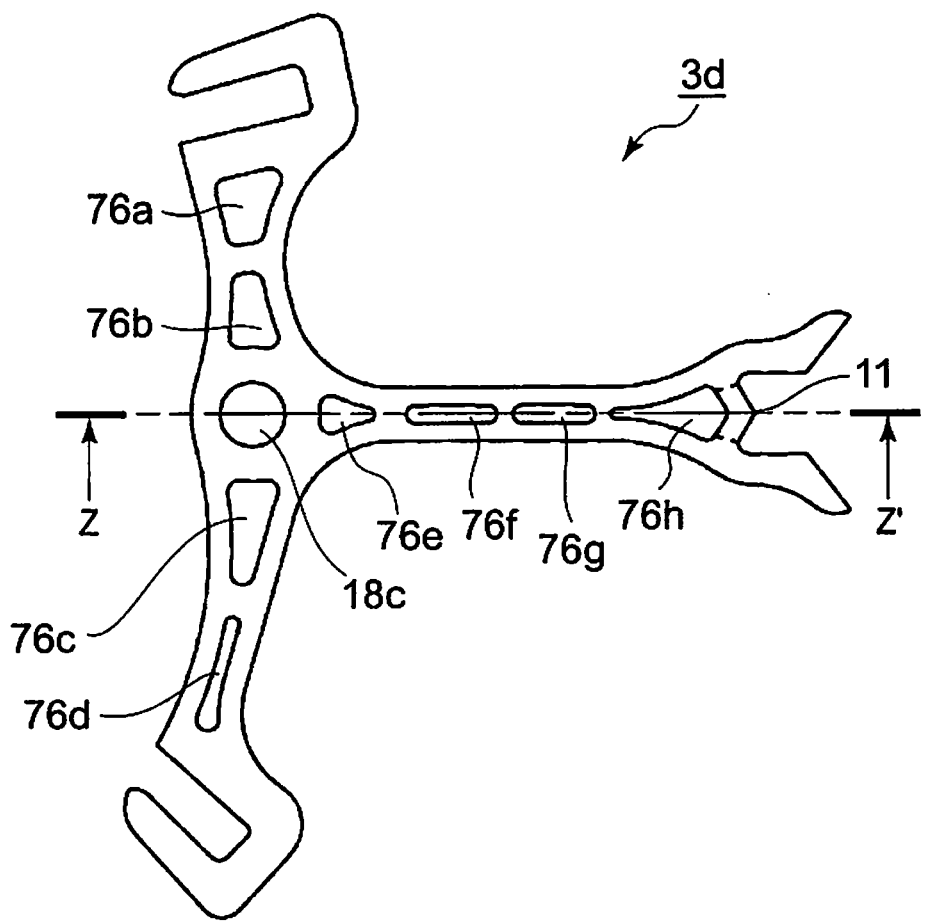
FIGS. 35A and 35B are diagrams for illustrating the configuration of a pallet fork (incomplete) according to Embodiment 1, 2, 3, 4 of the present invention.
Figure 35B:
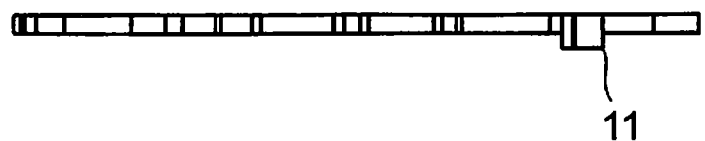

FIGS. 35A and 35B are diagrams illustrating a pallet fork (incomplete) 3d endowed with a configuration obtained through a combination of Embodiments 2, 3, and 4 of the present invention. FIG. 35A is a plan view of the pallet fork (incomplete) 3d, and FIG. 35B is a sectional view of the pallet fork (incomplete) 3d. The portions of the pallet fork (incomplete) 3d that are the same as those of the pallet fork (incomplete) 3 of Embodiment 1 are to be indicated by the same reference numerals, so such reference numerals are omitted. The following description will center on the differences in configuration between the pallet fork (incomplete) 3d and the pallet fork (incomplete) 3 of Embodiment 1 of the present invention.

The pallet fork (incomplete) 3d is endowed with a configuration obtained through a combination of Embodiments 2, 3, and 4 of the present invention. Embodiments 2, 3, and 4 of the present invention respectively provide pallet forks (incomplete) 3a, 3b, and 3c of a reduced moment of inertia. Thus, by adopting the pallet fork (incomplete) 3d of a configuration obtained through a combination of the features of the pallet forks (incomplete) 3a, 3b, and 3c of a reduced moment of inertia, it is possible to provide a pallet fork (incomplete) 3d of a further reduced moment of inertia. When the moment of inertia of the pallet fork (incomplete) 3d is reduced, the energy consumption at the time of operation of the pallet fork (complete) 2 is reduced. Thus, the energy imparted to the balance with hairspring increases, so that the oscillation angle of the balance with hairspring increases, with the result that the time measurement accuracy is improved by Airy's theorem.

Embodiment 5

Figure 36A:
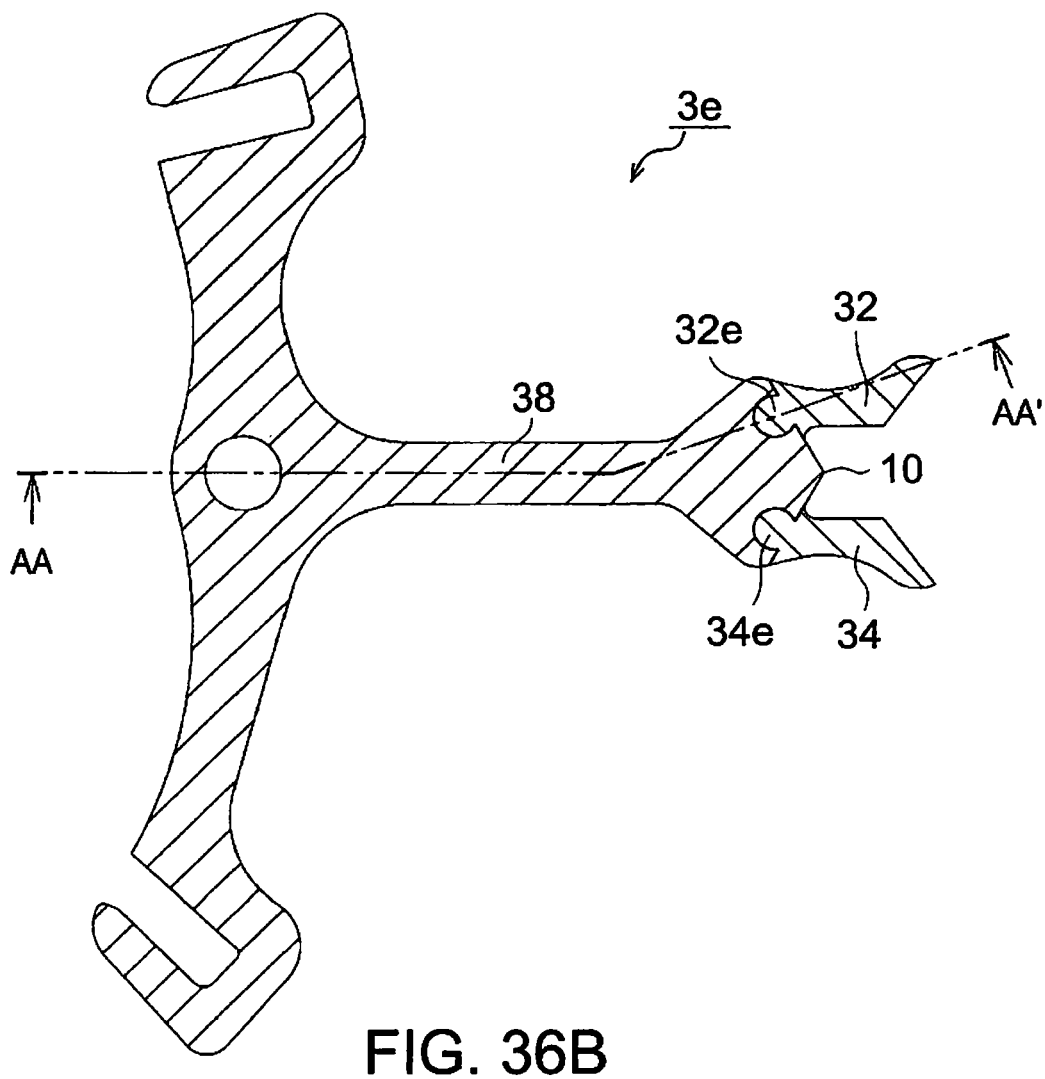
FIGS. 36A and 36B are first diagrams for illustrating the configuration of a pallet fork (incomplete) according to Embodiment 5 of the present invention.
Figure 36B:
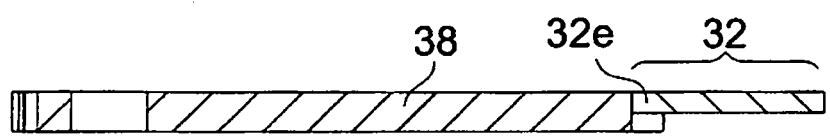

FIGS. 36A and 36B are diagrams illustrating a pallet fork (incomplete) 3e according to Embodiment 5 of the present invention. FIG. 36A is a plan view of the pallet fork (incomplete) 3e. FIG. 36B is a sectional view taken along the line AA-AA' of FIG. 36A. The portions of the pallet fork (incomplete) 3e that are the same as those of the pallet fork (incomplete) 3 of Embodiment 1 are to be indicated by the same reference numerals, so such reference numerals are omitted. The following description will center on the differences in configuration between the pallet fork (incomplete) 3e and the pallet fork (incomplete) 3 of Embodiment 1 of the present invention.

In the pallet fork (incomplete) 3e, the pair of entry horn and exit horn 26, 28 that are formed of the same material as the pallet fork (incomplete) 3 are replaced by a pair of entry horn and exit horn 32, 34 that are formed of a material of a density lower than that of the pallet fork (incomplete) 3. The pallet fork (incomplete) 3e is formed by forming a pallet fork (incomplete) body portion 38 by electroforming, and then connecting the pair of entry horn and exit horn 32, 34 thereto. The connection may be effected, for example, through fixation by fit-engagement or swaging, or through fixation by an adhesive such as a thermoplastic resin. It is desirable for the horn connection portions 32e, 34e and the portions of the pallet fork (incomplete) body portion 38 to which the horn connection portions 32e, 34e are connected to be of a configuration little subject to generation of detachment, deviation, etc. after the connection. The pair of entry horn and exit horn 32, 34 are formed of a material of a density lower than that of nickel, nickel-tungsten alloy, or nickel-phosphorus alloy of which the pallet fork (incomplete) 3 is formed; examples of the material include ruby and a ceramic material such as zirconia. By forming the pair of entry horn and exit horn 32, 34 of a material of a density lower than that of nickel, nickel-tungsten alloy, or nickel-phosphorus alloy, it is possible to reduce the moment of inertia of the pallet fork (incomplete) 3. Further, when the pair of entry horn and exit horn 32, 34 are formed of ruby or a ceramic material such as zirconia, the pair of entry horn and exit horn 32, 34 exhibit a higher hardness and a smaller degree of wear than the pallet fork (incomplete) body portion 38; further, since they exhibit a lower friction coefficient, the pair of entry horn and exit horn 32, 34 undergo a smaller degree of change in configuration or dimensions with passage of time, and the friction loss at the time of collision with the impulse pin 6 is advantageously reduced.

Figure 37A:
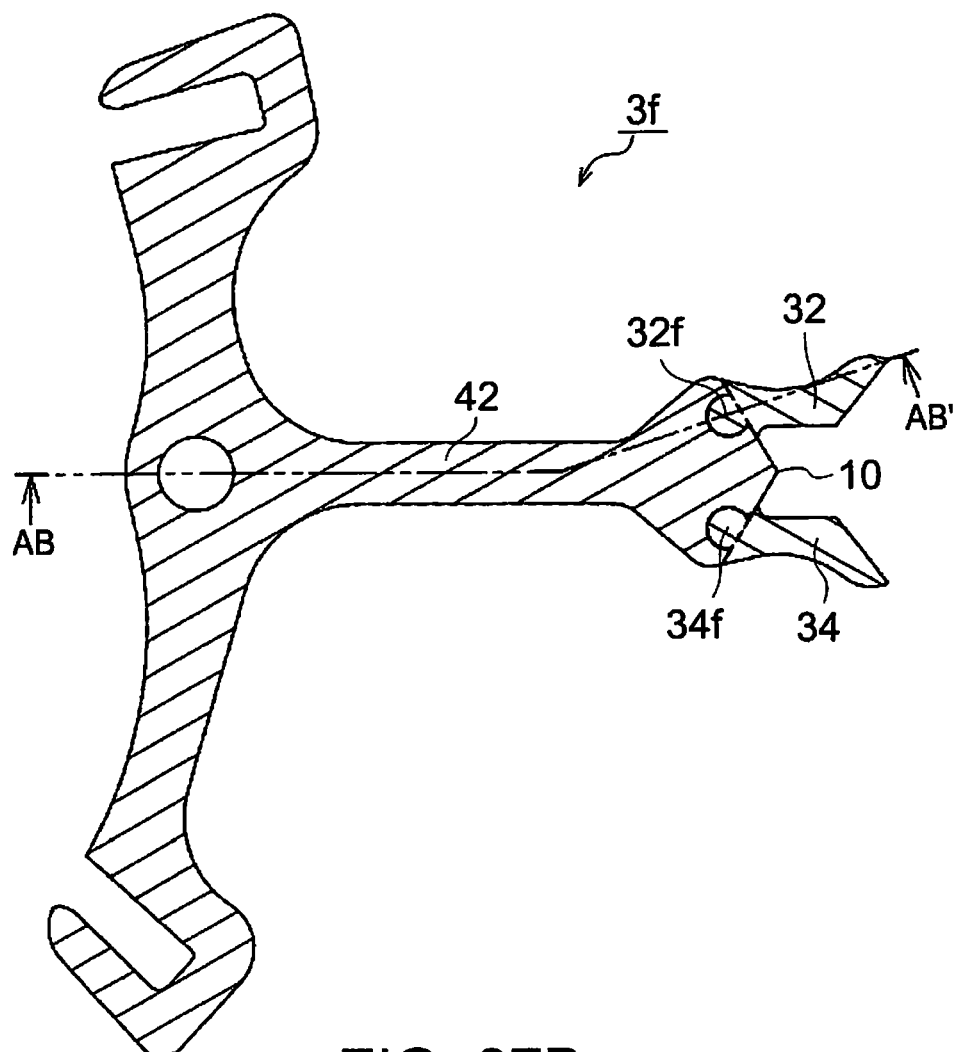
FIGS. 37A and 37B are second diagrams for illustrating the configuration of the pallet fork (incomplete) of Embodiment 5 of the present invention.
Figure 37B:
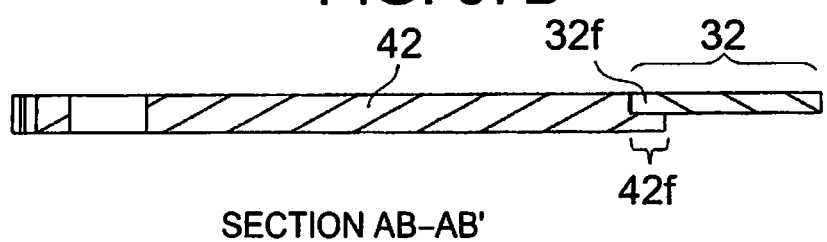

FIGS. 37A and 37B are diagrams illustrating a pallet fork (incomplete) 3f according to Embodiment 5 of the present invention. FIG. 37A is a plan view of the pallet fork (incomplete) 3f. FIG. 37B is a sectional view taken along the line AB-AB' of FIG. 37A. The pallet fork (incomplete) 3f differs from the pallet fork (incomplete) 3e in that an abutment member 42f is provided on a pallet fork (incomplete) body portion 42 of the pallet fork (incomplete) 3f. The pair of entry horn and exit horn 32, 34 abut the abutment member 42f, whereby the positions of the pair of entry horn and exit horn 32, 34 are regulated. Thus, it is possible to enhance the relative positional accuracy of the pair of entry horn and exit horn 32, 34 with respect to the pallet fork (incomplete) body portion 42.

Figure 38A:
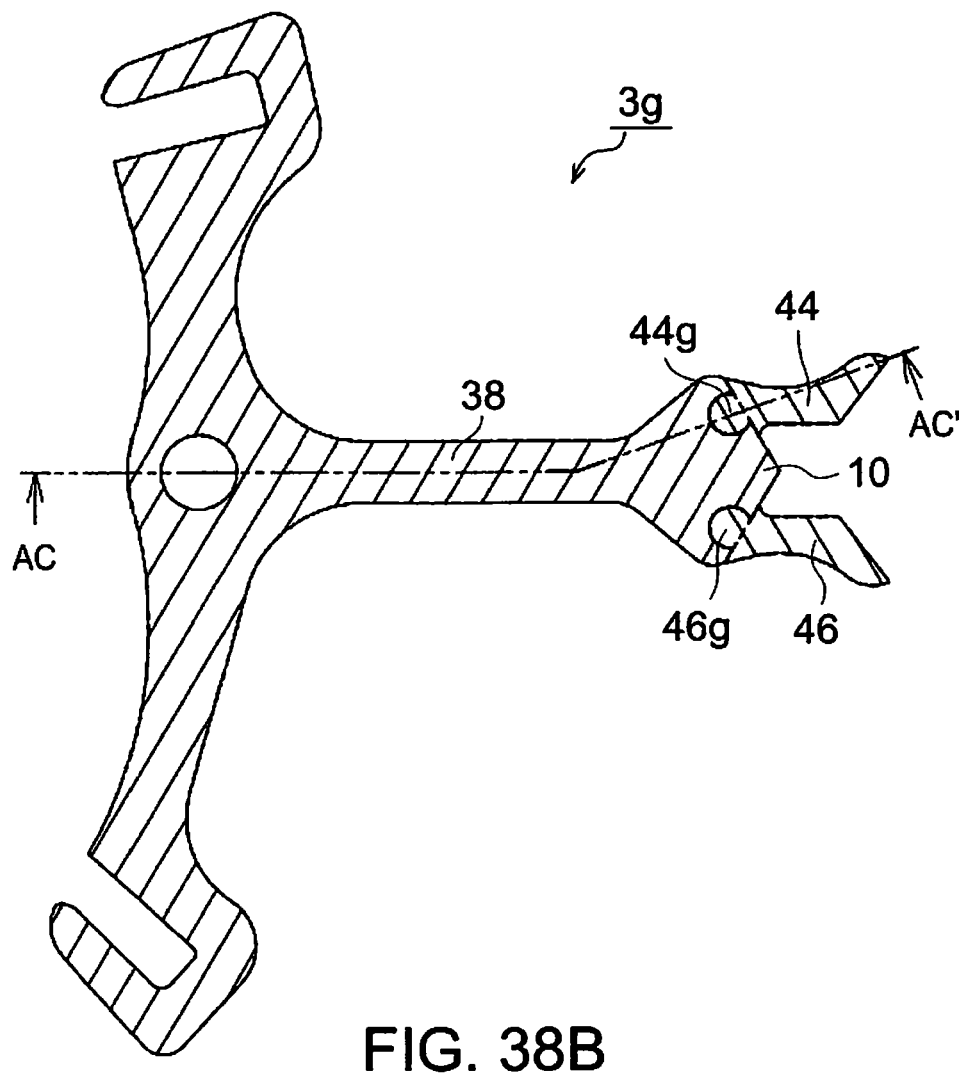
FIGS. 38A and 38B are third diagrams for illustrating the configuration of the pallet fork (incomplete) of Embodiment 5 of the present invention.
Figure 38B:
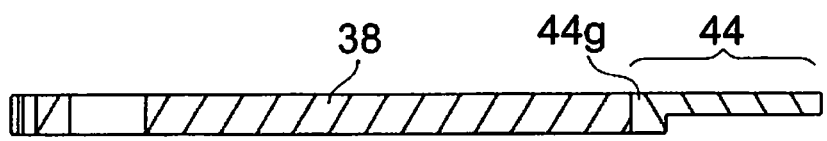

FIGS. 38A and 38B are diagrams illustrating a pallet fork (incomplete) 3g according to Embodiment 5 of the present invention. FIG. 38A is a plan view of the pallet fork (incomplete) 3g. FIG. 38B is a sectional view taken along the line AC-AC' of FIG. 38A. The pallet fork (incomplete) 3g differs from the pallet fork (incomplete) 3e in that the size of connection portions 44g, 46g of a pair of entry horn and exit horn 44, 46 is larger in the thickness direction of the pallet fork (incomplete) body portion 38 than the size of the connection portions 32e, 34e of the pair of entry horn and exit horn 32, 34. By adopting the configuration of the connection portions 44g, 46g, it is possible for the pallet fork (incomplete) body portion 38 to retain the pair of entry horn and exit horn 44, 46 with a larger area, so that the retention force is increased, and the positional deviation expected to be generated with passage of time during the operation of the pair of entry horn and exit horn 44, 46 can be diminished.

As described above, the pallet fork (incomplete) 3e of Embodiment 5 of the present invention provides the effects as mentioned with reference to Embodiment 1. Further, in the pallet fork (incomplete) 3e, the pair of entry horn and exit horn 26, 28 formed of the same material as the pallet fork (incomplete) 3 may be replaced by the pair of entry horn and exit horn 32, 34 formed of a material of a lower density than that of the pallet fork (incomplete) 3. This makes it possible to further reduce the moment of inertia of the pallet fork (incomplete) 3. In the case in which the pair of entry horn and exit horn 32, 34 are formed of ruby or a ceramic material such as zirconia, the pair of entry horn and exit horn 32, 34 exhibit a higher hardness and a smaller degree of wear, and further, a lower friction coefficient than the pallet fork (incomplete) body portion 38. Thus, the pair of entry horn and exit horn 32, 34 undergo a smaller degree of change in configuration or dimensions, and the friction loss at the time of collision with the impulse pin 6 is reduced. When the moment of inertia of the pallet fork (incomplete) 3 is reduced, and the friction loss at the time of collision with the impulse pin 6 is reduced, the energy consumption at the time of operation of the pallet fork (complete) 2 is reduced. Thus, in the mechanical watch equipped with the pallet fork (incomplete) 3e, the energy imparted to the balance with hairspring 516 increases, and the oscillation angle of the balance with hairspring 516 increases. Thus, the time measurement accuracy is improved by Airy's theorem.

Further, since the pair of entry horn and exit horn 32, 34 undergo a smaller degree of change in configuration or dimensions with passage of time, the fluctuation in transmission energy due to the change in configuration or dimensions is also reduced. Thus, in the mechanical watch equipped with the pallet fork (incomplete) 3e, the energy transmitted to the balance with hairspring 516 is stabilized, and the oscillation angle of the balance with hairspring 516 is stabilized. Thus, the frequency of the balance with hairspring 516 is stabilized, whereby the time measurement accuracy is improved.

Further, due to the contrivances in the configurations of the pallet fork (incomplete) body portion 38 and the pair of entry horn and exit horn 32, 34 as in the case of the pallet forks (incomplete) 3f, 3g, the relative positional accuracy of the pair of entry horn and exit horn 32, 34 with respect to the pallet fork (incomplete) body portion 38 is enhanced. Thus, in the mechanical watch equipped with the pallet fork (incomplete) 3f or 3g, the energy transmitted to the balance with hairspring is stabilized, and the oscillation angle of the balance with hairspring is stabilized, so that the frequency of the balance with hairspring is stabilized, whereby the time measurement accuracy is improved.

Embodiment 6

Figure 39A:
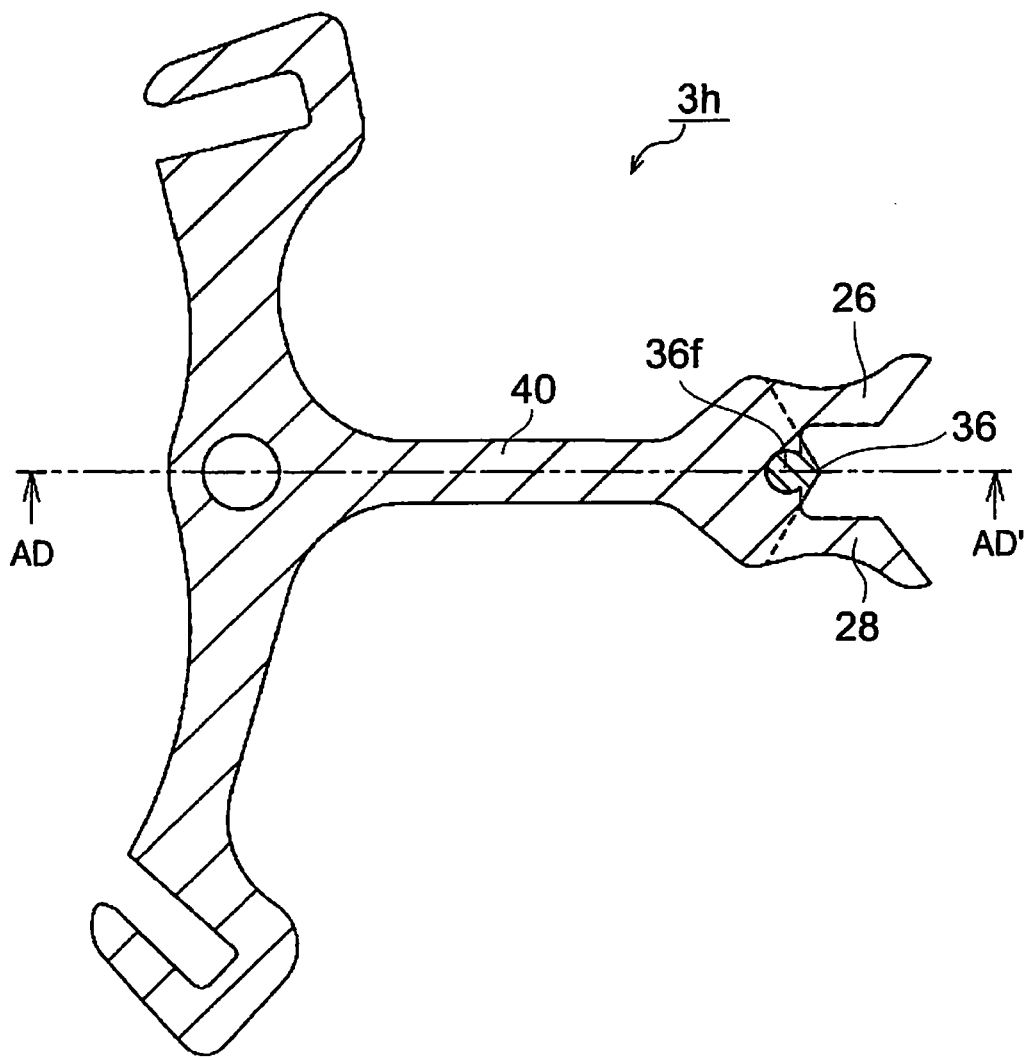
FIGS. 39A and 39B are first diagrams for illustrating the configuration of a pallet fork (incomplete) according to Embodiment 6 of the present invention.
Figure 39B:
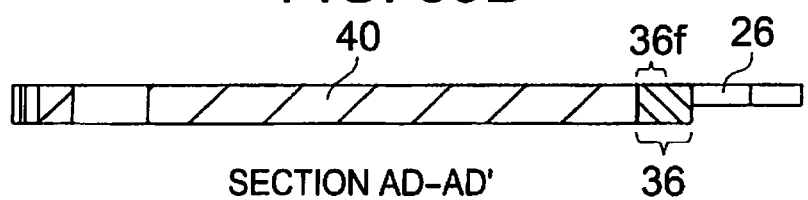

FIGS. 39A and 39B are diagrams illustrating a pallet fork (incomplete) 3h according to Embodiment 6 of the present invention. FIG. 39A is a plan view of the pallet fork (incomplete) 3h, and FIG. 39B is a sectional view of the pallet fork (incomplete) 3h taken along the line AD-AD' of FIG. 39A. The portions of the pallet fork (incomplete) 3h that are the same as those of the pallet fork (incomplete) 3 of Embodiment 1 are to be indicated by the same reference numerals, so such reference numerals are omitted. The following description will center on the differences in configuration between the pallet fork (incomplete) 3h and the pallet fork (incomplete) 3 of Embodiment 1 of the present invention.

In the pallet fork (incomplete) 3h, the safety pin 10 formed of the same material as the pallet fork (incomplete) 3 is replaced by a safety pin 36 formed of a material of a density lower than that of the pallet fork (incomplete) 3. The pallet fork (incomplete) 3h is formed by forming a pallet fork (incomplete) body portion 40 by electroforming, and then connecting the safety pin 36 thereto. The connection may be effected, for example, through fixation by fit-engagement or swaging, or through fixation by an adhesive such as a thermoplastic resin. It is desirable for the safety pin 36f and the portion of the pallet fork (incomplete) body portion 40 to which the safety pin 36 is connected to be of a configuration little subject to generation of detachment, deviation, etc. after the connection. The safety pin 36 is formed of a material of a density lower than that of nickel, nickel-tungsten alloy, or nickel-phosphorus alloy of which the pallet fork (incomplete) 3 is formed; examples of the material include ruby and a ceramic material such as zirconia. By forming the safety pin 36 of a material of a density lower than that of nickel, nickel-tungsten alloy, or nickel-phosphorus alloy, it is possible to reduce the moment of inertia of the pallet fork (incomplete) 3. Further, when the safety pin 36 is formed of ruby or a ceramic material such as zirconia, the safety pin 36 exhibits a higher hardness and a smaller degree of wear and, further, a lower friction coefficient than the pallet fork (incomplete) body portion 40; further, since it exhibits a lower friction coefficient, the safety pin 36 undergoes a smaller degree of change in configuration or dimensions with passage of time, and the friction loss at the time of collision with the tube side surface 8d is advantageously reduced.

Figure 40A:
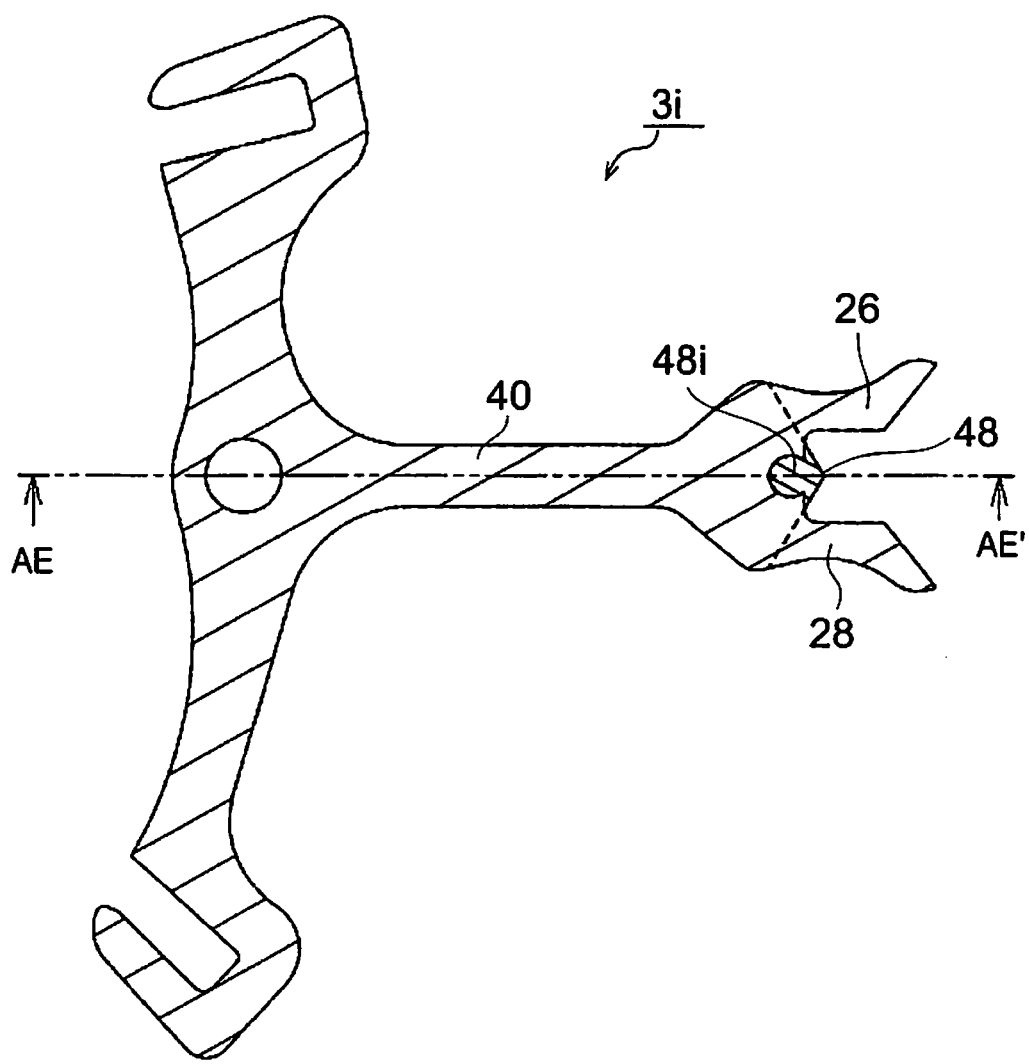
FIGS. 40A and 40B are second diagrams for illustrating the configuration of the pallet fork (incomplete) of Embodiment 6 of the present invention.
Figure 40B:
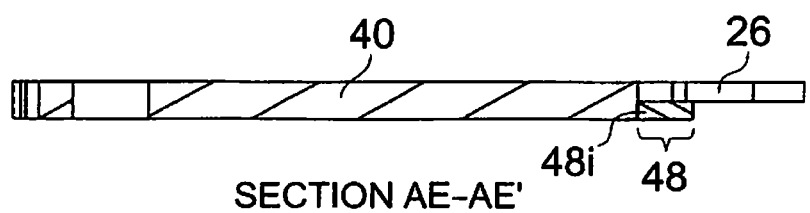

FIGS. 40A and 40B are diagrams illustrating a pallet fork (incomplete) 3i according to Embodiment 6 of the present invention. FIG. 40A is a plan view of the pallet fork (incomplete) 3i. FIG. 40B is a sectional view taken along the line AE-AE' of FIG. 40A. The pallet fork (incomplete) 3i differs from the pallet fork (incomplete) 3h in that the configuration of the safety pin 36 of the pallet fork (incomplete) 3i is changed to that of a safety pin 48 which is reduced in size in the thickness direction of the pallet fork (incomplete) body portion 40, thereby achieving a reduction in size and weight. The portion of the safety pin 36 serving to prevent malfunction of the pallet fork (complete) 2 is a portion corresponding to the safety pin 48 belonging to a layer different from that of the pair of entry horn and exit horn 26, 28. Thus, it is possible to reduce the moment of inertia of the pallet fork (complete) 2 while maintaining the function to prevent malfunction of the pallet fork (complete) 2.

Figure 41A:
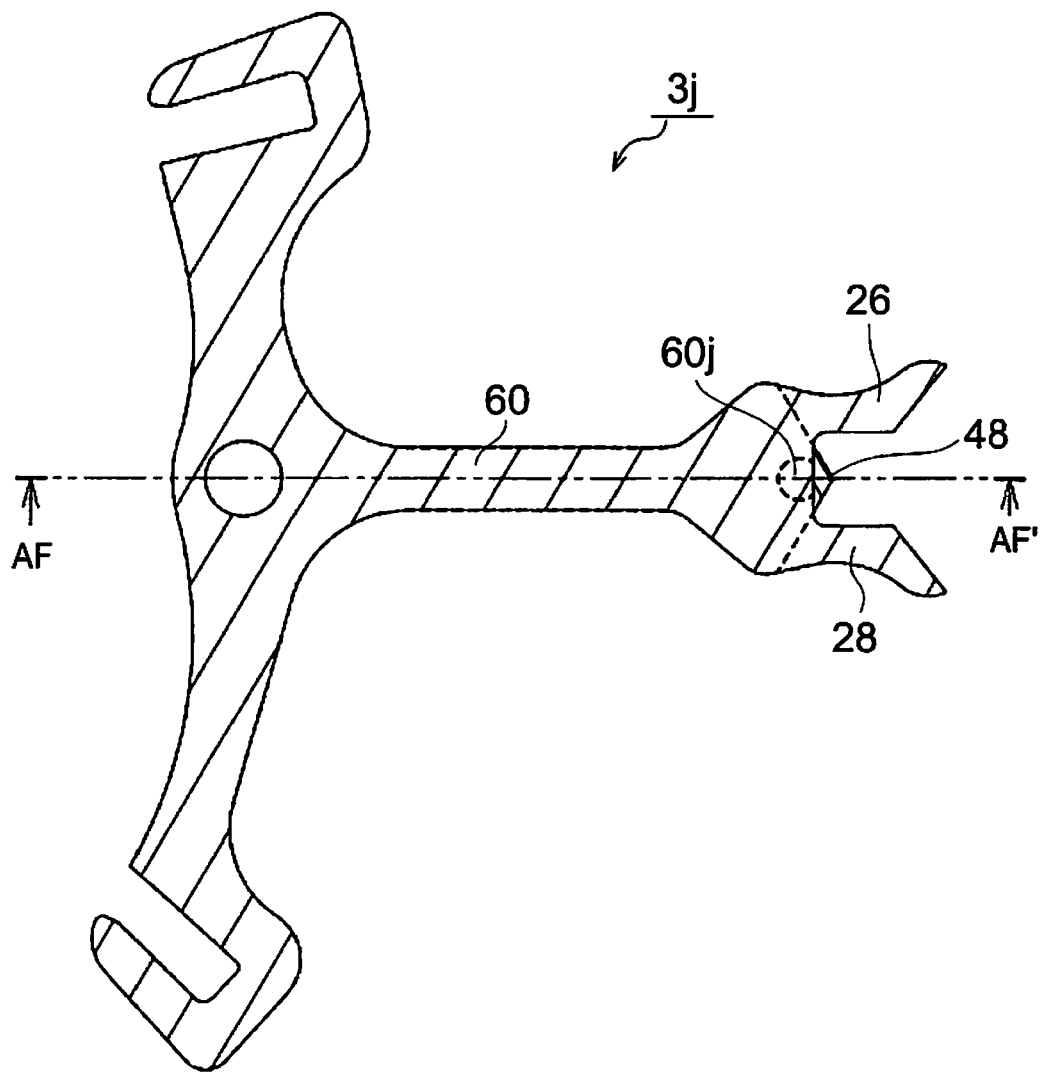
FIGS. 41A and 41B are third diagrams for illustrating the configuration of the pallet fork (incomplete) of Embodiment 6 of the present invention.
Figure 41B:
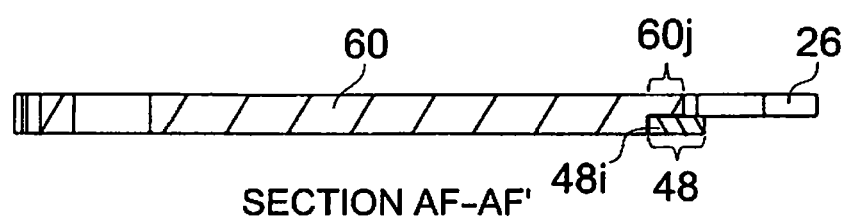

FIGS. 41A and 41B are diagrams illustrating a pallet fork (incomplete) 3j according to Embodiment 5 of the present invention. FIG. 41A is a plan view of the pallet fork (incomplete) 3j. FIG. 41B is a sectional view taken along the line AF-AF' of FIG. 41A. The pallet fork (incomplete) 3j differs from the pallet fork (incomplete) 3h in that an abutment member 60j is provided on a pallet fork (incomplete) body portion 60 of the pallet fork (incomplete) 3j. The safety pin 48 abuts the abutment member 60j, whereby the position of the safety pin 48 is regulated. Thus, it is possible to enhance the relative positional accuracy of the safety pin 48 with respect to the pallet fork (incomplete) body portion 60.

As described above, the pallet fork (incomplete) 3h of Embodiment 6 of the present invention provides the effects as mentioned with reference to Embodiment 1. Further, in the pallet fork (incomplete) 3h, the safety pin 10 formed of the same material as the pallet fork (incomplete) 3 may be replaced by the safety pin 36 formed of a material of a lower density than that of the pallet fork (incomplete) 3. This makes it possible to further reduce the moment of inertia of the pallet fork (incomplete) 3. In the case in which the safety pin 36 is formed of ruby or a ceramic material such as zirconia, the safety pin 36 exhibits a higher hardness and a smaller degree of wear, and further, a lower friction coefficient. Thus, the safety pin 36 undergoes a smaller degree of change in configuration or dimensions, and the friction loss at the time of collision with the roller table side surface 8d is reduced. When the moment of inertia of the pallet fork (incomplete) 3 is reduced, and the friction loss at the time of collision with the roller table side surface 8d is reduced, the energy consumption at the time of operation of the pallet fork (complete) 2 is reduced. Thus, in the mechanical watch equipped with the pallet fork (incomplete) 3h, the energy imparted to the balance with hairspring increases, and the oscillation angle of the balance with hairspring increases, so that the time measurement accuracy is improved by Airy's theorem.

Further, since the safety pin 36 undergoes a smaller degree of change in configuration or dimensions with passage of time, the fluctuation in transmission energy due to the change in configuration or dimensions is also reduced. Thus, in the mechanical watch equipped with the pallet fork (incomplete) 3h, the energy transmitted to the balance with hairspring is stabilized, and the oscillation angle of the balance with hairspring is stabilized. Thus, the frequency of the balance with hairspring is stabilized, whereby the time measurement accuracy is improved.

Further, by achieving a reduction in the size and weight of the safety pin 36 as in the case of the pallet fork (incomplete) 3i, it is possible to further reduce the moment of inertia of the pallet fork (incomplete) 3h, thereby achieving a further reduction in energy loss than the pallet fork (incomplete) 3. Thus, in the mechanical watch equipped with the pallet fork (incomplete) 3i, the energy transmitted to the balance with hairspring is increased, and the oscillation angle of the balance with hairspring is increased, so that the time measurement accuracy is improved by Airy's theorem.

Further, by providing the pallet fork (incomplete) body portion 60 with the abutment member 60i as in the case of the pallet fork (incomplete) 3j, the position of the safety pin 36 is regulated, and the relative positional accuracy of the safety pin 36 with respect to the pallet fork (incomplete) body portion 40 is enhanced. Thus, in the mechanical watch equipped with the pallet fork (incomplete) 3j, the energy transmitted to the balance with hairspring is stabilized, and the oscillation angle of the balance with hairspring is stabilized, so that the frequency of the balance with hairspring is stabilized, whereby the time measurement accuracy is improved.

By adopting the manufacturing method of the present invention, it is possible to produce a pallet fork (complete) in which the relative positions of the safety pin, the entry pallet jewel, and the exit pallet jewel are of high precision. The pallet fork of the present invention can be manufactured by a simple process. Further, the pallet fork of the present invention exhibits a small moment of inertia. Further, the escapement governor of the present invention is thin. Thus, according to the present invention, it is possible to produce a mechanical watch equipped with a thin escapement governor including a pallet fork of a small moment of inertia.

What is claimed is:

1. An escapement governor comprising: an escape wheel;
a balance with hairspring including a roller having a passing hollow, and an impulse pin provided on the roller; and
a pallet fork (complete) transmitting the power of the escape wheel to the impulse pin to thereby cause the roller to make normal rotation or reverse rotation,
wherein the pallet fork (complete) comprises: a pair of entry horn and exit horn extending from a rotation axis of the pallet fork (complete) toward a rotation axis of the balance with hairspring and adapted to transmit the power of the escape wheel to the impulse pin; and
a safety pin which is provided between the pair of entry horn and exit horn, which extends from the rotation axis of the pallet fork (complete) toward the rotation axis of the balance with hairspring, which is formed to be shorter than the pair of entry horn and exit horn, which enters the passing hollow to thereby cause the pallet fork (complete) to make normal rotation or reverse rotation with respect to the rotation axis of the pallet fork (complete), and which abuts a portion of the roller other than the passing hollow to thereby prevent erroneous rotation of the pallet fork (complete); and
the roller is formed in a single layer.

2. An escapement governor according to claim 1, wherein an upper surface and a lower surface of the safety pin are situated so as to be flush with an upper surface and a lower surface of the pallet fork (complete).

3. An escapement governor according to claim 1, wherein the pallet fork (complete) comprises: a pallet fork (incomplete) having the safety pin and the pair of entry horn and exit horn; and at least one through-hole extending through the pallet fork (incomplete).

4. An escapement governor according to claim 3, wherein the through-hole is provided by a side of the rotation axis of the pallet fork (complete).

5. An escapement governor according to claim 3, wherein the pallet fork (incomplete) is equipped with a lever connected to the safety pin and the pair of entry and exit horn and extending from the rotation axis of the pallet fork (complete) toward the rotation axis of the balance with hairspring; and
the through-hole is provided at an end portion of the lever.

6. An escapement governor according to claim 1, wherein the pallet fork (complete) is equipped with a pallet fork (incomplete) having the safety pin and the pair of entry horn and exit horn;
the pallet fork (incomplete) is equipped with a lever connected to the safety pin and the pair of entry horn and exit horn and extending from the rotation axis of the pallet fork (complete) toward the rotation axis of the balance with hairspring; and,
of both end portions of the lever, the width of an end portion nearer to the safety pin and the pair of entry horn and exit horn has a length not less than 1 time and not more than 2.5 times the width of a central portion between the two end portions.

7. An escapement governor according to claim 1, wherein the pallet fork (complete) is equipped with a pallet fork (incomplete) having the safety pin and the pair of entry horn and exit horn; and the pallet fork (incomplete) has a portion other than the safety pin which is formed to be thinner than the safety pin.

8. An escapement governor according to claim 1, wherein the pallet fork (complete) is equipped with a pallet fork (incomplete) having the safety pin and the pair of entry horn and exit horn; and
the pallet fork (incomplete) is formed of the same material as the safety pin and the pair of entry horn and exit horn.

9. An escapement governor according to claim 1, wherein the pallet fork (complete) is equipped with a pallet fork (incomplete) having the safety pin and the pair of entry horn and exit horn; and
the pair of entry horn and exit horn are formed of a second material different from the material of which the pallet fork (incomplete) is formed.

10. An escapement governor according to claim 1, wherein the pallet fork (complete) is equipped with a pallet fork (incomplete) having the safety pin and the pair of entry horn and exit horn; and
the safety pin is formed of a second material different from the material of which the pallet fork (incomplete) is formed.

11. An escapement governor according to claim 9, wherein the second material is of a lower density than the material forming the pallet fork (incomplete).

12. An escapement governor according to claim 9, wherein the second material has a friction coefficient lower than that of the material forming the pallet fork (incomplete).

13. An escapement governor according to claim 9, wherein the second material is of a higher hardness than the material forming the pallet fork (incomplete).

14. A mechanical watch equipped with an escapement governor as claimed in claim 1.

15. A mechanical watch equipped with an escapement governor as claimed in claim 11.

16. A mechanical watch equipped with an escapement governor as claimed in claim 12.

17. A mechanical watch equipped with an escapement governor as claimed in claim 13.

* * * * *